(12) United States Patent
Seto et al.

(10) Patent No.: US 7,842,440 B2
(45) Date of Patent: Nov. 30, 2010

(54) COLORED CURABLE COMPOSITION, COLOR FILTER AND MANUFACTURING METHOD THEREOF

(75) Inventors: Nobuo Seto, Kanagawa (JP); Yuki Mizukawa, Kanagawa (JP); Toru Fujimori, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 972 days.

(21) Appl. No.: 11/659,284

(22) PCT Filed: Jul. 6, 2005

(86) PCT No.: PCT/JP2005/012459

§ 371 (c)(1),
(2), (4) Date: Feb. 2, 2007

(87) PCT Pub. No.: WO2006/013697

PCT Pub. Date: Feb. 9, 2006

(65) Prior Publication Data

US 2009/0047585 A1 Feb. 19, 2009

(30) Foreign Application Priority Data

Aug. 2, 2004 (JP) .............................. 2004-225849
Aug. 5, 2004 (JP) .............................. 2004-229330

(51) Int. Cl.
*G02B 5/20* (2006.01)
*G03F 7/00* (2006.01)
(52) U.S. Cl. ........................................ 430/7; 430/270.1
(58) Field of Classification Search ........................ None
See application file for complete search history.

(56) References Cited

U.S. PATENT DOCUMENTS 5,695,911 A 12/1997 Itoh et al.
2004/0099181 A1* 5/2004 Tateishi et al. ........... 106/31.47

FOREIGN PATENT DOCUMENTS

| JP | 5-295283 A | 11/1993 |
|----|------------|---------|
| JP | 6-75375 A | 3/1994 |
| JP | 7-286110 A | 10/1995 |
| JP | 2000-335127 A | 12/2000 |
| JP | 2001-201850 A | 7/2001 |
| JP | 2002-014221 A | 1/2002 |
| JP | 2002-309118 A | 10/2002 |

| WO | WO 88/06175 A1 | 8/1988 |
|----|----------------|--------|

\* cited by examiner

*Primary Examiner*—John A. McPherson
(74) *Attorney, Agent, or Firm*—Sughrue Mion, PLLC

(57) ABSTRACT

The present invention provides a compound represented by the following Formula (C1), or a colored curable composition containing a tetraazaporphyrin colorant having at least one group represented by the following Formula (I), and a color filter using the composition and a manufacturing method thereof:

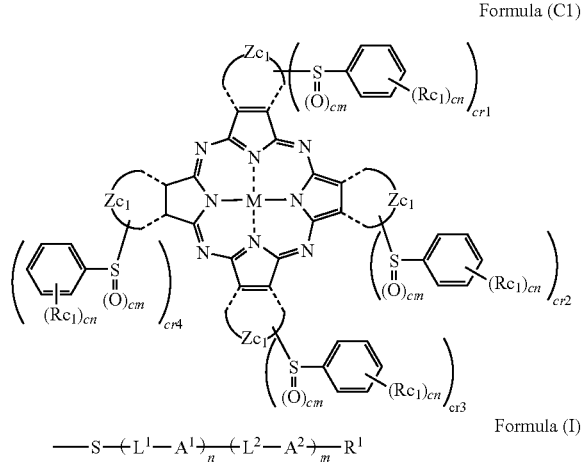

Formula (C1)

Formula (I)
$$-S-(L^1-A^1)_n-(L^2-A^2)_m-R^1$$

wherein $Rc_1$: a halogen atom, aliphatic group, aryl group, heterocyclic group, cyano group, carboxyl group, carbamoyl group, aliphatic oxycarbonyl group, aryloxycarbonyl group, acyl group, hydroxyl group, aliphatic oxy group, aryloxy group, etc.; $Zc_1$: a non-metal atom group necessary for forming a 6-membered ring together with the carbon atom; M: two hydrogen atoms, a divalent metal atom, divalent metal oxide, divalent metal hydroxide, divalent metal chloride; cm=0 to 2, cn=0, 1 to 5; cr1, cr2, cr3, cr4=0 to 1 (cr1+cr2+cr3+cr4≧1); $L^1$: an alkylene group; $A^1$ and $A^2$: —O—, —C(=O)—, —OC(=O)—, —C(=O)O—, —N($R_2$)C(=O)—, —C(=O)N($R^2$)—, —N($R^2$)C(=O)—, —OC(=O)N ($R^2$)—, —N($R^2$)C(=O)N($R^3$)—, —N($R^2$)SO$_2$—, —SO$_2$N ($R^2$)—, or —SO$_2$—; $L^2$: an alkylene group, aralkylene group, or arylene group; n: an integer from 1 to 3; m: an integer from 0 to 3; $R^1$: a hydrogen atom, alkyl group, aryl group or heterocyclic group; and $R^2$ and $R^3$: a hydrogen atom, alkyl group, aryl group or heterocyclic group.

9 Claims, No Drawings

COLORED CURABLE COMPOSITION, COLOR FILTER AND MANUFACTURING METHOD THEREOF

TECHNICAL FIELD

The present invention relates to a colored curable composition suitable for the formation of a color filter used in a liquid crystal display (LCD) and a solid-state image sensing devices (e.g., CCD, COMS, and the like), a color filter using the colored curable composition, and a manufacturing method thereof.

BACKGROUND ART

As color filters formed on the elements for the purpose of display of color images in a solid-state image sensing device and a liquid crystal display, a color filter comprising a yellow filter layer, a magenta filter layer and a cyan filter layer disposed on the same flat surface of a substrate and adjacent to each other, and a color filter comprising a red filter layer, a green filter layer and a blue filter layer, disposed on the same flat surface of a substrate and adjacent to each other, are known. In these filter layers, zone patterns or mosaic patterns are formed.

As methods of manufacturing the above-mentioned color filters, various methods have been proposed thus far. Among these, a so-called color resist method is widely put into practice, the method involving repeating required times a step of carrying out patterning by light-exposure and development of a photosensitive resin composition containing a pigment.

A color resist method is a method of preparing a color filter by photolithography by using a colored radiation-sensitive composition in which a pigment is dispersed in a photosensitive composition. This method uses a pigment and thus is stable against light, heat, or the like and also is sufficient in positioning precision on account of carrying out patterning by photolithography, and so is a suitable method of preparing a color filter for a large screen, high definition color display.

When a color filter is prepared by means of a pigment dispersing method of dispersing a pigment as described above, the method involves repeating an operation including applying a radiation-sensitive composition onto a glass substrate with a spin coater, a roll coater or the like to form a coated film, and then obtaining colored pixels by pattern exposing and developing the coated film in accordance with a desired number of hues while changing the colorant, to obtain a color filter. As the composition used in the pigment dispersing method, negative type photosensitive compositions containing an alkali-soluble resin, a photopolymerizable monomer and a photopolymerization initiator are known (e.g., see Patent Documents 1 to 8, 12 and 13).

Recently, still higher definition is desired for color filters for solid-state image sensing devices. Conventional pigment dispersing compositions as described above, however, have problems in that resolution is not improved, unevenness of color is generated due to coarse particles of a pigment, and the like. Hence, the compositions are unsuitable for applications, such as solid-state image sensing devices, in which micro-patterns are required.

For such problems, the use of dyes has been conventionally proposed (e.g., see Patent Documents 9 and 10). Additionally, the use of positive type photosensitive compositions has also been proposed (e.g., see Patent Documents 11 and 12). However, a curable composition containing a dye has the following problems below and needs further improvements:

(1) Dyes are generally inferior in heat resistance, light resistance, and the like compared to pigments, and thus are not sufficient in fastness, (2) When the molar light absorption coefficient of a dye is low, a large amount of the dye must be used, so that the amounts of other components such as a polymerizable compound, a binder, a photopolymerization initiator have to be relatively decreased, leading to decrease in curing property at the time of curing the composition, heat resistance of a cured portion, and developability of a non-cured portion, and the like, (3) Dyes frequently interact with other components in the curable composition, so that the adjustment of developability (solubility) of a cured portion and a non-cure portion is difficult.

Accordingly, the fastness of dyes that have been conventionally used in a photosensitive composition is not sufficient. Moreover, the solubility of dyes in photosensitive compositions are low, and thus the dyes sometimes precipitate in a liquid or in a coated film. In addition, it is difficult for a composition to contain dye in a high concentration.

On the other hand, it is known that a yellow dye and a cyan dye are used in a green-colored filter array of a color filter (e.g., see Patent Document 10). However, the heat resistance and light resistance of the copper phthalocyanine colorant used are insufficient, and further improvements thereof are desired. Furthermore, although a phthalocyanine colorant containing a specific amine-based substituent is also known (e.g., see Patent Document 14), the heat resistance and light resistance of this colorant are also insufficient, and further improvements thereof are desired.

In addition, a phthalocyanine colorant having a substituent at an α-position has poor solubility in a resin liquid (solution containing a colorant, a resin, a monomer, an initiator, a solvent, etc.), so the improvement in the storage stability and the like of a resin liquid is desired (e.g., see Patent Document 15). Moreover, a color filter is disclosed that contains a phthalocyanine colorant substituted by a substituent having a nitrogen atom at an α-position; however, the colorant has poor solubility in an alkaline developer, so the improvement in the developability is desired (e.g., see Patent Document 16).

Patent Document 1: Japanese Patent Application Laid-Open (JP-A) No. 1-102469

Patent Document 2: JP-A No. 1-152499

Patent Document 3: JP-A No. 2-181704

Patent Document 4: JP-A No. 2-199403

Patent Document 5: JP-A No. 4-76062

Patent Document 6: JP-A No. 5-273411

Patent Document 7: JP-A No. 6-184482

Patent Document 8: JP-A No. 7-140654

Patent Document 9: JP-A No. 6-75375

Patent Document 10: JP-A No. 2002-14221

Patent Document 11: Japanese Patent Application Publication (JP-B) No. 7-111485

Patent Document 12: JP-A No. 2002-14223

Patent Document 13: JP-A No. 2002-14220

Patent Document 14: JP-A No. 7-286110

Patent Document 15: International Patent Publication No. WO88/06175

Patent Document 16: JP-A No. 5-295283

DISCLOSURE OF THE INVENTION

As described so far, although a curable composition containing a dye is useful for applications such as solid-state image sensing devices requiring high definition and uniform color, a composition has not been obtained yet that is capable of stably maintaining the color density and hue of an easily discoloring dye. In particular, regarding a composition containing a cyan dye, improvement in fastness such as heat resistance and light resistance has been desired. Further, there has also been needs for preventing the precipitation of a dye attributable to poor solubility of the dye to be used in solvent and low stability over time of a liquid preparation or coated film containing the dye.

As such, there are needs for a colored curable composition that is good in cyan hue, high in heat fastness and light fastness and excellent in stability over time, a color filter that has cyan color with excellent hue, transmittance characteristics, and heat fastness and light fastness, and a color filter manufacturing method that can produce the color filter with high productivity (first necessity).

Moreover, there are also needs for a colored curable composition having high solubility in a resin liquid, excellent developability, high sensitivity, high resolution, and high transmittance characteristics as well as excellent heat fastness and light fastness, a color filter using the same, and a manufacturing method thereof (second necessity).

The inventors have studied in detail various colorant compounds that exhibit good hue, and are high in fastness for light and heat, and the inventors have found that specific tetraazaporphyrin colorants (dyes) are useful in improvements in fastness including heat resistance and light resistance. On the basis of the findings, a colored curable composition, a color filter and a manufacturing method thereof according to first to third aspects are provided and thus the first necessity has been satisfied. Moreover, the inventors have found that colorants having specific substituents are useful in improvements in solubility in resin solutions, improvements in developability, and improvements in heat resistance and light resistance. On the basis of the findings, a colored curable composition, a color filter and a manufacturing method thereof according to fourth to sixth aspects are provided, and thus the second necessity has been satisfied.

A first aspect of the invention provides a colored curable composition containing at least one compound represented by Formula (C1) below:

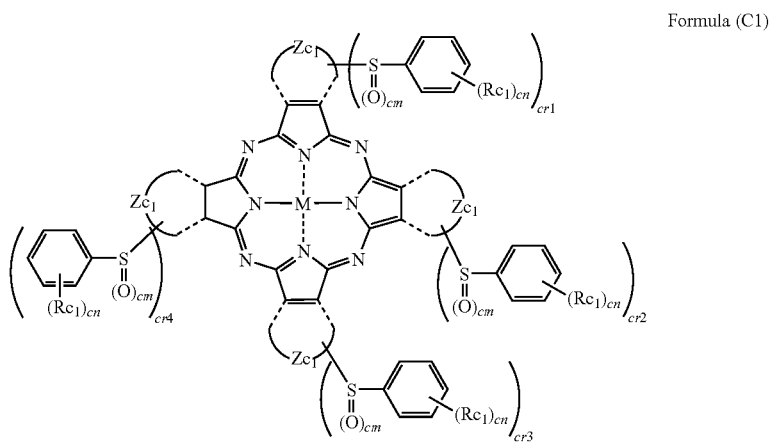

Formula (C1)

In formula (C1), $Rc_1$ represents a halogen atom, an aliphatic group, an aryl group, a heterocyclic group, a cyano group, a carboxyl group, a carbamoyl group, an aliphatic oxycarbonyl group, an aryloxycarbonyl group, an acyl group, a hydroxyl group, an aliphatic oxy group, an aryloxy group, an acyloxy group, a carbamoyloxy group, a heterocyclic oxy group, an aliphatic oxycarbonyloxy group, an N-alkylacylamino group, a carbamoylamino group, a sulfamoylamino group, an aliphatic oxycarbonylamino group, an aryloxycarbonylamino group, an aliphatic sulfonylamino group, an arylsulfonylamino group, an aliphatic thio group, an arylthio group, an aliphatic sulfonyl group, an arylsulfonyl group, a sulfamoyl group, a sulfo group, a imide group, or a heterocyclic thio group; $Zc_1$ represents a non-metal atom group necessary for forming a 6-membered ring together with the carbon atom and the four Zcs may be the same or different; M represents two hydrogen atoms, a divalent metal atom, a divalent metal oxide, a divalent metal hydroxide, or a divalent metal chloride; cm denotes 0, 1, or 2, cn denotes 0 or an integer from 1 to 5, and four cns may be the same or different, provided that at least one of the cns denotes an integer from 1 to 5, and a plurality of $Rc_1$s in the molecule may be the same or different; and cr1, cr2, cr3, and cr4 denote 0 or 1, and satisfy $cr1+cr2+cr3+cr4 \geqq 1$.

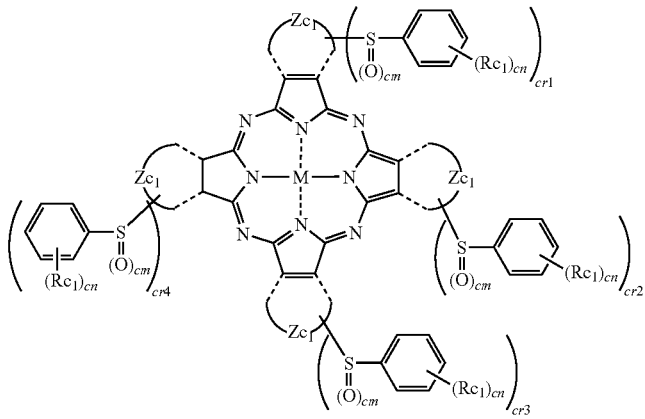

In formula (C1), $Rc_1$ represents a halogen atom, an aliphatic group, an aryl group, a heterocyclic group, a cyano group, a carboxyl group, a carbamoyl group, an aliphatic oxycarbonyl group, an aryloxycarbonyl group, an acyl group, a hydroxyl group, an aliphatic oxy group, an aryloxy group, an acyloxy group, a carbamoyloxy group, a heterocyclic oxy group, an aliphatic oxycarbonyloxy group, an N-alkylacylamino group, a carbamoylamino group, a sulfamoylamino group, an aliphatic oxycarbonylamino group, an aryloxycarbonylamino group, an aliphatic sulfonylamino group, an arylsulfonylamino group, an aliphatic thio group, an arylthio group, an aliphatic sulfonyl group, an arylsulfonyl group, a sulfamoyl group, a sulfo group, a imide group, or a heterocyclic thio group; $Zc_1$ represents a non-metal atom group necessary for forming a 6-membered ring together with the carbon atom and the four Zcs may be the same or different; M represents two hydrogen atoms, a divalent metal atom, a divalent metal oxide, a divalent metal hydroxide, or a divalent metal chloride; cm denotes 0, 1, or 2, cn denotes 0 or an integer from 1 to 5, and four cns may be the same or different, provided that at least one of the cns denotes an integer from 1 to 5, and a plurality of $Rc_1$s in the molecule may be the same or different; and cr1, cr2, cr3, and cr4 denote 0 or 1, and satisfy $cr1+cr2+cr3+cr4 \geqq 1$.

A third aspect of the invention provides a color filter manufacturing method including applying the colored curable composition onto a support, exposing the obtained coated film to light through a mask, and forming a pattern image by development.

A fourth aspect of the invention provides a colored curable composition containing a tetraazaporhyrin colorant containing in the molecule at least one group represented by Formula (I) below:

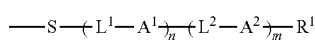

Formula (I)

In formula (I), $L^1$ represents an alkylene group; $A^1$ and $A^2$ each independently represent —O—, —C(=O)—, —OC(=O)—, —C(=O)O—, —N(R²)C(=O)—, —C(=O)N(R²)—, —N(R²)C(=O)—, —OC(=O)N(R²)—, N(R²)C(=O)N(R³)—, —N(R²)SO₂—, —SO₂N(R²)—, or —SO₂—; $L^2$ represents an alkylene group, an aralkylene group, or an arylene group; n denotes an integer from 1 to 3; m denotes an integer from 0 to 3; when n is 2 or more, $L^1$s may be the same or different and $A^1$s may be the same or different; when m is 2 or more, $L^2$s may be the same or different and $A^2$s may be the same or different; $R^1$ represents a hydrogen atom, an alkyl group, an aryl group or a heterocyclic group; and $R^2$ and $R^3$ each independently represent a hydrogen atom, an alkyl group, an aryl group or a heterocyclic group.

A fifth aspect of the invention provides a color filter formed using a colored curable composition of the fourth aspect.

A sixth aspect of the invention provides a color filter manufacturing method including applying a colored curable composition of the fourth aspect onto a support, exposing the obtained coated film to light through a mask, and forming a pattern by development.

In the above-mentioned color filter manufacturing method, as required, the above-mentioned pattern may be cured by heating and/or light exposure, and these steps may be repeated a plurality of times. Moreover, filters in plural colors may be formed by changing the dye.

According to the first aspect of the invention, there can be provided a colored curable composition that is good in cyan hue, high in heat fastness and light fastness, and excellent in stability over time. Further, according to the second and third aspects of the invention, there can be provided a color filter that has cyan color with excellent hue, transmittance characteristics, heat fastness and light fastness, and a color filter manufacturing method that can prepare the color filter with high productivity.

According to the fourth aspect of the invention, there can be provided a colored curable composition that has high sensitivity, high resolution and high transmittance characteristics, as well as good hue, high heat fastness, high light fastness, excellent storage stability, and excellent developability.

Moreover, according to the fifth and sixth aspects of the invention, there can be provided a color filter that is manufactured by using the above-described colored curable composition, and has high resolution, high transmittance characteristics, good hue, high heat fastness and high light fastness, and a color filter manufacturing method that can prepare the color filter with high productivity.

BEST MODE FOR CARRYING OUT THE INVENTION

A colored curable composition, a color filter and a manufacturing method thereof according to the invention will be described in detail hereinafter.

[Colored Curable Composition]

The colored curable composition according to the invention contains, as a colorant, a compound (hereinafter, may be referred to as "first dye according to the invention") represented by Formula (C1) shown below or a tetraazaporphyrin colorant (hereinafter, may be referred to as "second colorant in the invention") having, in a molecule, at least one group represented by Formula (I) below. The colored curable composition preferably contains a binder, radiation-sensitive compound and a polymerizable monomer. Moreover, in general, the composition may further contain a solvent and, as required, may further contain other components such as a crosslinking agent.

The colored curable composition according to the invention is excellent in fastness in particular, and can achieve high sensitivity, high resolution and high transmittance characteristics owing to the use of the first dye according to the invention.

Furthermore, the second colorant has good hue, the colorant does not precipitate even when time passes after preparation of a liquid product containing this colorant or a coated film containing the colorant, the colorant is excellent in storage stability, developability and fastness against heat and light.

rated or unsaturated, and the scope thereof include, for example, an alkyl group, an alkenyl group, a cycloalkyl group or a cycloalkenyl group, and may be non-substituted or substituted by a substituent. Moreover, in this specification, "aryl" is monocyclic or condensed-cyclic, and may be non-substituted or substituted by a substituent. In this specification, a "heterocycle" has a heterocyclic portion having a hetero atom (e.g., a nitrogen atom, a sulfur atom, or an oxygen atom) in the ring, and may be a saturated ring or unsaturated ring, and may be a monocyclic or a condensed cyclic, and may be non-substituted or substituted by a substituent.

In addition, in the invention, a "substituent" may be any group that can be substituted, and examples thereof include aliphatic groups, aryl groups, heterocyclic groups, acyl groups, imide groups, azo groups, acyloxy groups, acylamino groups, aliphatic oxy groups, aryloxy groups, heterocyclic oxy groups, aliphatic oxycarbonyl groups, aryloxycarbonyl groups, heterocyclic oxycarbonyl groups, carbamoyl groups, aliphatic sulfonyl groups, arylsulfonyl groups, heterocyclic sulfonyl groups, aliphatic sulfonyloxy groups, arylsulfonyloxy groups, heterocyclic sulfonyloxy groups, sulfamoyl groups, aliphatic sulfonamide groups, arylsulfonamide groups, heterocyclic sulfonamide groups, amino groups, aliphatic amino groups, arylamino groups, heterocyclic amino groups, aliphatic oxycarbonylamino groups, aryloxycarbonylamino groups, heterocyclic oxycarbonylamino groups, aliphatic sulfinyl groups, arylsulfinyl groups, aliphatic thio groups, arylthio groups, heterocyclic thio groups, hydroxyl groups, cyano groups, sulfo groups, carboxyl groups, aliphatic oxyamino groups, aryoxyamino groups, carbamoylamino groups, sulfamoylamino groups, halogen atoms, sulfamoylcarbamoyl groups, carbamoylsulfamoyl groups, dialiphatic oxyphosphinyl groups, and diaryloxyphosphinyl groups.

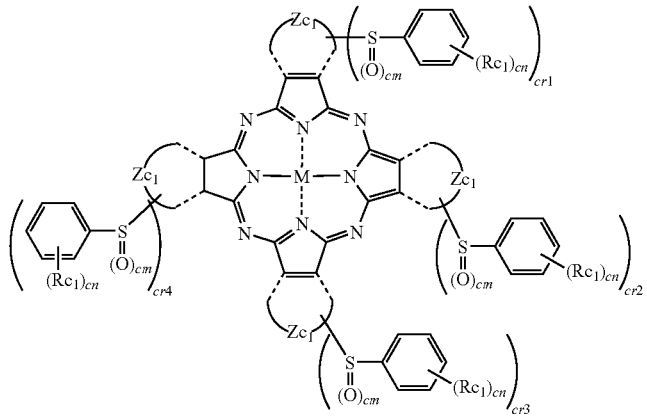

Formula (C1)

—Compounds Represented by Formula (C1)—

A colored curable composition of the first aspect of the invention contains at least one phthalocyanine compound (first dye according to the invention) represented by Formula (C1) below. This dye has a good cyan hue with high transmittance characteristics, the dye does not precipitate even when time has passed after preparation of a liquid product containing this dye or a coated film containing the dye, the dye is excellent in stability, and the dye has excellent resistances against heat and light in particular.

In this specification, "aliphatic" has an aliphatic portion that is straight-chained, branched or cyclic, and may be satu- Each group in Formula (C1) above will be described in detail hereinafter.

In Formula (C1) above, $Rc_1$ represents a halogen atom, an aliphatic group, an aryl group, a heterocyclic group, a cyano group, a carboxyl group, a carbamoyl group, an aliphatic oxycarbonyl group, an aryloxycarbonyl group, an acyl group, a hydroxyl group, an aliphatic oxy group, an aryloxy group, an acyloxy group, a carbamoyloxy group, a heterocyclic oxy group, an aliphatic oxycarbonyloxy group, an N-alkylacylamino group, a carbomoylamino group, a sulfamoylamino group, an aliphatic oxycarbonylamino group, an aryloxycarbonylamino group, an aliphatic sulfonylamino group, an arylsulfonylamino group, an aliphatic thio group, an arylthio group, an aliphatic sulfonyl group, an arylsulfonyl group, a sulfamoyl group, a sulfo group, a imide group, or a heterocyclic thio group.

The halogen atom represented by $Rc_1$ above may be a fluorine atom, a chlorine atom, a bromine atom, or the like.

The aliphatic group represented by $Rc_1$ above may be non-substituted or have a substituent, may be saturated or unsaturated, and may be cyclic, and is preferably an aliphatic group having 1 to 15 carbon atoms in total. Examples of such an aliphatic group include a methyl group, an ethyl group, a vinyl group, an allyl group, an ethinyl group, an isopropenyl group, and a 2-ethylhexyl group.

The aryl group represented by $Rc_1$ above may be non-substituted or have a substituent, and is preferably an aryl group having 6 to 16 carbon atoms in total, more preferably an aryl group having 6 to 12 carbon atoms in total. Examples of such an aryl group include a phenyl group, a 4-nitrophenyl group, a 2-nitrophenyl group, a 2-chlorophenyl group, a 2,4-dichlorophenyl group, a 2,4-dimethylphenyl group, a 2-methylphenyl group, a 4-methoxyphenyl group, a 2-methoxyphenyl group, and a 2-methoxycarbonyl-4-nitrophenyl group.

The heterocyclic group represented by $Rc_1$ above may be saturated or unsaturated, and is preferably a heterocyclic group having 1 to 15 carbon atoms in total, more preferably a heterocyclic group having 3 to 10 carbon atoms in total. Examples of such a heterocyclic group include a 3-pyridyl group, a 2-pyridyl group, a 2-pyrimidinyl group, a 2-pyradinyl group, and a 1-pyperidyl group. Further, the heterocyclic group may have a substituent.

The carbamoyl group represented by $Rc_1$ above may be non-substituted or have a substituent, and is preferably a carbamoyl group having 1 to 16 carbon atoms in total, more preferably a carbamoyl group having 1 to 12 carbon atoms in total. Examples of such a carbamoyl group include a carbamoyl group, a dimethylcarbamoyl group, and a dimethoxyethylcarbamoyl group.

The aliphatic oxycarbonyl group represented by $Rc_1$ above may be non-substituted or have a substituent, may be saturated or unsaturated, and may be cyclic, and is preferably an aliphatic oxycarbonyl group having 2 to 16 carbon atoms in total, more preferably an aliphatic oxycarbonyl group having 2 to 10 carbon atoms in total. Examples of such an aliphatic oxycarbonyl group include a methoxycarbonyl group and a butoxycarbonyl group.

The aryloxycarbonyl group represented by $Rc_1$ above may be non-substituted or have a substituent, and is preferably an aryloxycarbonyl group having 7 to 17 carbon atoms in total, more preferably an aryloxycarbonyl group having 7 to 15 carbon atoms in total. Examples of such a aryloxycarbonyl group include a phenoxycarbonyl group.

The acyl group represented by $Rc_1$ above may be aromatic or aliphatic, either saturated or saturated, may be cyclic, and is preferably an acyl group having 2 to 15 carbon atoms in total, more preferably an acyl group having 2 to 10 carbon atoms in total. Examples of such an acyl group include an acetyl group, a pivaloyl group, and a benzoyl group. In addition, the acyl group may have a substituent.

The aliphatic oxy group represented by $Rc_1$ above may be non-substituted or have a substituent, saturated or unsaturated, and may be cyclic, and is preferably an aliphatic oxy group having 1 to 12 carbon atoms in total, more preferably an aliphatic oxy group having 1 to 10 carbon atoms in total. Examples of such an aliphatic oxy group include a methoxy group, a ethoxyethoxy group, a phenylethoxy group, and a thiophenoxyethoxy group.

The aryloxy group represented by $Rc_1$ above may be non-substituted or have a substituent, and is preferably an aryloxy group having 6 to 18 carbon atoms in total, more preferably an aryloxy group having 6 to 14 carbon atoms in total. Examples of such an aryloxy group include a phenoxy group and a 4-methylphenoxy group.

The acyloxy group represented by $Rc_1$ above may be non-substituted or have a substituent, and is preferably an acyloxy group having 2 to 14 carbon atoms in total, more preferably an acyloxy group having 2 to 10 carbon atoms in total. Examples of such an acyloxy group include an acetoxy group, a methoxyacetoxy group, and a benzoyloxy group.

The carbamoyloxy group represented by $Rc_1$ above may be non-substituted or have a substituent, and is preferably a carbamoyloxy group having 1 to 16 carbon atoms in total, more preferably a carbamoyloxy group having 1 to 12 carbon atoms in total. Examples of such a carbamoyloxy group include a dimethylcarbamoyloxy group and a diisopropylcarbamoyloxy group.

The heterocyclic oxy group represented by $Rc_1$ above may be non-substituted or have a substituent, and is preferably a heterocyclic oxy group having 1 to 15 carbon atoms in total, more preferably a heterocyclic oxy group having 3 to 10 carbon atoms in total. Examples of such a heterocyclic oxy group include a 3-furyloxy group, a 3-pyridyloxy group, and an N-methyl-2-piperidyloxy group.

The aliphatic oxycarbonyloxy group represented by $Rc_1$ above may be non-substituted or have a substituent, saturated or unsaturated, and may be cyclic, and is preferably an aliphatic oxycarbonyloxy group having 2 to 16 carbon atoms in total, more preferably an aliphatic oxycarbonyloxy group having 2 to 10 carbon atoms in total. Examples of such an aliphatic oxycarbonyloxy group include a methoxycarbonyloxy group and a t-butoxycarbonyloxy group.

The N-alkylacylamino group represented by $Rc_1$ above may be non-substituted or have a substituent, and is preferably an N-alkylacylamino group having 3 to 15 carbon atoms in total, more preferably an N-alkylacylamino group having 3 to 12 carbon atoms in total. Examples of such an N-alkylacylamino group include an N-methylacetylamino group, an N-ethoxyethylbenzoylamino group, and an N-methylmethoxyacetylamino group.

The carbamoylamino group represented by $Rc_1$ above may be non-substituted or have a substituent, and is preferably a carbamoylamino group having 1 to 16 carbon atoms in total, more preferably a carbamoylamino group having 1 to 12 carbon atoms in total. Examples of such a carbamoylamino group include an N,N-dimethylcarbamoylamino group and an N-methyl-N-methoxyethylcarbamoylamino group.

The sulfamoylamino group represented by $Rc_1$ above may be non-substituted or have a substituent, and is preferably a sulfamoylamino group having 0 to 16 carbon atoms in total, more preferably a sulfamoylamino group having 0 to 12 carbon atoms in total. Examples of such a sulfamoylamino group include an N,N-dimethylsulfamoylamino group and an N,N-diethylsulfamoyl group.

The aliphatic oxycarbonylamino group represented by $Rc_1$ above may be non-substituted or have a substituent, and is preferably an aliphatic oxycarbonylamino group having 2 to 15 carbon atoms in total, more preferably an aliphatic oxycarbonylamino group having 2 to 10 carbon atoms in total. Examples of such an aliphatic oxycarbonylamino group include a methoxycarbonylamino group and a methoxyethoxycarbonylamino group.

The aryloxycarbonylamino group represented by $Rc_1$ above may be non-substituted or have a substituent, and is preferably an aryloxycarbonylamino group having 7 to 17 carbon atoms in total, more preferably an aryloxycarbonylamino group having 7 to 15 carbon atoms in total. Examples of such an aryloxycarbonylamino group include a phenoxycarbonylamino group and a 4-methoxycarbonylamino group.

The aliphatic sulfonylamino group represented by $Rc_1$ above may be non-substituted or have a substituent, saturated or unsaturated, and may be cyclic, and is preferably an aliphatic sulfonylamino group having 1 to 12 carbon atoms in total, more preferably an aliphatic sulfonylamino group having 1 to 8 carbon atoms in total. Examples of such an aliphatic sulfonylamino group include a methanesulfonylamino group and a butanesulfonylamino group.

The arylsulfonylamino group represented by $Rc_1$ above may be non-substituted or have a substituent, and is preferably an arylsulfonylamino group having 6 to 15 carbon atoms in total, more preferably an arylsulfonylamino group having 6 to 12 carbon atoms in total. Examples of such an arylsulfonylamino group include a benzenesulfonylamino group and a 4-toluenesulfonylamino group.

The aliphatic thio group represented by $Rc_1$ above may be non-substituted or have a substituent, saturated or unsaturated, and may be cyclic, and is preferably an aliphatic thio group having 1 to 16 carbon atoms in total, more preferably an aliphatic thio group having 1 to 10 carbon atoms in total. Examples of such an aliphatic thio group include a methylthio group, a ethylthio group, and a ethoxyethylthio group.

The arylthio group represented by $Rc_1$ above may be non-substituted or have a substituent, and is preferably an arylthio group having 6 to 22 carbon atoms in total, more preferably an arylthio group having 6 to 14 carbon atoms in total. Examples of such an arylthio group include a phenylthio group and a 2-t-butylthio group.

The aliphatic sulfonyl group represented by $Rc_1$ above may be non-substituted or have a substituent, and is preferably an aliphatic sulfonyl group having 1 to 15 carbon atoms in total, more preferably an aliphatic sulfonyl group having 1 to 8 carbon atoms in total. Examples of such an aliphatic sulfonyl group include a methanesulfonyl group, a butanesulfonyl group, and a methoxyethanesulfonyl group.

The arylsulfonyl group represented by $Rc_1$ above may be non-substituted or have a substituent, and is preferably an arylsulfonyl group having 6 to 16 carbon atoms in total, more preferably an arylsulfonyl group having 6 to 12 carbon atoms in total. Examples of such an arylsulfonyl group include a benzenesulfonyl group, a 4-t-butylbenzenesulfonyl group, a 4-toluenesulfonyl group, and a 2-toluenesulfonyl group.

The sulfamoyl group represented by $Rc_1$ above may be non-substituted or have a substituent, and is preferably a sulfamoyl group having 0 to 16 carbon atoms in total, more preferably a sulfamoyl group having 0 to 12 carbon atoms in total. Examples of such a sulfamoyl group include a sulfamoyl group and a dimethylsulfamoyl group.

The imide group represented by $Rc_1$ above may be condensed-cyclic, and is preferably an imide group having 3 to 22 carbon atoms in total, more preferably an imide group having 3 to 15 carbon atoms in total. Examples of such an imide group include an imide succinate group and an imide phthalate group.

The heterocyclic thio group represented by $Rc_1$ above may be non-substituted or have a substituent, and may be a 5- to 7-membered ring, and is preferably a heterocyclic thio group having 1 to 20 carbon atoms in total, more preferably a heterocyclic thio group having 1 to 12 carbon atoms in total. Examples of such a heterocyclic thio group include a 3-furylthio group and a 3-pyridylthio group.

In Formula (C1) above, $Zc_1$ represents non-metal atom group necessary for forming a 6-membered ring together with the carbon atom. Four $Zc_1$s may be the same or different. A 6-membered ring to be formed may be any one of an aromatic ring, a non-aromatic ring and a heterocyclic ring, and may be a condensed ring, and the condensed ring may have a substituent. Examples of the 6-membered ring include a benzene ring, a pyridine ring, a cyclohexene ring, and a naphthalene ring. A benzene ring is preferable.

In Formula (C1) above, M represents two hydrogen atoms, a divalent metal atom, a divalent metal oxide, a divalent metal hydroxide, or a divalent metal chloride. Examples of M include VO, TiO, Zn, Mg, Si, Sn, Rh, Pt, Pd, Mo, Mn, Pb, Cu, Ni, Co, Fe, AlCl, InCl, FeCl, $TiCl_2$, $SnCl_2$, $SiCl_2$, $GeCl_2$, $Si(OH)_2$, and $H_2$; VO, Zn, Mn, Cu, Ni, and Co are preferable.

In Formula (C1) above, cm denotes 0, 1 or 2 (preferably 0), and cn denotes 0 or an integer from 1 to 5 (preferably 0 or 1). "cn" at four sites in the molecule may be the same or different, and at least one of cns denotes an integer from 1 to 5; when a plurality of cns are present in the molecule, a plurality of $Rc_1$ may be the same or different.

Further, cr1, cr2, cr3 and cr4 denote 0 or 1, and cr1+cr2+cr3+cr4≧1 is satisfied. cr1+cr2+cr3+cr4 is preferably 3 or 4.

The compound represented by Formula (C1) above is preferably a compound represented by Formula (2) below (third dye according to the invention) from the viewpoint of obtaining the effects of the invention more effectively:

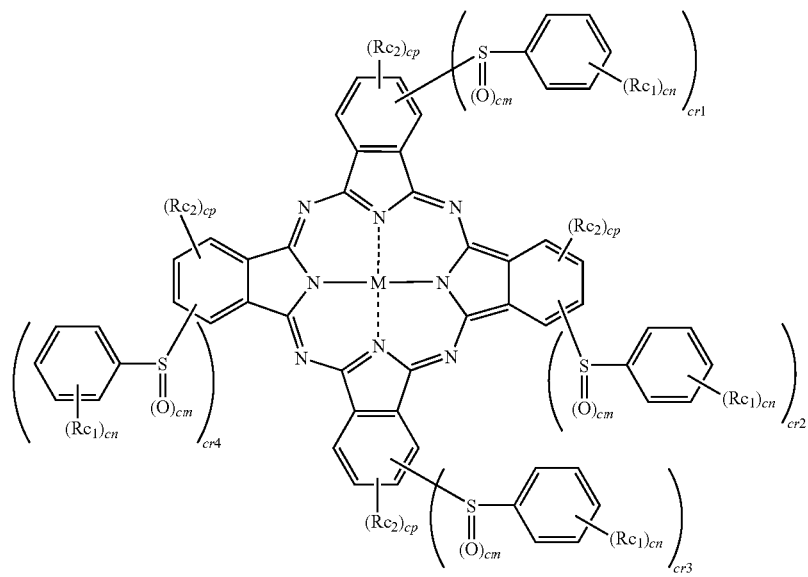

Formula (C2)

In formula (C2), $Rc_2$ represents a substituent, and the substituent may be any group that can be substituted, and examples thereof include the groups listed in the description for "substituent" described above; $Rc_2$ is preferably an aliphatic group, an aryl group, a heterocyclic group, an acylamino group, an aliphatic oxy group, an aryloxy group, a heterocyclic oxy group, an aliphatic oxycarbonyl group, an aryloxycarbonyl group, a heterocyclic oxycarbonyl group, a carbamoyl group, an aliphatic sulfonyl group, a sulfamoyl group, an aliphatic sulfonamide group, an arylsulfonamide group, an aliphatic amino group, an arylamino group, an aliphatic oxycarbonylamino group, an aryloxycarbonylamino group, an aliphatic thio group, an arylthio group, a hydroxyl group, a cyano group, a sulfo group, a carboxyl group, a carbamoylamino group, a sulfamoylamino group, a or halogen atom, a more preferably an aliphatic group, an acylamino group, an aliphatic oxy group, an aliphatic oxycarbonyl group, an aliphatic sulfonyl group, an aliphatic thio group, an arylthio group, a sulfo group, a carboxyl group, or a halogen group.

In Formula (C2) above, cp denotes an integer from 0 to 3, preferably 0 or 1.

In addition, $Rc_1$, M, cm, cn, cr1, cr2, cr3, and cr4 in Formula (C2) have the same meaning as in Formula (C1) above; preferable examples of $Rc_1$ and M in Formula (C2) are the same as preferable examples thereof in Formula (C1) above; and preferable numerical ranges for cm, cn, cr1, cr2, cr3, and cr4 in Formula (C2) are also the same as the preferable numerical ranges thereof in Formula (C1) above.

The compound represented by Formula (C2) above is more preferably a compound represented by Formula (C3) below (fourth dye according to the invention) from the viewpoint of obtaining the effects of the invention more effectively:

cq in Formula (C3) denotes 0 or 1. Moreover, the phthalocyanine skeleton has a structure in which 4 benzene rings are condensed outside the tetraazaporphyrin skeleton, and each benzene ring has four sites (carbon atoms) at which a substituent can be introduced. In Formula (C3) above, hydrogen atoms are bonded to two sites (β-positions) of each benzene ring, which are distant from the tetraazaporphyrin skeleton.

In Formulae (C1) to (C3) above, from the viewpoint of obtaining the effects of the invention more effectively, $Rc_1$ above is preferably a halogen atom, an aliphatic group, a cyano group, a carbamoyl group, an aliphatic oxycarbonyl group, an aryloxycarbonyl group, a hydroxyl group, an aliphatic oxy group, a carbamoyloxy group, a heterocyclic oxy group, an aliphatic oxycarbonyloxy group, a carbamoylamino group, a sulfamoylamino group, an aliphatic oxycarbonylamino group, an aliphatic sulfonylamino group, an arylsulfonylamino group, an aliphatic thio group, an arylthio group, an aliphatic sulfonyl group, an arylsulfonyl group, a sulfamoyl group, an imide group, or a sulfo group, more preferably an aliphatic group, a carbamoyl group, an aliphatic oxycarbonyl group, an aryloxycarbonyl group, an aliphatic oxy group, an aliphatic oxycarbonyloxy group, a carbamoylamino group, a sulfamoylamino group, an aliphatic oxycarbonylamino group, an aliphatic sulfonylamino group, an arylsulfonylamino group, an aliphatic sulfonyl group, an arylsulfonyl group, a sulfamoyl group, an imide group, or a sulfo group, most preferably a carbamoyl group, an aliphatic oxycarbonyl group, an aliphatic oxy group, an aliphatic oxycarbonyloxy group, a carbamoylamino group, an aliphatic oxycarbonylamino group, an arylsulfonyl group, an imide group, or an aliphatic sulfonyl group.

Similarly, from the viewpoint of obtaining the effects of the invention more effectively, $Rc_2$ above is preferably in the

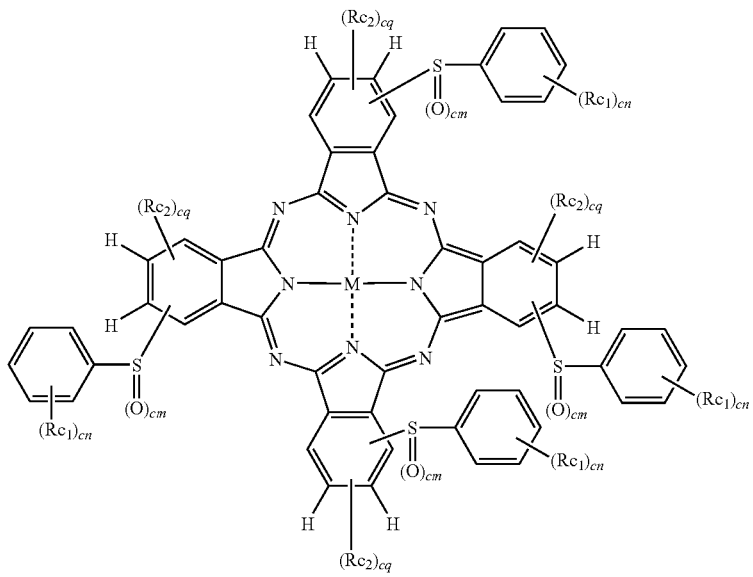

Formula (C3)

In Formula (C3) above, $Rc_1$, $Rc_2$, M, cm and cn respectively have the same meaning as in Formulae (C1) and (C2) above; preferable examples of $Rc_1$, $Rc_2$, and M in Formula (C3) are the same as the preferable examples thereof in Formulae (C1) and (C2) above; preferable numerical ranges of cm and c in Formula (C3) are also the same as the preferable numerical ranges thereof in Formulae (C1) and (C2) above;

form of an aliphatic group, an acylamino group, an aliphatic oxy group, an aliphatic oxycarbonyl group, an aliphatic sulfonyl group, an aliphatic thio group, an aryl thio group, a sulfo group, a carboxyl group, or a halogen atom, more preferably an aliphatic group or a halogen atom. Moreover, from the viewpoint of obtaining the effects of the invention more effectively, cp and cq above are preferably 0. Furthermore, from the viewpoint of obtaining the effects of the invention more effectively, M above is preferably VO, Mn, Co, Ni, Cu, Zn or Mg, more preferably VO, Co, Cu or Zn, most preferably Cu. In addition, cm is preferably 0, and cn is preferably 1.

Furthermore, from the viewpoint of obtaining the effects of the invention more effectively, it is preferable that $Rc_1$ above is a halogen atom, an aliphatic group, a cyano group, a carbamoyl group, an aliphatic oxycarbonyl group, an aryloxycarbonyl group, a hydroxyl group, an aliphatic oxy group, a carbamoyloxy group, a heterocyclic oxy group, an aliphatic oxycarbonyloxy group, a carbamoylamino group, a sulfamoylamino group, an aliphatic oxycarbonylamino group, an aliphatic sulfonylamino group, an arylsulfonylamino group, an aliphatic thio group, an arylthio group, an aliphatic sulfonyl group, an arylsulfonyl group, an sulfamoyl group, an imide group, or a sulfo group, M above is VO, Co, Cu or Zn, cq above is 0, cm above is 0, cn above is 1, and it is more preferable that $Rc_1$ above is an aliphatic group, a carbamoyl group, an aliphatic oxycarbonyl group, an aryloxycarbonyl group, an aliphatic oxy group, an aliphatic oxycarbonyloxy group, a carbamoylamino group, a sulfamoylamino group, an aliphatic oxycarbonylamino group, an aliphatic sulfonylamino group, an arylsulfonylamino group, an aliphatic sulfonyl group, an arylsulfonyl group, a sulfamoyl group, an imide group, or a sulfo group, M above is VO, Co, Cu or Zn, cp or cq above is 0, cm above is 0, and cn above is 1.

In particular, from the viewpoint of the effects of the invention, it is most preferable that $Rc_1$ above is a carbamoyl group, an aliphatic oxycarbonyl group, an aliphatic oxy group, a carbamoylamino group, an aliphatic oxycarbonylamino group, an aliphatic sulfonyl group, an arylsulfonyl group, or an imide group, M above is Cu, cq above is 0, cm above is 0, and cn above is 1.

Hereinafter, specific examples (illustrative compounds C-1 to C-59) of compounds (dyes) represented by Formulae (C1) to (C3) above will be shown. However, the invention is by no means limited by the specific examples.

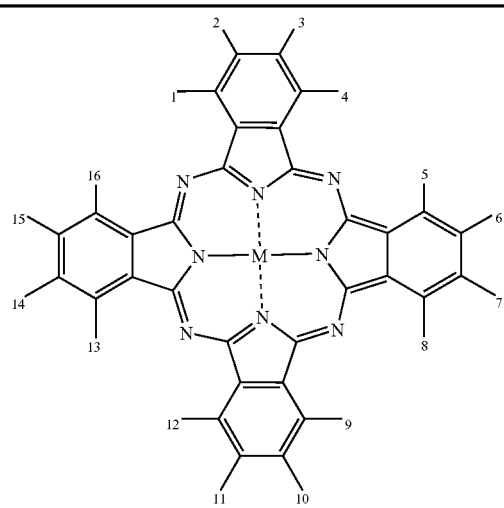

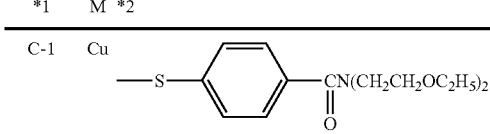

*1: Illustrative Compound
*2: The substituent at one of position 1 or 4, one of position 5 or 8, one of position 9 or 12, and one of position 13 or 16 (The substituent at the other one of each of the foregoing pairs of positions is H).
*3: The substituent at the other eight positions.

| *1 | M | *2 | *3 |
|---|---|---|---|
| C-13 | Cu | 3-(methylsulfonyl)-C<sub>6</sub>H<sub>3</sub>-C(=O)N(CH<sub>2</sub>CH<sub>2</sub>OC<sub>2</sub>H<sub>5</sub>)<sub>2</sub> | H |
| C-14 | Cu | —S—(2-C<sub>6</sub>H<sub>4</sub>)—C(=O)N(CH<sub>2</sub>CH<sub>2</sub>OC<sub>2</sub>H<sub>5</sub>)<sub>2</sub> | H |
| C-15 | Cu | —S—(4-C<sub>6</sub>H<sub>4</sub>)—OC(=O)CH<sub>2</sub>CH<sub>2</sub>OC<sub>2</sub>H<sub>5</sub> | *4 |

*1: Illustrative Compound
*2: The substituent at one of position 1 or 4, one of position 5 or 8, one of position 9 or 12, and one of position 13 or 16 (The substituent at the other one of each of the foregoing pairs of positions is H).
*3: The substituent at the other eight positions.
*4: The substituent at one of position 2 or 3, one of position 6 or 7, one of position 10 or 11, and one of position 14 or 15 is CH<sub>3</sub>, (The substituent at the other one of each of the foregoing pairs of positions is H).

| *1 | M | *2 | *3 |
|---|---|---|---|
| C-16 | Cu | —S—(4-C<sub>6</sub>H<sub>4</sub>)—NHC(=O)N(CH<sub>2</sub>CH<sub>2</sub>OC<sub>2</sub>H<sub>5</sub>)<sub>2</sub> | H |
| C-17 | Cu | —S—(4-C<sub>6</sub>H<sub>4</sub>)—NHC(=O)CH(CH<sub>3</sub>)CH<sub>2</sub>OCH<sub>3</sub> | H |
| C-18 | Cu | —S—(4-C<sub>6</sub>H<sub>3</sub>-3-CH<sub>3</sub>)—N(CH<sub>3</sub>)C(=O)C(CH<sub>3</sub>)HCH<sub>2</sub>OCH<sub>3</sub> | H |
| C-19 | Cu | —S—(3-C<sub>6</sub>H<sub>4</sub>)—C(=O)O—(2,4,6-tri-CH<sub>3</sub>-C<sub>6</sub>H<sub>2</sub>) | H |
| C-20 | Cu | —S—(4-C<sub>6</sub>H<sub>4</sub>)—NHSO<sub>2</sub>N(C<sub>2</sub>H<sub>5</sub>)<sub>2</sub> | H |
| C-21 | Cu | —S—(4-C<sub>6</sub>H<sub>4</sub>)—N(CH<sub>3</sub>)SO<sub>2</sub>CH<sub>3</sub> | H |
| C-22 | Cu | —S—(4-C<sub>6</sub>H<sub>4</sub>)—NHSO<sub>2</sub>—C<sub>6</sub>H<sub>5</sub> | H |

*1: Illustrative Compound
*2: The substituent at one of position 1 or 4, one of position 5 or 8, one of position 9 or 12, and one of position 13 or 16 (The substituent at the other one of each of the foregoing pairs of positions is H).
*3: The substituent at the other eight positions.

| *1 | M | *2 | *3 |
|---|---|---|---|
| C-23 | Cu | —S—(4-C<sub>6</sub>H<sub>4</sub>)—SO<sub>2</sub>—(4-C<sub>6</sub>H<sub>4</sub>)—CH<sub>3</sub> | H |
| C-24 | Cu | —S—(4-C<sub>6</sub>H<sub>4</sub>)—SO<sub>2</sub>N(CH<sub>2</sub>CH<sub>2</sub>OCH<sub>3</sub>)<sub>2</sub> | H |
| C-25 | Cu | —S—(2-SO<sub>3</sub>Na-5-OCH<sub>2</sub>CH<sub>2</sub>OC<sub>2</sub>H<sub>5</sub>-C<sub>6</sub>H<sub>3</sub>) | H |
| C-26 | V=O | —S—(4-C<sub>6</sub>H<sub>4</sub>)—C(=O)N(CH<sub>2</sub>CH<sub>2</sub>OC<sub>2</sub>H<sub>5</sub>)<sub>2</sub> | H |
| C-27 | Co | —S—(4-C<sub>6</sub>H<sub>4</sub>)—C(=O)N(CH<sub>3</sub>)CH<sub>2</sub>CH<sub>2</sub>OCH<sub>3</sub> | H |
| C-28 | Co | —S—(4-C<sub>6</sub>H<sub>4</sub>)—C(=O)N(CH<sub>3</sub>)<sub>2</sub> | H |
| C-29 | Zn | —S—(4-C<sub>6</sub>H<sub>4</sub>)—NHC(=O)CH(CH<sub>3</sub>)CH<sub>2</sub>OCH<sub>3</sub> | H |
| C-30 | V=O | —S—(2-C<sub>6</sub>H<sub>4</sub>)—OCH<sub>2</sub>(CF<sub>2</sub>)<sub>3</sub>CF<sub>2</sub>H | H |

*1: Illustrative Compound
*2: The substituent at one of position 1 or 4, one of position 5 or 8, one of position 9 or 12, and one of position 13 or 16 (The substituent at the other one of each of the foregoing pairs of positions is H).
*3: The substituent at the other eight positions.

| *1 | M | *2 | *3 |
|---|---|---|---|
| C-31 | Cu | —S—(2-Cl-5-OCH<sub>2</sub>CH<sub>2</sub>OCH<sub>2</sub>CH<sub>2</sub>OCH<sub>3</sub>-C<sub>6</sub>H<sub>3</sub>) | H |

-continued

| *1 | M | *2 | *3 |
|---|---|---|---|
| C-32 | Cu | −S−C₆H₃(CH₃)(OCH₂CH₂OCH₂CH₂OCH₃) | H |
| C-33 | Cu | −S−C₆H₄−N(succinimide-C₄H₉) | H |
| C-34 | Cu | −S−C₆H₄−SO₂−C₆H₅ | H |
| C-35 | Cu | −S−C₆H₄−COC₂H₄OC₂H₄OCH₃ (C(=O)) | H |

*1: Illustrative Compound
*2: The substituent at one of position 1 or 4, one of position 5 or 8, one of position 9 or 12, and one of position 13 or 16 (The substituent at the other one of each of the foregoing pairs of positions is H).
*3: The substituent at the other eight positions.

| *1 | M | *2 | *3 |
|---|---|---|---|
| C-41 | Cu | −S−C₆H₄−C(=O)N(CH₂CH₂OC₂H₅)₂ | H |
| C-42 | Cu | −S−C₆H₄−C(=O)CH(CH₃)CH₂OCH₃ | H |
| C-43 | Cu | −S−C₆H₄−C(=O)N(CH₃)₂ | H |
| C-44 | Cu | −S−C₆H₄−C(=O)CH(CH₃)CH₂OCH₃ (meta) | H |
| C-45 | Co | −S(=O)₂−C₆H₄−C(=O)N(CH₂CH₂OC₂H₅)₂ | H |

*1: Illustrative Compound
*2: The substituent at one of position 2 or 3, one of position 6 or 7, one of position 10 or 11, and one of position 14 or 15 (The substituent at the other one of each of the foregoing pairs of positions is H).
*3: The substituent at the other eight positions.

-continued

| *1 | M | *2 | *3 |
|---|---|---|---|
| C-46 | Zn | −S−C₆H₄−C(=O)N(C₂H₅)(CH₂CH₂OCH₃) | H |
| C-47 | V=O | −S−C₆H₄−COCH₃ | H |
| C-48 | Cu | −S−C₆H₄−COCH₃ | *4 |
| C-49 | Cu | −S−C₆H₄−NHCOCH(CH₃)CH₂OCH₃ | H |

*1: Illustrative Compound
*2: The substituent at one of position 2 or 3, one of position 6 or 7, one of position 10 or 11, and one of position 14 or 15 (The substituent at the other one of each of the foregoing pairs of positions is H).
*3: The substituent at the other eight positions.
*4: The substituent at one of position 1 or 4, one of position 5 or 8, one of position 9 or 12, and one of position 13 or 16 is CH₃, (The substituent at the other one of each of the foregoing pairs of positions is H).

C-50

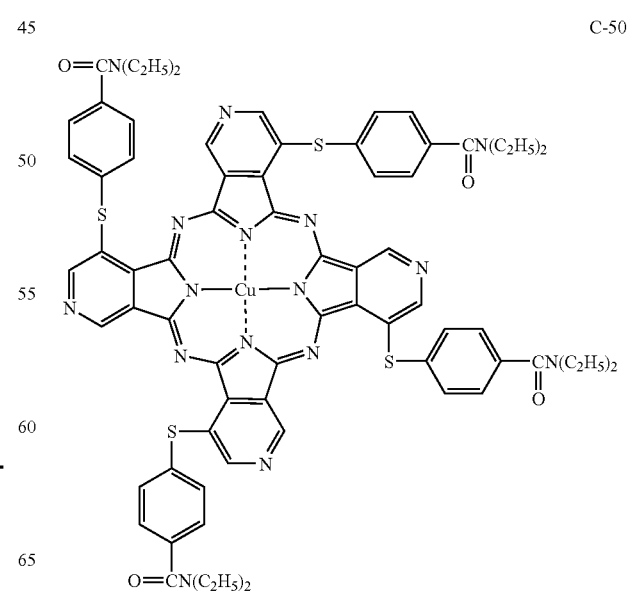

-continued
C-51
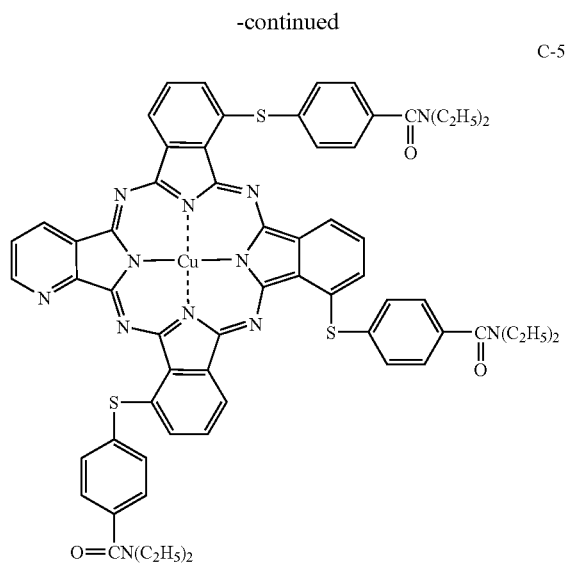
C-54
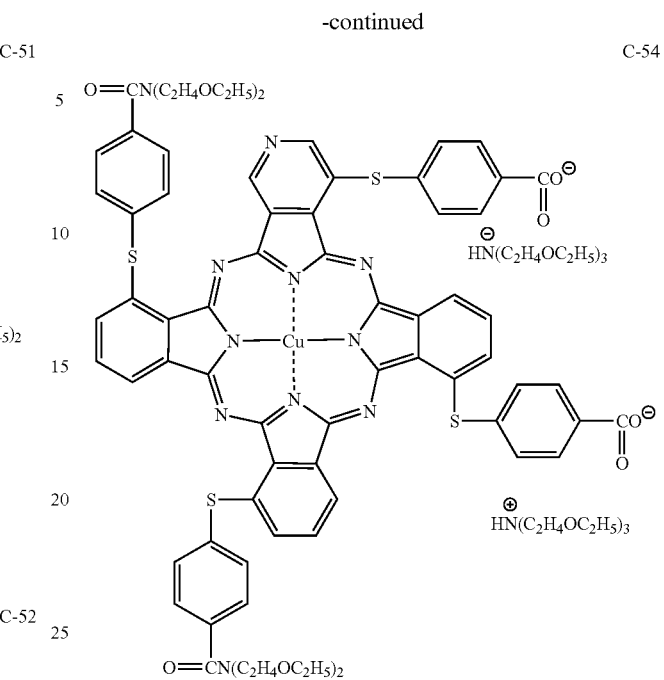
C-52
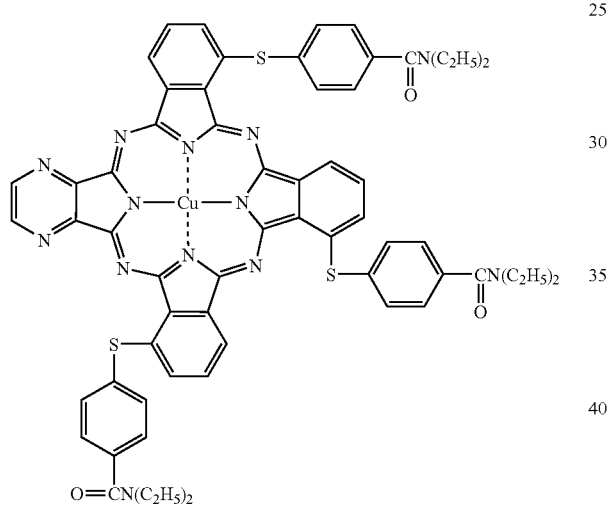
C-53
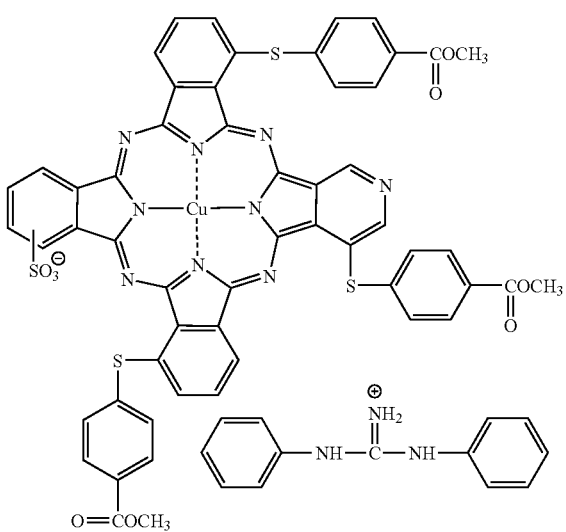
C-55
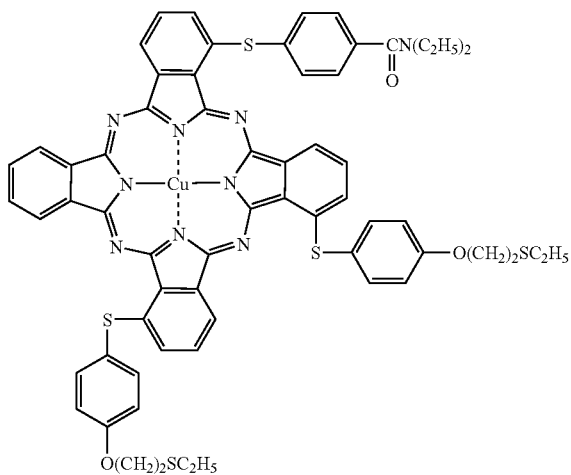

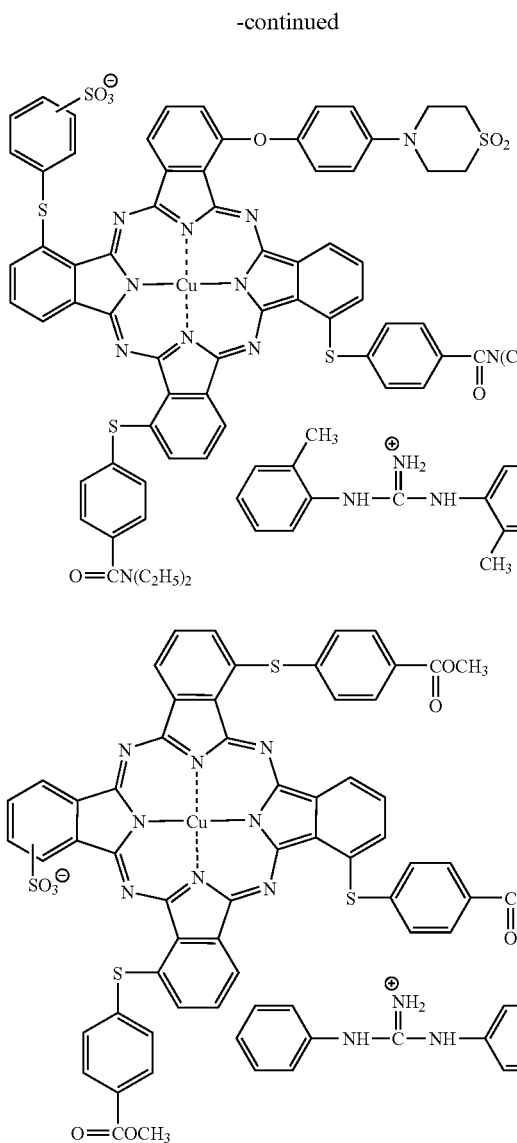
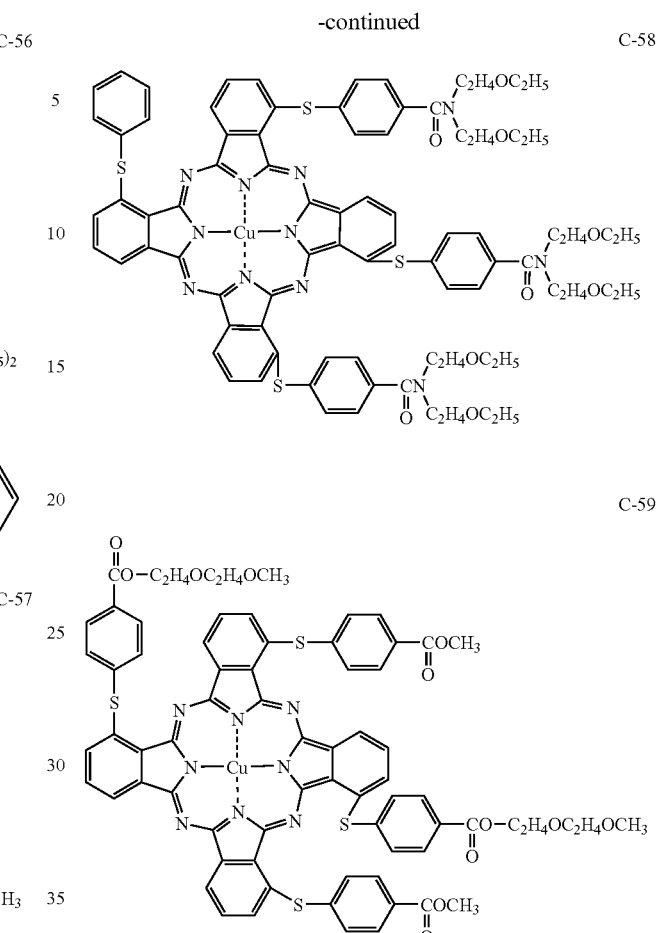
Synthesis Examples
Next, as a synthesis example of the compounds (dyes) represented by Formula (C1) above, a synthesis example of dye C-1 shown above as an illustrative compound will be described in detail with reference to the following scheme:
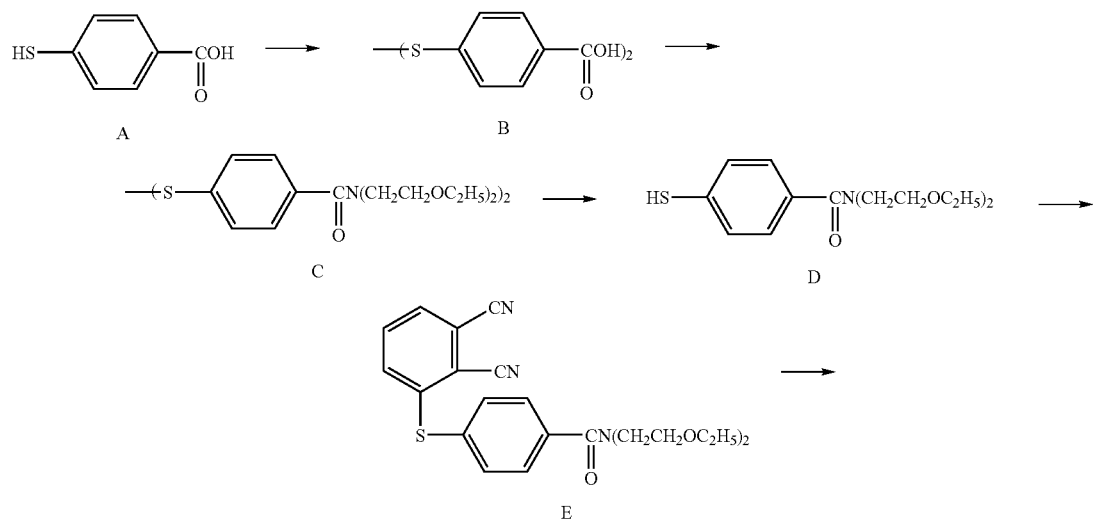

-continued

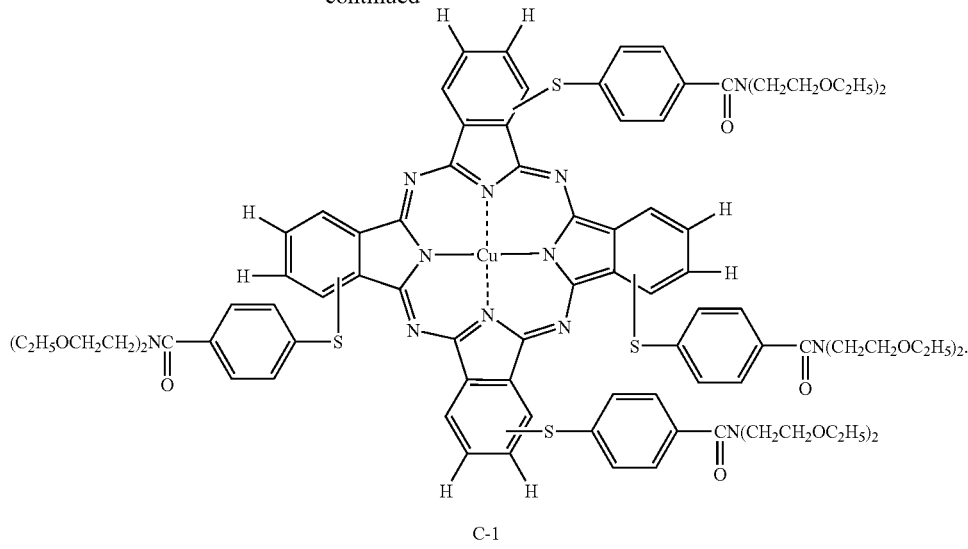

C-1

<Synthesis of Intermediate Product B>

First, 25.0 g (0.162 mol) of Compound A was dissolved in a mixture solvent of 100 ml of methanol and 23 ml of triethylamine, and the resultant solution was cooled to 5° C., and then 9 ml of 30% aqueous hydrogen peroxide was added dropwise to the solution with agitation. At this time, the temperature of the reaction solution was kept at 25° C. or lower. The reaction solution thus obtained was agitated at 25° C. for 30 minutes. Thereafter, the reaction solution was cooled to 5° C., and 15 ml of concentrated hydrochloric acid was added dropwise to the reaction solution with agitation, and 200 ml of water was further added thereto. The resultant solution was agitated at 25° C. for one hour. Then, the crystal deposited was filtrated, sufficiently washed with water, and dried to obtain 24.7 g of Intermediate Product B as a white crystal (yield 99.5%).

<Syntheses of Intermediate Products C, D, and E>

Thereafter, 100 ml of toluene and 0.25 ml of dimethylacetamide were added to 17.5 g (0.114 mol) of Intermediate Product B obtained above. Then while the resultant mixture was refluxed, 25 ml of thionyl chloride was added dropwise to the mixture over 10 minutes. The resultant reaction solution was refluxed under heating for one hour, and then was concentrated under reduced pressure to obtain a viscous liquid. Separately, 10 ml of dimethylacetamide and 100 ml of acetonitrile were added to 38.0 g (0.235 mol) of diethoxyethylamine, and the resultant solution was agitated at 10° C. Then, the above-mentioned viscous liquid was added dropwise to the solution over 15 minutes while the solution is agitated. At this time, the temperature of the resultant reaction solution was kept 15° C. or lower. This reaction solution was agitated for 30 minutes, and then the resultant solution was poured into a mixture solution of 100 ml of water and 100 ml of ethyl acetate, The ethyl acetate phase was separated and then washed twice with 100 ml of water. The ethyl acetate phase was dried with magnesium sulfate, and ethyl acetate was distilled off under reduced pressure from the phase, whereby intermediate Product C as a pale yellow viscous liquid was obtained.

Next, 50 ml of water, 200 ml of ethanol, and 12 g of a zinc powder were added to this Intermediate Product C. A solution prepared by dilution of 10 ml of sulfuric acid with 40 ml of water was added dropwise to the resultant mixture over 20 minutes while the mixture was heated and refluxed. The resultant mixture was heated and agitated for 30 minutes, and then cooled, whereby insoluble matter was filtered off the mixture. 50 ml of a saturated aqueous sodium chloride solution and 100 ml of ethyl acetate were added to the resultant solution, the ethyl acetate phase was separated, and the ethyl acetate phase was washed twice with 100 ml of water. The ethyl acetate phase was dried with magnesium sulfate, and ethyl acetate was distilled off the phase under reduced pressure, to obtain Intermediate Product D as a pale yellow viscous liquid.

Next, under nitrogen atmosphere, 70 ml of dimethylacetamide and 15 g (0.108 mol) of potassium carbonate were added to this Intermediate Product D while the product was agitated. Then 19.7 g (0.113 mol) of 3-nitrophthalonitrile was gradually added to the resultant mixture while the mixture was agitated at 20° C. At this time, the temperature of the resultant reaction solution was kept 25° C. or lower. The reaction solution was agitated for 30 minutes. The reaction solution was poured into 300 ml of water while the water was agitated. The resultant crystal was filtrated off and the crystal was sufficiently washed with water. The resultant crystal was re-crystallized from 70 ml of methanol, and the crystal deposited was washed with 30 ml of cooled methanol and dried to obtain 35.0 g of Intermediate Product E as a white crystal (yield 72.6%).

<Synthesis of Dye C-1>

Next, 150 ml of butanol, 6.7 g (0.070 mol) of ammonium carbonate, and 4.7 g (0.035 mol) of copper chloride were added to 34.4 g (0.081 mol) of Intermediate Product E. The resultant mixture was heated for 7 hours and agitated. Subsequently, butanol in the mixture was distilled off under reduced pressure. The resultant solid was purified by silica gel column chromatography to obtain 25 g of Dye C-1 as powder (yield 72.7%).

Other illustrative compounds as mentioned above can also synthesized in a similar manner as described above from corresponding raw materials.

The concentration of the dye according to the invention in the total solid components of the colored curable composition varies depending on the molecular weight and molar light absorption coefficient of the dye, and is preferably from 0.5 to 80 mass %, more preferably from 0.5 to 60 mass %, still more preferably from 0.5 to 50 mass %.

The compounds represented by Formulae (C1) to (C3) above (first, third, and fourth dyes according to the invention) can be suitably utilized in color filters for recording and reproducing color images used in solid-state image sensing devices such as CCD and CMOS and displays such as LCD and PDP, or in curable compositions for preparing these color filters.

Color filters according to the second aspect of the invention can be prepared by any method from curable compositions containing compounds represented by Formulae (C1) to (C3) above. For example, a color filter according to the invention can be suitably prepared by conducting steps of preparing a curable composition containing the first, third, and fourth dyes according to the invention, applying the curable composition prepared onto a support or the like, exposing the resultant coated film to light through a mask and developing the coated film (for example, by removing uncured portions (unexposed portions) in the case of a negative type composition) to form a pattern image. When the color filter has a plurality of colors, the above-mentioned steps are repeated for the number of the desired hues while changing the dye. Specific examples will be described below.

Tetraazaporphyrin Colorant Having a Substituent Represented by Formula (I)

A colored curable composition according to the fourth aspect of the invention contains a tetraazaporphyrin colorant having at least one substituent represented by Formula (I) below in a molecule thereof (hereinafter occasionally referred to as a "second according to the invention"). This colorant has good hue. The colorant does not precipitate even when time passes after formation of a liquid preparation or coated film containing this colorant. The colorant is excellent in storage stability, as well as is excellent in developability and excellent in fastness against heat and light.

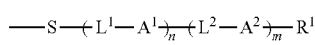

Formula (I)

In formula (I), $L^1$ represents an alkylene group; $A^1$ and $A^2$ each independently represent —O—, —C(=O)—, —OC(=O)—, —C(=O)O—, —N(R$^2$)C(=O)—, —C(=O)N(R$^2$)—, —N(R$^2$)C(=O)—, —OC(=O)N(R$^2$)—, N(R$^2$)C(=O)N(R$^3$)—, —N(R$^2$)SO$_2$—, —SO$_2$N(R$^2$)—, or —SO$_2$—; $L^2$ represents an alkylene group, an aralkylene group, or an arylene group; n denotes an integer from 1 to 3; m denotes an integer from 0 to 3; when n is 2 or greater, $L^1$'s may be the same or different and $A^1$'s each may be the same or different; when m is 2 or greater, $L^2$'s may be the same or different and $A^2$'s may be the same or different; $R^1$ represents a hydrogen atom, an alkyl group, an aryl group or a heterocyclic group; and $R^2$ and $R^3$ each independently represent a hydrogen atom, an alkyl group, an aryl group or a heterocyclic group.

$L^1$, $L^2$, $A^1$, $A^2$, n and m in the group represented by Formula (I) will be described in detail.

$L^1$ in Formula (I) represents an alkylene group. The alkylen group represented by $L^1$ preferably has 1 to 12 carbon atoms, and more preferably represents a chain or cyclic alkylene group having 1 to 6 carbon atoms (e.g., methylene, ethylene, propylene, butylene, cyclopropylene, or the like).

When the alkylene group represented by $L^1$ above is a group that can be substituted, the group may have such a substituent as described below. Examples of substituent for $L^1$ include halogen atoms (e.g., fluorine, chlorine, bromine), alkyl groups (straight-chained, branched, or cyclic alkyl groups having preferably 1 to 36 carbon atoms, more preferably 1 to 12 carbon atoms; for example, methyl, ethyl, propyl, isopropyl, butyl, t-butyl, pentyl, hexyl, heptyl, octyl, 2-ethylhexyl, dodecyl, hexadecyl, cyclopropyl, cyclopentyl, cyclohexyl, 1-norbornyl, 1-adamantyl), alkenyl groups (alkenyl groups having preferably 2 to 24 carbon atoms, more preferably 2 to 12 carbon atoms: for example, vinyl, allyl, 3-butene-1-ine), aryl groups (aryl groups having preferably 6 to 36 carbon atoms, more preferably 6 to 12 carbon atoms: for example, phenyl, naphthyl), heterocyclic groups (heterocyclic groups having preferably 1 to 32 carbon atoms, more preferably 1 to 12 carbon atoms: for example, 2-thienyl, 4-pyridyl, 2-furyl, 2-pyrimidinyl, 1-pyridyl, 2-benzothiazoyl, 1-imidazolyl, 1-pyrazolyl, benzotriazol-1-yl), silyl groups (silyl groups having preferably 3 to 38 carbon atoms, more preferably 3 to 12 carbon atoms: for example, trimethylsilyl, triethylsilyl, tributylsilyl, t-butyldimethylsilyl, t-hexyldimethylsilyl), a hydroxyl group, a cyano group, a nitro group, alkoxyl groups (alkoxy groups having preferably 1 to 36 carbon atoms, more preferably 1 to 12 carbon atoms: for example, methoxy, ethoxy, 1-butoxy, 2-butoxy, isopropoxy, t-butoxy, dodecyloxy, or a cycloalkyl group, e.g., cyclopentyloxy, cyclohexyloxy), aryloxy groups (aryloxy groups having preferably 6 to 36 carbon atoms, more preferably 6 to 12 carbon atoms: for example, phenoxy, 1-naphtoxy), heterocyclic oxy groups (heterocyclic oxy groups having preferably 1 to 24 carbon atoms, more preferably 1 to 12 carbon atoms: for example, 1-phenyltetrazol-5-oxy, 2-tetrahydropyranyloxy), silyloxy groups (silyloxy groups having preferably 1 to 36 carbon atoms, more preferably 1 to 12 carbon atoms: for example, trimethylsilyloxy, t-butyldimethylsilyloxy, diphenylmethylsilyloxy), acyloxy groups (acyloxy groups having preferably 2 to 36 carbon atoms, more preferably 2 to 12 carbon atoms: for example, acetoxy, pivaloyloxy, benzoyloxy, dodecanoyloxy), alkoxycarbonyloxy groups (alkoxycarbonyloxy groups having preferably 2 to 36 carbon atoms, more preferably 2 to 12 carbon atoms: for example, ethoxycarbonyloxy, t-butoxycarbonyloxy, or an cycloalkyloxycarbonyloxy group, e.g., cyclohexyloxycarbonyloxy), aryloxycarbonyloxy groups (aryloxycarbonyloxy groups having preferably 7 to 32 carbon atoms, more preferably 7 to 18 carbon atoms: for example, phenylcarbonyloxy), carbamoyloxy groups (carbamoyloxy groups having preferably 1 to 36 carbon atoms, more preferably 1 to 12 carbon atoms: for example, N,N-dimethylcarbamoyloxy, N-butylcarbamoyloxy, N-phenylcarbamoyloxy, N-ethyl-N-phenylcarbamoyloxy), sulfamoyloxy groups (sulfamoyloxy groups having preferably 1 to 32 carbon atoms, more preferably 1 to 12 carbon atoms: for example, N,N-diethylsulfamoyloxy, N-propylsulfamoyloxy), alkylsulfonyloxy groups (alkylsulfonyloxy groups having preferably 1 to 38 carbon atoms, more preferably 1 to 12 carbon atoms: for example, methylsulfonyloxy, hexadecylsulfonyloxy, cyclohexylsulfonyloxy), arylsulfonyloxy groups (arylsulfonyloxy groups having preferably 6 to 32 carbon atoms, more preferably 6 to 12 carbon atoms: for example, phenylsulfonyloxy), acyl groups (acyl groups having preferably 1 to 36 carbon atoms, more preferably 1 to 12 carbon atoms: for example, formyl, acetyl, pivaloyl, benzoyl, tetradecanoyl, cyclohexanoyl), alkoxycarbonyl groups (alkoxycarbonyl groups having preferably 2 to 36 carbon atoms, more preferably 2 to 12 carbon atoms: for example, methoxycarbonyl, ethoxycarbonyl, octadecyloxycarbonyl, cyclohexyloxycarbonyl), aryloxycarbonyl groups (aryloxycarbonyl groups having preferably 7 to 32 carbon atoms, more preferably 7 to 12 carbon atoms: for example, phenoxycarbonyl), carbamoyl groups (carbamoyl groups having preferably 1 to 36 carbon atoms, more preferably 1 to 12 carbon atoms: for example, carbamoyl, N,N-diethylcarbamoyl, N-ethyl-N-octylcarbamoyl, N,N-dibutylcarbamoyl, N-propylcarbamoyl, N-phenylcarbamoyl, N-methyl-N-phenylcarbamoyl, N,N-dicyclohexylcarbamoyl), amino groups (amino groups having preferably 32 or fewer carbon atoms, more preferably 12 or fewer carbon atoms: for example, amino, methylamino, N,N-dibutylamino, tetradecylamino, 2-ethylhexylamino, cyclohexylamino), anilino groups (anilino groups having preferably 6 to 32 carbon atoms, more preferably 6 to 12 carbon atoms: for example, aniline, N-methylanilino), heterocyclic amino groups (heterocyclic amino groups having preferably 1 to 32 carbon atoms, more preferably 1 to 12 carbon atoms: for example, 4-pyridylamino), carbonamido groups (carbonamido groups having preferably 2 to 36 carbon atoms, more preferably 2 to 12 carbon atoms: for example, acetamide, benzamide, tetradecanamide, pivaroylamide, cyclohexanamide), ureido groups (ureido groups having preferably 1 to 32 carbon atoms, more preferably 1 to 12 carbon atoms: for example, ureido, N,N-dimethylureido, N-phenylureido), imide groups (imide groups having preferably 20 or fewer carbon atoms, more preferably 12 or fewer carbon atoms: for example, N-succinimide, N-phthalimide), alkoxycarbonylamino groups (alkoxycarbonylamino groups having preferably 2 to 36 carbon atoms, more preferably 2 to 12 carbon atoms: for example, methoxycarbonylamino, ethoxycarbonylamino, t-butoxycarbonylamino, octadecyloxycarbonylamino, cyclohexyloxycarbonylamino), aryloxycarbonylamino groups (aryloxycarbonylamino groups having preferably 7 to 32 carbon atoms, more preferably 7 to 12 carbon atoms: for example, phenoxycarbonylamino), sulfonamide groups (sulfonamide groups having preferably 1 to 36 carbon atoms, more preferably 1 to 12 carbon atoms: for example, methanesulfonamide, butanesulfonamide, benzenesulfonamide, hexadecanesulfonamide, cyclohexanesulfonamide), sulfamoylamino groups (sulfamoylamino groups having preferably 1 to 36 carbon atoms, more preferably 1 to 12 carbon atoms: for example, N,N-dipropylsulfamoylamino, N-ethyl-N-dodecylsulfamoylamino), azo groups (azo groups having preferably 1 to 36 carbon atoms, more preferably 1 to 24 carbon atoms: for example, phenylazo, 3-pyrazolylazo), alkylthio groups (alkylthio groups having preferably 1 to 36 carbon atoms, more preferably 1 to 12 carbon atoms: for example, methylthio, ethylthio, octylthio, cyclohexythio), arylthio groups (arylthio groups having preferably 6 to 36 carbon atoms, more preferably 6 to 12 carbon atoms: for example, phenylthio), heterocyclic thio groups (heterocyclic thio groups having preferably 1 to 32 carbon atoms, more preferably 1 to 12 carbon atoms: for example, 2-benzothiazolylthio, 2-pyridylthio, 1-phenyltetrazoylthio), alkylsulfinyl groups (alkylsulfinyl groups having preferably 1 to 32 carbon atoms, more preferably 1 to 12 carbon atoms: for example, dodecanesulfinyl), arylsulfinyl groups (arylsulfinyl groups having preferably 6 to 32 carbon atoms, more preferably 6 to 12 carbon atoms: for example, phenylsulfinyl), alkylsulfonyl groups (alkylsulfonyl groups having preferably 1 to 36 carbon atoms, more preferably 1 to 12 carbon atoms: for example, methylsulfonyl, ethylsulfonyl, propylsulfonyl, butylsulfonyl, isopropylsulfonyl, 2-ethylhexylsulfonyl, hexadecylsulfonyl, octylsulfonyl, cyclohexylsulfonyl), arylsulfonyl groups (arylsulfonyl groups having preferably 6 to 36 carbon atoms, more preferably 6 to 12 carbon atoms: for example, phenylsulfonyl, 1-naphthylsulfonyl), sulfamoyl groups (sulfamoyl groups having preferably 32 or fewer carbon atoms, more preferably 16 or fewer carbon atoms: for example, sulfamoyl, N,N-dipropylsulfamoyl, N-ethyl-N-dodecylsulfamoyl, N-ethyl-N-phenylsulfamoyl, N-cyclohexylsulfamoyl), a sulfo group, phosphonyl groups (phosphonyl groups having preferably 1 to 32 carbon atoms, more preferably 1 to 12 carbon atoms: for example, phenoxyphosphonyl, octyloxyphosphonyl, phenylphosphonyl), phosphinoylamino groups (phosphinoylamino groups having preferably 1 to 32 carbon atoms, more preferably 1 to 12 carbon atoms: for example, diethoxyphosphinoylamino, dioctyloxyphosphinoylamino).

The alkylene group represented by $L^1$ above may have two or more substituents. When the above-mentioned alkylene group has two or more substituents, those substituents may be the same or different.

$A^1$ in Formula (I) represents —O—, —C(=O)—, —OC(=O)—, —C(=O)O—, —N($R^2$)C(=O)—, —C(=O)N($R^2$)—, —N($R^2$)C(=O)—, —OC(=O)N($R^2$)—, N($R^2$)C(=O)N($R^3$)—, —N($R^2$)$SO_2$—, —$SO_2$N($R^2$)—, or —$SO_2$—. From the viewpoint of the storage stability of the colored curable composition, $A^1$ above is preferably —O—, —OC(=O)—, —C(=O)O—, —N($R^2$)$SO_2$—, —$SO_2$N($R^2$)—, or —$SO_2$—, wherein $R^2$ is preferably a hydrogen atom or an alkyl group. Moreover, $A^1$ is more preferably —O—, —C(=O)O—, —N($R^2$)$SO_2$—, or —$SO_2$— ($R^2$ is preferably a hydrogen atom or an alkyl group), particularly preferably —O—.

In Formula (I), $R^2$ and $R^3$ each independently represent a hydrogen atom, an alkyl group, an aryl group or a heterocyclic group. The alkyl, aryl and heterocyclic groups represented by $R^2$ and $R^3$ have the same meaning as the alkyl, aryl and heterocyclic groups mentioned as examples of the substituents on $L^1$ above.

When the alkyl, aryl and heterocyclic groups represented by $R^2$ and $R^3$ are groups that can be substituted, these groups may be substituted by any of the substituents mentioned in the description of $L^1$ above. When $R^2$ or $R^3$ is substituted by two or more substituents, those substituents may be the same or different.

"n" denotes an integer from 1 to 3. When n is 2 or greater, two or more ($L^1$-$A^1$)s may be the same or different. Furthermore, two or more $L^1$s may be the same or different, and two or more $A^1$s may be the same or different.

$L^2$ in Formula (I) represents an alkylene group, an aralkylene group, or an arylene group.

When $L^2$ is an alkylene group, the alkylene group has the same meaning as the alkylene group described for $L^1$ above. Moreover, when $L^2$ is an aralkylene group, the aralkylene group represents an aralkylene group that has preferably from 7 to 18 carbon atoms, more preferably from 7 to 12 carbon atoms. Such aralkylene groups include a divalent benzyl group, phenethylene group, and the like.

Where $L^2$ is an arylene group, examples of the arylene group include o-phenylene, m-phenylene, and p-phenylene.

When the alkylene group, aralkylene group or arylene group represented by $L^2$ is a group that can be substituted, the alkylene, aralkylene, or arylene group represented by $L^2$ may be substituted by any of the substituents mentioned in the description of $L^1$ above. When the alkylene, aralkylene, or arylene group represented by $L^2$ have two or more substituents, those substituents may be the same or different.

$A^2$ in Formula (I) has the same meaning as $A^1$ above, and preferable examples of $A^2$ is the same as preferable examples of $A^1$. When $A^2$ is a group that can be substituted, $A^2$ may be substituted by any of the substituents mentioned in the description of substituents on $L^1$ above; when $A^2$ is substituted by two or more substituents, those substituents may be the same or different.

m denotes an integer from 0 to 3, and when m is 2 or greater, two or more ($L^2$-$A^2$)s may be the same or different. Furthermore, two or more $L^2$s may be the same or different, and two or more $A^2$s may be the same or different.

Hereinafter, specific examples represented by Formula (I) (illustrative substituents (T-1) to (T-91)) will be indicated; however, the invention is by no means limited by the specific examples.

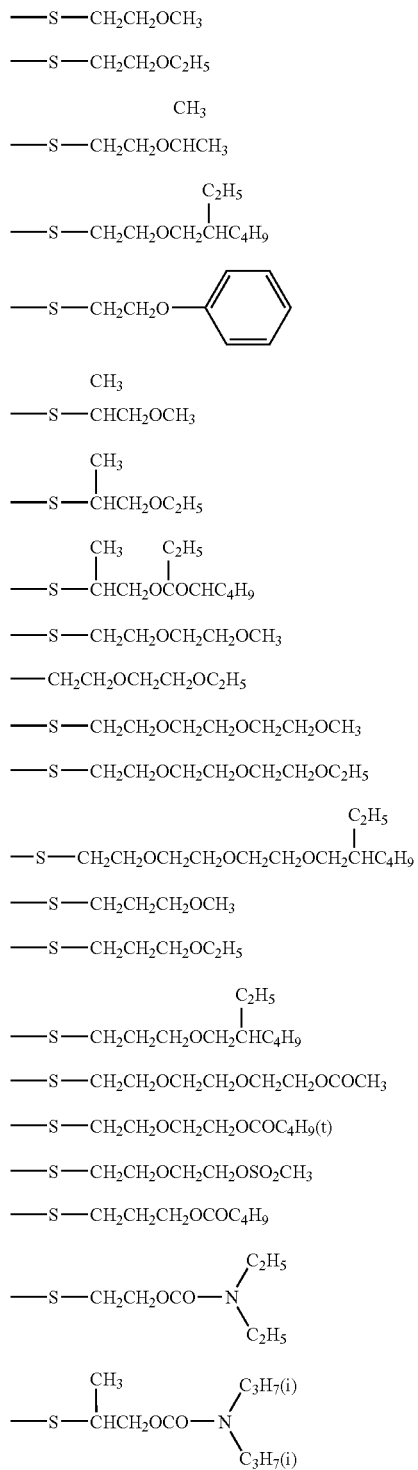

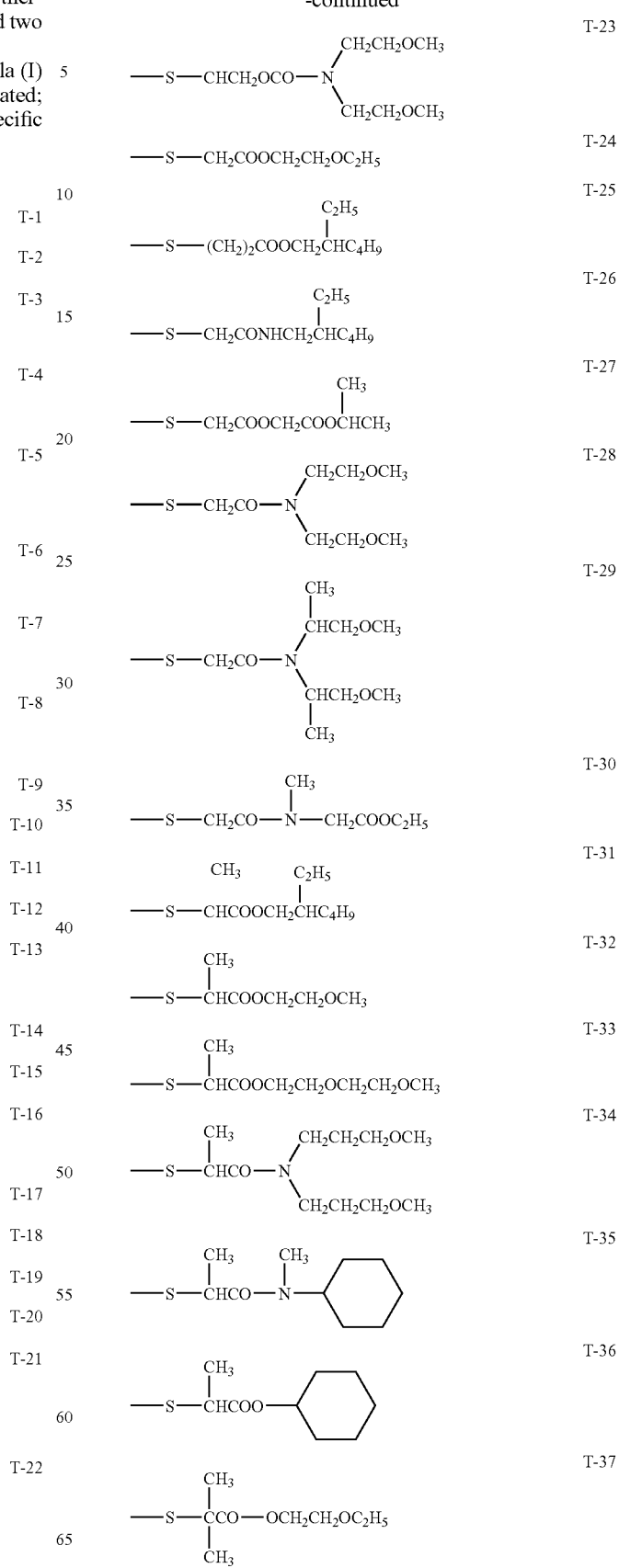

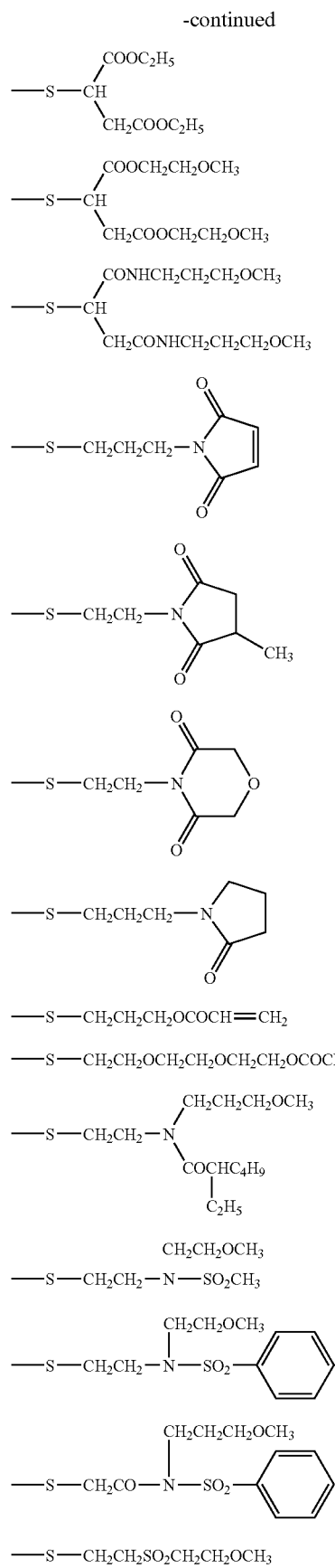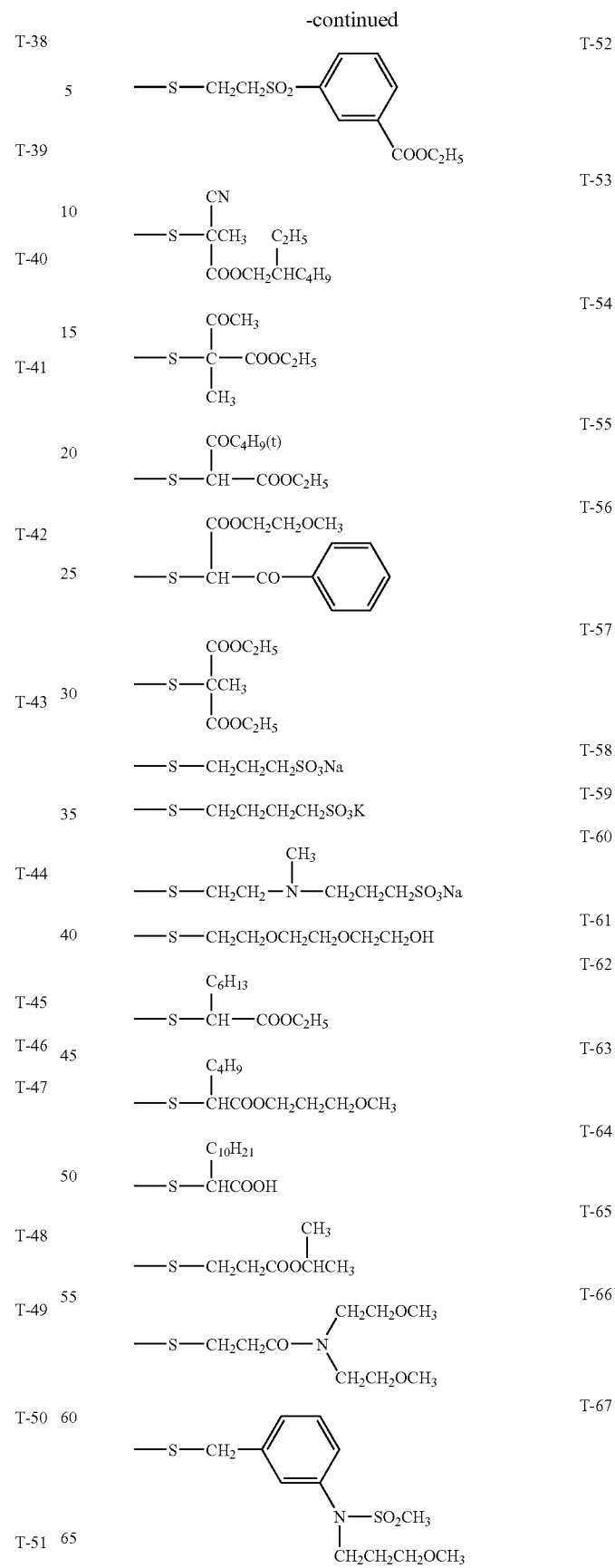

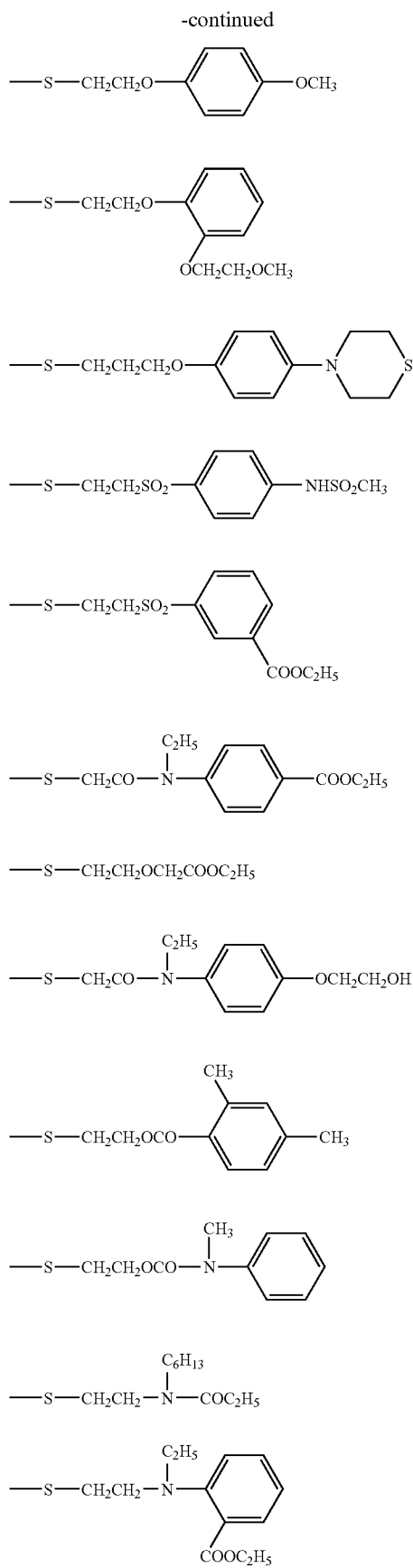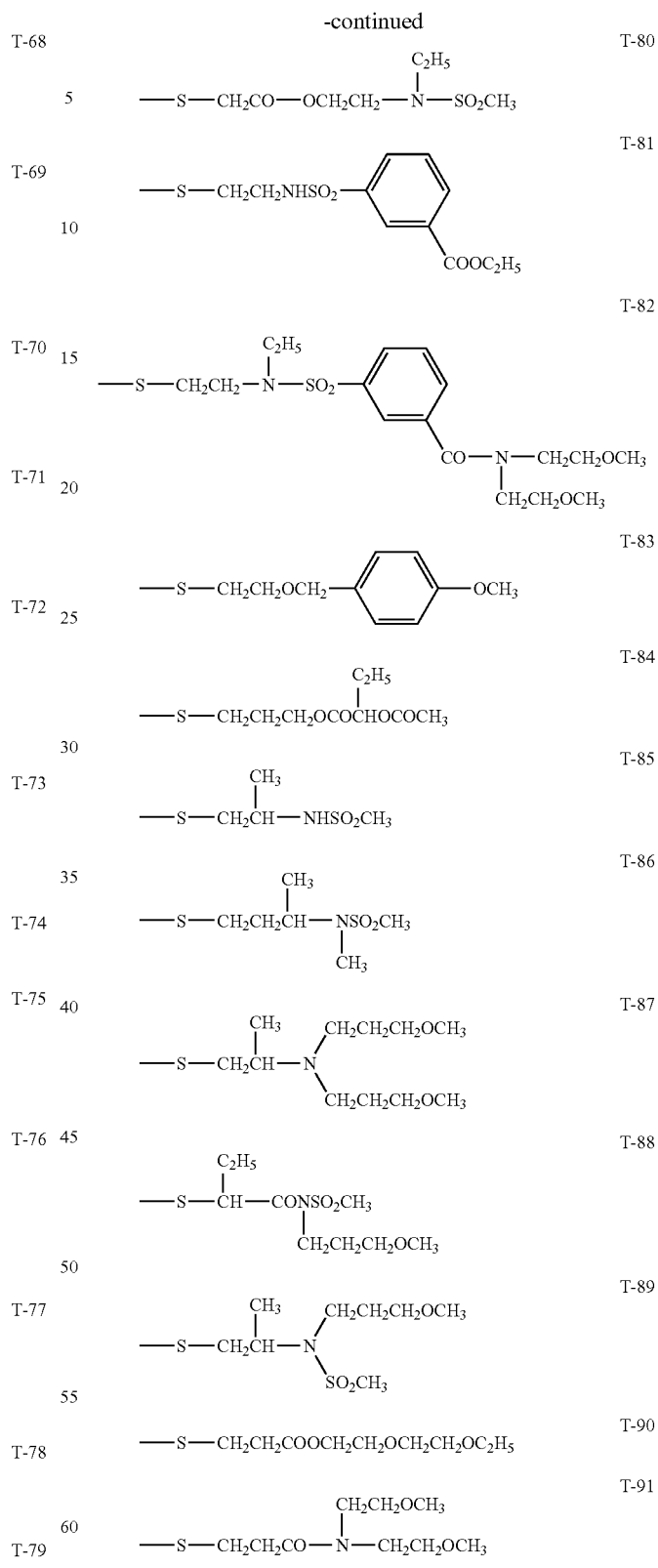
The tetraazaporphyrin colorant having, in a molecule thereof, at least one group represented by Formula (I) is preferably a phthalocyanine colorant represented by Formula (II) below:

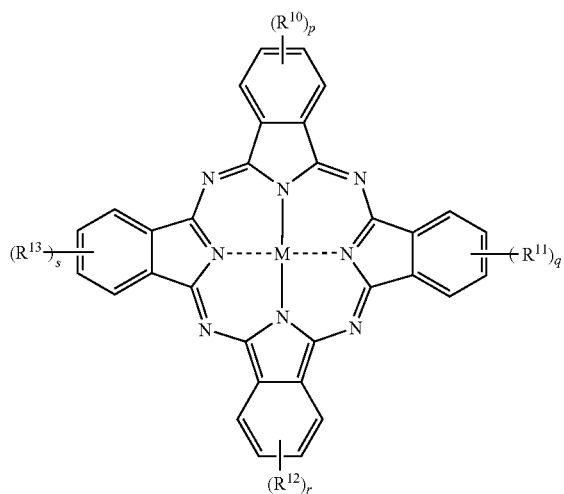

Formula (II)

In formula (II), $R^{10}$ to $R^{13}$ each independently represent a substituent; p, q, r and s represent an integer from 0 to 4; at least one of $R^{10}$ to $R^{13}$ represents a group represented by Formula (I) above; and M represents a metal-containing substance.

Phthalocyanine colorants represented by Formula (II) above will be described in detail hereinafter.

In Formula (II), $R^{10}$ to $R^{13}$ each independently represent a substituent, and at least one of $R^{10}$ to $R^{13}$ represents a group represented by Formula (I) above.

The substituents represented by $R^{10}$ to $R^{13}$ in Formula (II) have the same definition as the substituents described as substituents on $L^1$ in Formula (I) above. As the substituents represented by $R^{10}$ to $R^{13}$, halogen atoms, alkyl groups, alkoxy groups, aryloxy groups, alkoxycarbonyl groups, carbamoyl groups, acylamino groups, imide groups, alkylthio groups, arylthio groups, heterocyclic thio groups, alkylsulfonyl groups, arylsulfonyl groups, sulfo groups, and carboxyl groups are preferable, and halogen atoms, alkyl groups, aryloxy groups, alkoxycarbonyl groups, carbamoyl groups, and sulfo groups are more preferable.

When the substituents represented by $R^{10}$ to $R^{13}$ are groups that can be substituted, the substituents represented by $R^{10}$ to $R^{13}$ may be substituted by substituents selected from those described as substituents on $L^1$ above. When the substituents represented by $R^{10}$ to $R^{13}$ are substituted by two or more substituents, those substituents may be the same or different.

p, q, r and s in Formula (II) represent an integer from 0 to 4, provided that the total sum of p, q, r and s is not 0.

M in Formula (II) represents a metallic substance (a metal or a metal compound). Examples of the metallic substance represented by M include, in addition to Zn, Mg, Si, Sn, Rh, Pt, Pd, Mo, Mn, Pb, Cu, Ni, Co, Fe and the like, metal chlorides such as AlCl, InCl, FeCl, $TiCl_2$, $SnCl_2$, $SiCl_2$, and $GeCl_2$; metal oxides such as TiO and VO; and metal hydroxides such as $Si(OH)_2$.

The tetraazaporphyrin colorant having a group represented by Formula (I) is preferably a phthalocyanine colorant represented by Formula (III) below:

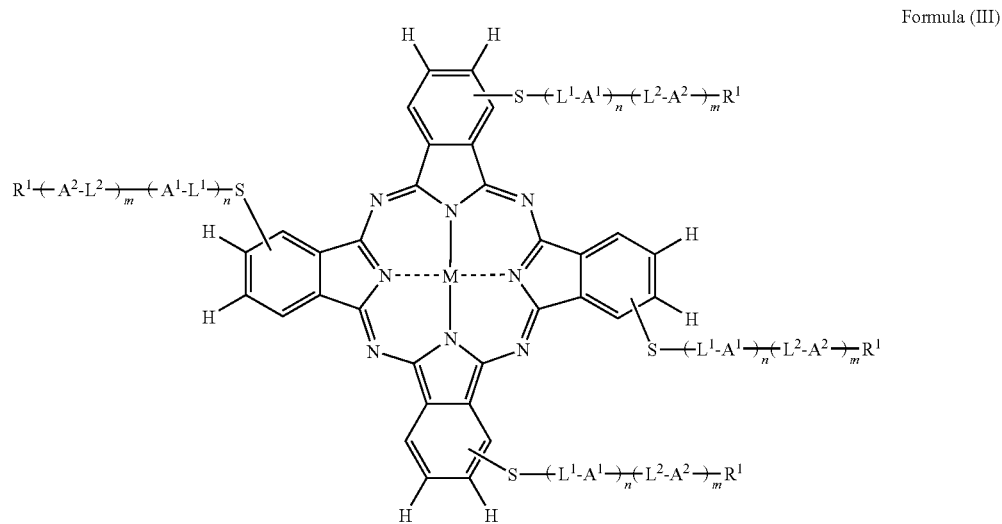

Formula (III)

In the formula, $L^1$, $L^2$, $A^1$, $A^2$, $R^1$, n, m, and M have the same meaning as in Formulae (I) and (II) above.

The phthalocyanine colorant represented by Formula (III) may be a mixture of substitution position isomers.

Next, preferable examples of phthalocyanine colorants represented by Formula (III) will be described.

The phthalocyanine colorant represented by Formula (III) is preferably a compound in which $L^1$ is an alkylene group; $A^1$ and $A^2$ are each independently —O—, —C(=O)—, —OC(=O)—, —C(=O)O—, —N($R^2$)C(=O)—, —C(=O)N($R^2$)—, —N($R^2$)C(=O)O—, —OC(=O)N($R^2$)—, N($R^2$)C(=O)N($R^3$)—, —N($R^2$)$SO_2$—, —$SO_2$N($R^2$)—, or —$SO_2$—; $R^2$ and $R^3$ are each independently a hydrogen atom or an alkyl group; $L^2$ is an alkylene group or an arylene group; n is from 1 to 3; m is from 0 to 1; when n is 2 or greater, $L^1$'s may be the same or different, and $A^1$'s may be the same or different; $R^1$ represents a hydrogen atom, an alkyl group or an aryl group; M is Zn, Mg, Si, Sn, Rh, Pt, Pd, Mo, Mn, Pb, Cu, Ni, Co, Fe, or VO.

The phthalocyanine colorant is more preferably a compound in which $L^1$ is an alkylene group; $A^1$ is —O—, —OC(=O)—, —C(=O)O—, —N(R²)C(=O)—, —C(=O)N(R²)—, —N(R²)C(=O)O—, —OC(=O)N(R²)—, N(R²)C(=O)N(R³)—, —N(R²)SO₂—, —SO₂N(R²)—, or —SO₂—; $R^2$ and $R^3$ are each independently a hydrogen atom or an alkyl group; n is from 1 to 3; when n is 2 or greater, $L^1$s may be the same or different, and $A^1$s may be the same or different; m is 0; $R^1$ is an alkyl group or an aryl group; and M is Zn, Pd, Cu, Ni, Co, or VO.

The phthalocyanine colorant is still more preferably a compound in which $L^1$ is an alkylene group; $A^1$ is —O—, —OC(=O)—, —C(=O)O—, —N(R²)C(=O)—, —C(=O)N(R²)—, —N(R²)C(=O)N(R³)—, —N(R²)SO₂—, —SO₂N(R²)—, or —SO₂—; $R^2$ and $R^3$ are each independently a hydrogen atom or an alkyl group; n is from 1 to 3; when n is 2 or greater, $L^1$s may be the same or different and $A^1$s may be the same or different; m is 0; $R^1$ is an alkyl group or an aryl group; and M is Zn, Cu, Ni, Co, or VO.

The phthalocyanine colorant is further more preferably a compound in which $L^1$ is an alkylene group; $A^1$ is —OC(=O)—, —C(=O)O—, —N(R²)C(=O)—, —C(=O)N(R²)—, —N(R²)C(=O)N(R³)—, —N(R²)SO₂—, —SO₂N(R²)—, or —SO₂—; $R^2$ and $R^3$ are each independently a hydrogen atom or an alkyl group; n is from 1 to 3; when n is 2 or greater, $L^1$s may be the same or different and $A^1$s may be the same or different; m is 0; $R^1$ is an alkyl group or an aryl group; and M is Zn, Cu, Ni, Co, or VO.

The phthalocyanine colorant is particularly preferably a compound in which $L^1$ is an alkylene group; $A^1$ is —OC(=O)—, —C(=O)O—, —N(R²)C(=O)—, —C(=O)N(R²)—, —N(R²)C(=O)N(R³)—, —N(R²)SO₂—, —SO₂N(R²)—, or —SO₂—; $R^2$ and $R^3$ are each independently an alkyl group; n is from 1 to 3; when n is 2 or greater, $L^1$s may be the same or different and $A^1$s may be the same or different; $R^1$ is an alkyl group; and M is Zn or Cu.

The phthalocyanine colorant represented by formula (III) is most preferably a compound in which $L^1$ is an alkylene group; $A^1$ is —OC(=O)—, —C(=O)O—, —N(R²)C(=O)—, —C(=O)N(R²)—, —N(R²)C(=O)N(R³)—, —N(R²)SO₂—, —SO₂N(R²)—, or —SO₂—; $R^2$ and $R^3$ are each independently an alkyl group; n is from 1 to 3; when n is 2 or greater, $L^1$s may be the same or different and $A^1$s may be the same or different; $R^1$ is an alkyl group; and M is Cu.

Compound examples of colorants according to the invention (illustrative colorants C-1' to C-50') are shown below; however, the invention is by no means limited by the compound examples.

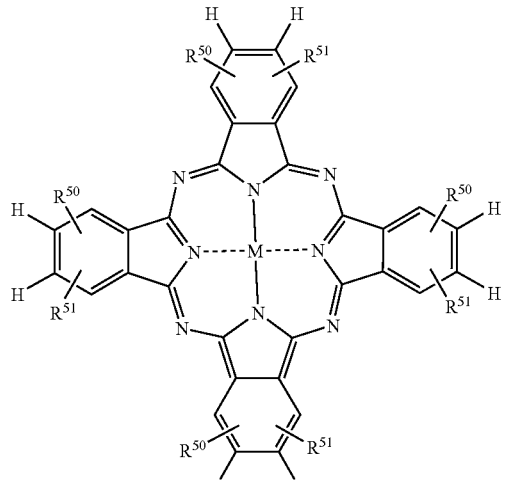

| Illustrative Colorants | $R^{50}$ | $R^{51}$ | M |
|---|---|---|---|
| C-1' | T-10 | —H | Cu |
| C-2' | T-11 | —H | Cu |
| C-3' | T-23 | —H | Cu |
| C-4' | T-25 | —H | Cu |
| C-5' | T-28 | —H | Cu |
| C-6' | T-32 | —H | Cu |
| C-7' | T-33 | —H | Cu |
| C-8' | T-39 | —H | Cu |
| C-9' | T-48 | —H | Cu |
| C-10' | T-51 | —H | Cu |
| C-11' | T-63 | —H | Cu |
| C-12' | T-70 | —H | Cu |
| C-13' | T-88 | —H | Cu |
| C-14' | T-90 | —H | Cu |
| C-15' | T-3 | T-3 | Cu |
| C-16' | T-9 | T-9 | Cu |
| C-17' | T-10 | T-10 | Cu |
| C-18' | T-14 | T-14 | Cu |
| C-19' | T-10 | —H | Zn |
| C-20' | T-11 | —H | Zn |
| C-21' | T-10 | —H | VO |
| C-22' | T-10 | —H | Co |
| C-22' | T-25 | —H | Zn |
| C-23' | T-10 | —H | Pd |
| C-24' | T-11 | —H | VO |
| C-25' | T-46 | —H | Cu |

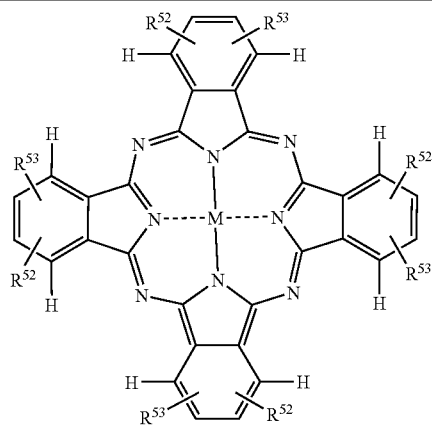

| Illustrative Colorants | $R^{52}$ | $R^{53}$ | M |
|---|---|---|---|
| C-26' | T-4 | —H | Cu |
| C-27' | T-8 | —H | Cu |
| C-28' | T-9 | —H | Cu |

| | | | |
|---|---|---|---|
| C-29' | T-10 | —H | Cu |
| C-30' | T-11 | —H | Cu |
| C-31' | T-18 | —H | Cu |
| C-32' | T-25 | —H | Cu |
| C-33' | T-28 | —H | Cu |
| C-34' | T-32 | —H | Cu |
| C-35' | T-39 | —H | Cu |
| C-36' | T-46 | —H | Cu |
| C-37' | T-51 | —H | Cu |
| C-38' | T-59 | —H | Cu |
| C-39' | T-86 | —H | Cu |
| C-40' | T-3 | T-3 | Cu |
| | | | |
|---|---|---|---|
| C-41' | T-9 | T-9 | Cu |
| C-42' | T-10 | T-10 | Cu |
| C-43' | T-14 | T-14 | Cu |
| C-44' | T-10 | —H | Zn |
| C-45' | T-11 | —H | Zn |
| C-46' | T-10 | —H | VO |
| C-47' | T-10 | —H | Co |
| C-48' | T-25 | —H | Zn |
| C-49' | T-10 | —H | Pd |
| C-50' | T-11 | —H | VO |
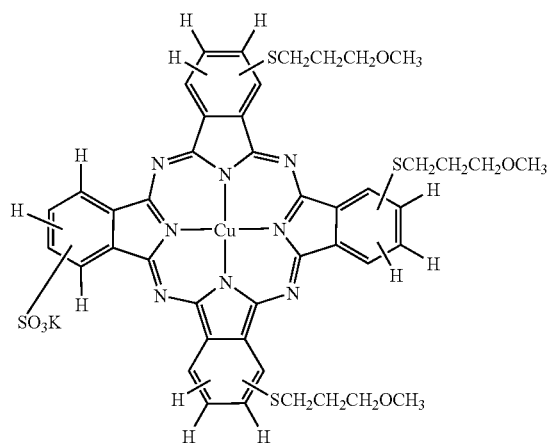
C-51'
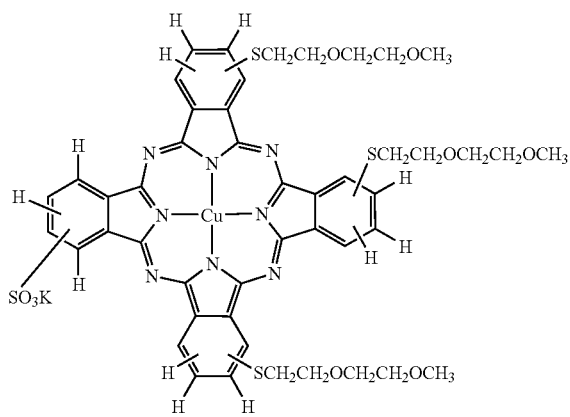
C-52'
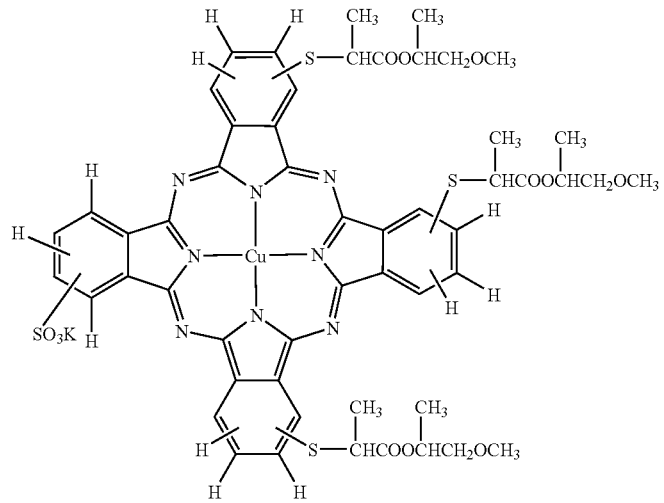
C-53'

-continued
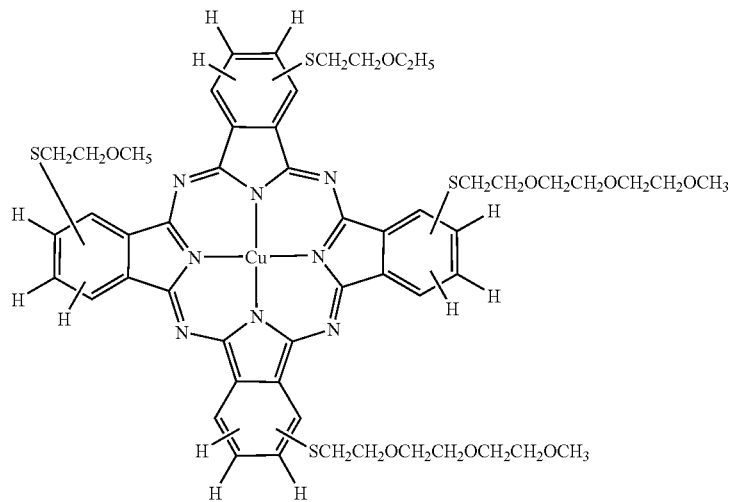
C-54′
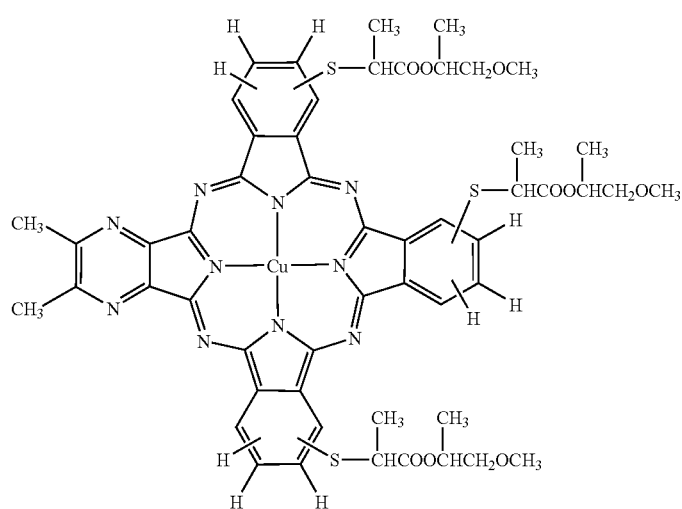
C-55′
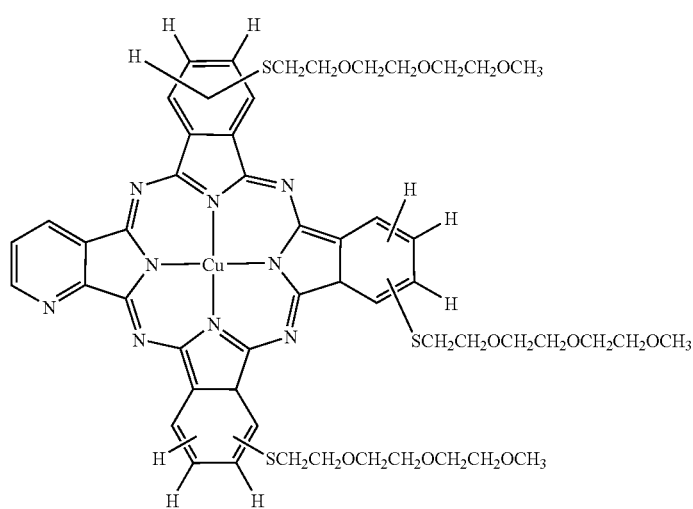
C-56′

Next, a general method for synthesizing the second colorant in the invention will be described. The second colorant in the invention can be obtained by heating one to four kinds of the compounds represented by Formula (IV) or (V) below (at least one kind having a substituent represented by Formula (I)) and a metal compound represented by Formula (VI) below under the presence of a base (e.g., 1,8-diazabicyclo[5,4,0]-7-undecen(DBU)), an ammonium salt (e.g., ammonium acetate, ammonium carbonate or ammonium phosphate) or the like in a solvent of an alcohol, halogenated hydrocarbon, hydrocarbon, quinoline, alkylamineurea or the like at a temperature of 70° C. to 200° C.

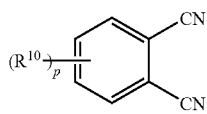

Formula (IV)

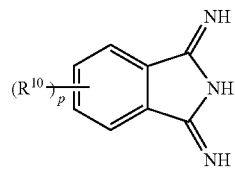

Formula (V)

$M{-}(Y)_t$

Formula (VI)

In Formulae (IV) to (VI) above, $R^{10}$, p and M have the same meaning as in Formula (II) above. Y represents a group capable of coordination, and t denotes an integer from 1 to 4. Examples of the above-mentioned group capable of coordination include halogen atoms, acetate anions, acetylacetonato, and mono- or divalent ligands of oxygen and the like.

Synthesis Examples

Synthesis of Illustrative Colorant C-2'

Illustrative colorant C-2' of the invention was synthesized according to Reaction Scheme A below.

Reaction Scheme A

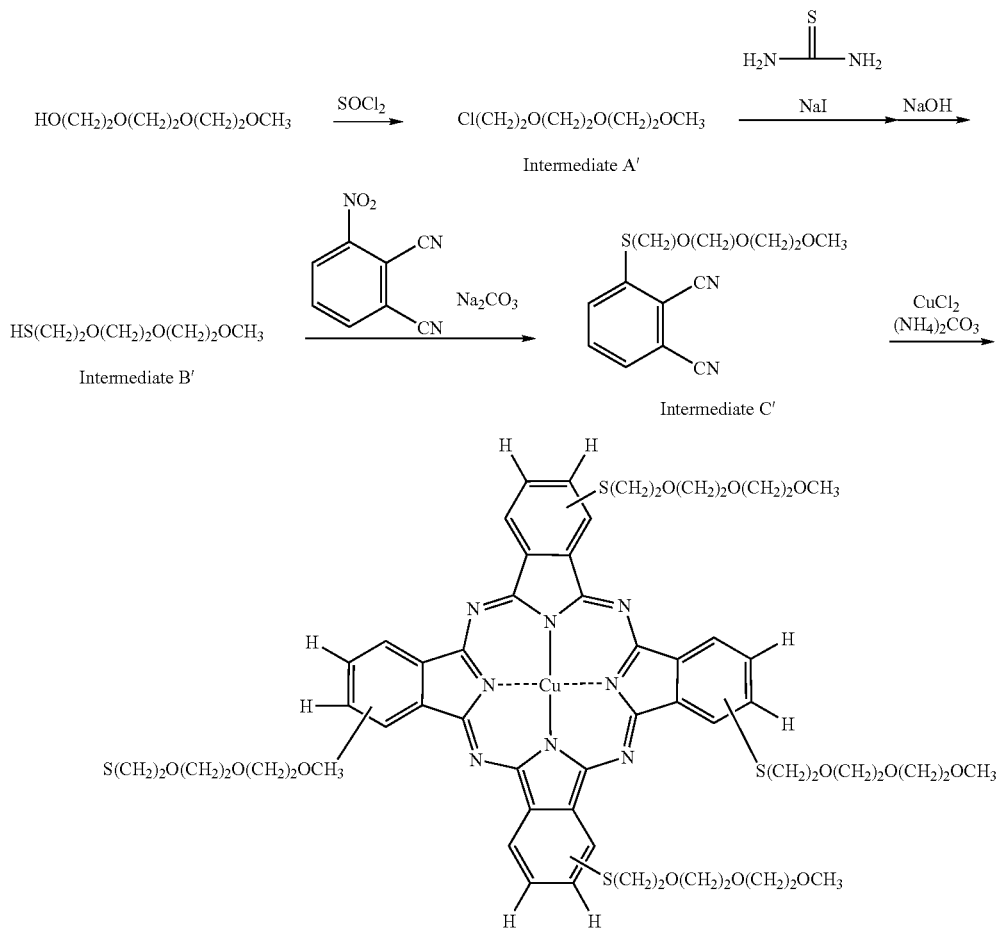

Illustrative Colorant C-2'

Synthesis of Intermediate A'

10 ml of pyridine was added to 138 g (0.84 mol) of methoxyethoxyethoxyethanol and the resultant mixture was agitated at room temperature. To this liquid, 73 ml of thionyl chloride was added dropwise. After the completion of dropwise addition, the resultant mixture was heated to a temperature in the range of from 80 to 85° C. to be allowed to react for 2 hours. This reaction solution was cooled to room temperature and then 500 ml of water was poured thereto. Thereafter, 500 ml of ethyl acetate was added to the resultant mixture. Sodium bicarbonate was added to this solution to set the pH of the solution to 8, and then the liquid phases were separated to remove the water phase. The remaining ethyl acetate solution was dried with magnesium sulfate, and was concentrated under reduced pressure. In this manner, Intermediate A' was quantitatively obtained.

Synthesis of Intermediate B'

100 ml of 2-propanol was added to 30 g (0.38 mol) of thiourea, 84 g of Intermediate A' obtained by the above-described method and 30 g of sodium iodide, and the resultant mixture was heated under reflux for 20 hours. After completion of the reaction, an aqueous solution prepared by dissolution of 55.2 g of sodium hydroxide in 200 ml of water was dropwise added to the reaction solution with nitrogen gas blow in the reaction solution. After the completion of dropwise addition, the resultant solution was agitated at room temperature for 2 hours. Then concentrated hydrochloric acid was dropwise added to this solution to set the pH of the solution to a range of 6 to 5. 200 ml of ethyl acetate was added to this solution, and the product was extracted. The resultant ethyl acetate solution was washed with water and dried with magnesium sulfate. Then ethyl acetate was distilled off under reduced pressure to obtain 31 g of oily Intermediate B' (yield: 45.3%).

Synthesis of Intermediate C'

To 40 g (0.231 mol) of 3-nitrophthalonitrile and 36.7 g (0.437 mol) of sodium carbonate, 120 ml of dimethylsulfoxide was added and the resultant mixture was agitated at room temperature. 50 g (0.277 mol) of Intermediate B' obtained by the above-described method was dropwise added to the resultant solution. After the completion of dropwise addition, the resultant mixture was agitated at room temperature for 3 hours, and was then poured into 1500 ml of water, so that a crystal was deposited. This crystal was filtrated off and washed with water. This crystal was heated in 300 ml of methanol and was dissolved therein. Thereafter, 600 ml of water was dropwise added to the resultant solution while the solution was agitated. The deposited crystal was filtered off and dried to obtain 48.8 g of Intermediate C' (yield: 68.9%).

Synthesis of Illustrative Colorant C-2'

7.8 g of ammonium carbonate and 130 ml of n-butanol were added to 50 g (0.163 mol) of Intermediate C' obtained by the above-described method. The resultant mixture was heated to 50° C. 8.5 g of cupric chloride was added to the resultant solution. After the completion of addition, the resultant mixture was heated and agitated at a temperature of from 90° C. to 100° C. for 4 hours. Then n-butanol was distilled off at atmospheric pressure. 200 ml of toluene was added to the residue, and the resultant mixture was heated to a temperature in the range of from 100° C. to 110° C. and was agitated for 3 hours. After the completion of reaction, toluene was distilled off under reduced pressure. 200 ml of chloroform was added to the residue, and the residue was dissolved therein. This chloroform solution was washed twice with a 10% aqueous hydrochloric acid solution, and was then washed with saturated aqueous sodium chloride. This chloroform solution was dried with magnesium sulfate, and chloroform was then distilled off under reduced pressure. The residue product was separated and purified by column chromatography (eluent: chloroform/methanol=20/1) to obtain 27.7 g (yield: 52.7%) of Illustrative Colorant C-2' in an amorphous state. Illustrative Colorant C-2' in ethyl acetate solvent showed λmax=657 nm and a maximum absorption coefficient of 45400.

Synthesis of Illustrative Colorant C-32'

Illustrative Colorant C-32' was synthesized in accordance with Reaction Scheme B below.

Reaction Scheme B

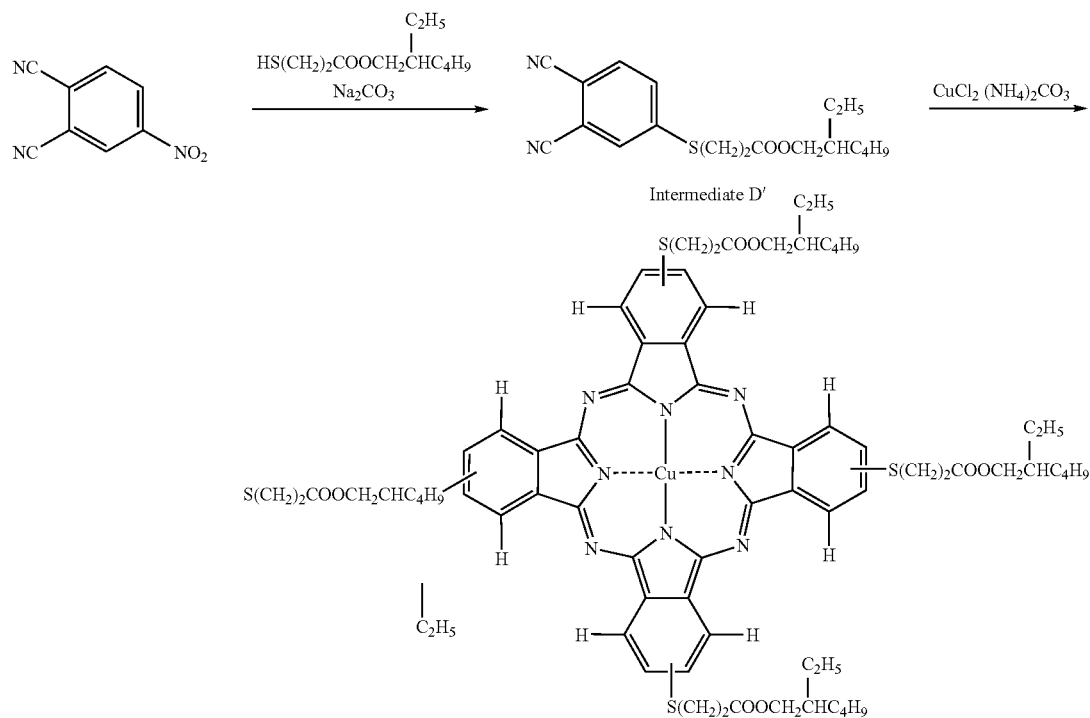

Illustrative Colorant C-32'

Synthesis of Intermediate D'

To 25.0 g (0.144 mol) of 3-nitrophthalonitrile and 34.7 g (0.159 mol) of 2-ethylhexyl β-mercaptopropionate ester, 100 ml of dimethylsulfoxide was added. The resultant mixture was agitated at room temperature. To the resultant solution, 17.0 g of sodium carbonate was added little by little. After completion of the addition, the resultant mixture was agitated at room temperature for 2 hours, so that the reaction completed. After completion of the reaction, 200 ml of ethyl acetate and 500 ml of water were added to the resultant reaction solution, and the product was extracted. The resultant ethyl acetate solution was washed with an aqueous sodium chloride solution, and was dried with magnesium sulfate. Then ethyl acetate was distilled off under reduced pressure. In this manner, oily Intermediate D' was quantitatively obtained.

Synthesis of Illustrative Colorant C-32'

To 6.89 g (0.02 mol) of Intermediate D' obtained by the above-described method and 1.0 g of ammonium carbonate, 30 ml of n-butanol was added. The resultant mixture was heated to 50° C. and was agitated. 0.81 g of cupric chloride was added to the resultant solution, and the resultant mixture was heated to a temperature in the range of from 95° C. to 100° C., and was agitated. While the mixture was heated and agitated for one hour, n-butanol was distilled off at atmospheric pressure. 50 ml of n-butanol was added to the residue, and the resultant mixture was agitated at a temperature of 100° C. to 110° C. for 4 hours. After completion of the reaction, the resultant reaction solution was cooled to room temperature. Then 300 ml of methanol was added to the reaction solution, and the solid material deposited was filtrated off. This solid material was dissolved in chloroform and then was separated and purified by column chromatography (eluent: chloroform) to obtain 4.5 g (yield: 62.4%) of Illustrative Colorant C-32' in an amorphous state. Illustrative Colorant C-32' in ethyl acetate solvent showed λmax=625.5 nm and a maximum absorption coefficient of 56000.

Synthesis of Illustrative Colorant C-48'

Illustrative Colorant C-48' was synthesized by the same method as the method of synthesizing Illustrative Colorant C-32' except that $CuCl_2$ was replaced by $ZnCl_2$ in an equimolar amount to $CuCl_2$. Illustrative Colorant C-48' in ethyl acetate solvent showed λmax=626 nm and a maximum absorption coefficient of 52600.

A tetraazaporphyrin colorant according to the invention (preferably, a phthalocyanine colorant represented by Formulae (II) and (III)) is used as a colorant in a colored curable composition according to the invention.

The concentration of the second colorant according to the invention in a colored curable composition varies depending on the molecular weight and molar light absorption coefficient of the colorant. The ratio of the second colorant to the total solids in the composition is preferably from 0.5 to 80 mass %, more preferably from 0.5 to 60 mass %, most preferably from 0.5 to 50 mass %.

Binder

The colored curable composition according to the invention may contain at least one binder. As the binder in the invention, it is preferable to select a binder that is alkali-soluble, excellent in heat resistance and developability, and easily available.

The alkali-soluble binder is preferably a linear organic macromolecular polymer that is soluble in an organic solvent and can be developed in a weakly alkaline aqueous solution. Examples of such a linear organic macromolecular polymer include polymers having carboxylic acid in a side chain thereof, such as methacrylic acid copolymers, acrylic acid copolymers, itaconic acid copolymers, crotonic acid copolymers, maleic acid copolymers, partially esterified maleic acid copolymers, such as those described in JP-A No. 59-44615, JP-B Nos. 54-34327, 58-12577 and 54-25957, JP-A Nos. 59-53836 and 59-71048, etc. In particular, acidic cellulose derivatives having carboxylic acid in a side chain thereof are useful. Moreover, products obtained by addition of an acid anhydride to a polymer having a hydroxyl group, and polyhydroxystyrene resin, polysiloxane resin, poly(2-hydroxyethyl (meth)acrylate), polyvinylpyrrolidone, polyethylene oxide, polyvinyl alcohol, and the like are also useful.

The binder may be a copolymer containing a monomer having a hydrophilic group. Examples of such a copolymer include copolymers containing, as a copolymerization component, an alkoxyalkyl (meth)acrylate, a hydroxyalkyl (meth)acrylate, glycerol (meth)acrylate, (meth)acrylamide, N-methylolacrylamide, a secondary or tertiary alkylacrylamide, a dialkylaminoalkyl (meth)acrylate, morphorino (meth)acrylate, N-vinylpyrroridone, N-vinylcaprolactam, vinylimidazole, vinyltriazole, methyl (meth)acrylate, ethyl (meth)acrylate, a branched or straight-chained propyl (meth)acrylate, a branched or straight-chained butyl (meth)acrylate, phenoxyhydroxypropyl (meth)acrylate, or the like.

Furthermore, as a monomer having a hydrophilic group, monomers containing, for example, a tetrahydrofurfuryl group, a phosphoric acid portion, a phosphate ester portion, a quaternary ammonium salt portion, an ethyleneoxy chain, a propyleneoxy chain, a portion of sulfonic acid or a salt thereof, and/or a morphonylethyl group, and the like are useful.

In order to improve the crosslinking efficiency, the binder may have a polymerizable group in a side chain. Polymer having, in a side chain, an allyl group, a (meth)acryl group, an allyloxyalkyl group or the like are also useful. Examples of polymers having such a polymerizable group include KS Resist-106 (manufactured by Osaka Organic Chemical Industry Ltd.) and Cyclomer P series (manufactured by Daicel Chemical Industries, Ltd.).

Further, an alcohol-soluble nylon and/or a polyether of 2,2-bis(4-hyroxyphenyl)-propane and epichlorohydrin, and the like are also useful as the binder in view of increase in the strength of a cured coated film.

Of the above-mentioned various binders, a polyhydroxystyrene resin, polysiloxane resin, acrylic resin, acrylamide resin, or acryl/acrylamide copolymer resin is preferable in terms of heat resistance, and an acrylic resin, acrylamide resin, or acryl/acrylamide copolymer resin is preferable in terms of the control of developability. As the above-mentioned acrylic resins, a copolymer of monomers selected from benzyl (meth)acrylate, (meth)acryl, hydroxyethyl (meth)acrylate, (meth)acrylamide, and the like, and KS Resist-106 (manufactured by Osaka Organic Chemical Industry Ltd.), Cyclomer P series (manufactured by Daicel Chemical Industries, Ltd.), and the like are preferable.

Furthermore, as a binder in the invention, an alkali-soluble phenol resin can be used. The alkali-soluble phenol resin can be suitably used when the colored curable composition according to the invention is a positive type, and examples thereof include novolac resins and vinyl polymers The above-mentioned novolac resin may be, for example, a resin obtained by the condensation of a phenol and an aldehyde under the presence of an acid. Examples of the phenol include phenol, cresol, ethylphenol, butylphenol, xylenol, phenylphenol, catechol, resorcinol, pyrogallol, naphthol, and bisphenol A. Only one phenol compound may be used, or a combination of two or more phenol compounds may be used.

Examples of the aldehyde include formaldehyde, paraformaldehyde, acetaldehyde, propionaldehyde, and benzaldehyde.

Only one aldehyde compound may be used, or a combination of two or more aldehyde compounds may be used.

Specific examples of the novolac resins include metacresol, paracresol, or condensation products of a mixture thereof with formalin.

The molecular weight distribution of the novolac resin may be adjusted by use of means such as fractionation. A low molecular weight component having a phenolhydroxide group, such as bisphenol C or bisphenol A, may be mixed with the above-mentioned novolac resin.

The above-mentioned binder is preferably a polymer having a weight average molecular weight (value in terms of polystyrene determined by the GPC method) of 1000 to $2 \times 10^5$, more preferably 2000 to $1 \times 10^5$, particularly preferably 5000 to $5 \times 10^4$.

The content of binder in a colored curable composition according to the invention (amount of binder relative to the amount of total solids in the composition) is preferably from 10 to 90 mass %, more preferably from 20 to 80 mass %, still more preferably from 30 to 70 mass %, from the viewpoints of developability and curability of a coated film.

Crosslinking Agent

According to the first aspect of the invention, curing reaction proceeds to a high level compared to conventional techniques, so that a well-cured film that contains a compound (dye) represented by Formula (C1) described above can be obtained. In the first and fourth aspects, a crosslinking agent may be additionally contained so as to provide a film with a higher curing level. It is useful that the colored curable composition according to the invention contains a crosslinking agent from the viewpoint of achieving higher resolution of the composition.

In the invention, usable crosslinking agents cure a film through crosslinking reaction. Examples thereof include (a) an epoxy resin; (b) a melamine compound, guanamine compound, glycoluril compound or urea compound having at least one substituent selected from a methylol group, an alkoxymethyl group or an acyloxymethyl group; and (c) a phenol compound, naphthol compound or hydroxyanthracene compound having at least one substituent selected from a methylol group, an alkoxymethyl group or an acyloxymethyl group. Preferable one is a polyfunctional epoxy resin.

The epoxy resin (a) may be any epoxy resin as long as the resin has an epoxy group and crosslinking property. Examples thereof include bivalent glycidyl-group-containing low molecular weight compounds such as bisphenol A glycidyl ether, ethylene glycol diglycidyl ether, butanediol diglycidyl ether, hexanediol diglycidyl ether, dihydroxybiphenyl diglycidyl ether, diglycidyl ester phthalate, and N,N-diglycidylaniline; trivalent glycidyl-group-containing low molecular weight compounds such as trimethylolpropane triglycidyl ether, trimethylolphenol triglycidyl ether, and Tris P-PA triglycidyl ether; tetravalent glycidyl-group-containing low molecular weight compounds such as pentaerythritol tetraglycidyl ether and tetramethylol bisphenol A tetraglycidyl ether; polyvalent glycidyl-group-containing low molecular weight compounds such as dipentaerythritol pentaglycidyl ether and dipentaerythritol hexaglycidyl ether; and glycidyl-group-containing macromolecular compounds such as polyglycidyl (meth)acrylate, a 1,2-epoxy-4-(2-oxiranyl)cyclohexane adduct of 2,2-bis(hydroxymethyl)-1-butanol.

The number of methylol, alkoxymethyl, and acyloxymethyl groups contained as substituents in the crosslinking agent (b) is from 2 to 6 when it is a melamine compound, and is from 2 to 4 when it is a glycoluril, guanamine, or urea compound, but is preferably from 5 to 6 when it is a melamine compound, and is preferably from 3 to 4 when it is a glycoluril, guanamine, or urea compound.

Hereinafter, the melamine compound, guanamine compound, glycoluril compound and urea compound described in item (b) above is collectively referred to as compounds of item (b) (methylol group-containing compounds, alkoxymethyl group-containing compounds, or acyloxymethyl group-containing compounds) in some cases.

The methylol group-containing compound of item (b) can be prepared by heating an alkoxymethyl group-containing compound of item (b) in alcohol in the presence of an acid catalyst such as hydrochloric acid, sulfuric acid, nitric acid, or methanesulfonic acid. The acyloxymethyl group-containing compound of item (b) can be prepared by mixing and stirring a methylol group-containing compound of item (b) with an acyl chloride in the presence of a basic catalyst.

Hereinafter, specific examples of the compounds of item (b) having substituents as described above will be listed.

Examples of the melamine compounds include hexamethylolmelamine, hexamethoxymethylmelamine, compounds obtained by methoxymethylating 1 to 5 methylol groups of hexamethylolmelamine and mixtures thereof, hexamethoxyethylmelamine, hexacyloxymethylmelamine, and compounds obtained by acyloxymethylating 1 to 5 methylol groups of hexamethylolmelamine and mixtures thereof.

Examples of the guanamine compounds include tetramethylolguanamine. tetramethoxymethylguanamine, compounds obtained by methoxymethylating 1 to 3 methylol groups of tetramethylolguanamine and mixtures thereof, tetramethoxyethylguanamine, tetraacyloxymethylguanamine, compounds obtained by acyloxymethylating 1 to 3 methylol groups of tetramethylolguanamine and mixtures thereof.

Examples of the glycoluril compounds include tetramethylol glycoluril, tetramethoxymethyl glycoluril, compounds obtained by methoxymethylating 1 to 3 methylol groups of tetramethylol glycoluril and mixtures thereof, and compounds obtained by acyloxymethylating 1 to 3 methylol groups of tetramethylol glycoluril and mixtures thereof.

Examples of the urea compounds include tetramethylolurea, tetramethoxymethylurea, compounds obtained by methoxymethylating 1 to 3 methylol groups of tetramethylolurea and mixtures thereof, and tetramethoxyethylurea.

Only one compound of item (b) may be used, or a plurality of compounds of item (b) may be used in combination.

The crosslinking agent (c), i.e., the phenol, naphthol, or hydroxyanthracene compound substituted by at least one group selected from methylol, alkoxymethyl, and acyloxymethyl groups, prevents intermixing with the topcoat photoresist and improves the strength of the film further by thermal crosslinking in a similar manner to the crosslinking agent (b) above.

Hereinafter, these compounds may be referred to collectively as compounds of item (c) (methylol group-containing compounds, alkoxymethyl group-containing compounds, and acyloxymethyl group-containing compounds).

The number of the methylol, acyloxymethyl, and alkoxymethyl groups contained in the crosslinking agent (c) is at least two per molecule, and compounds having a skeletal phenol compound substituted at all 2- and 4-sites are preferable, from the viewpoints of thermal crosslinking property and storage stability. In addition, the skeletal naphthol or hydroxyanthracene compound is also preferably a compound that is substituted at all ortho- and para-positions relative to the OH group. The 3- or 5-position of the skeletal phenol compound may be unsubstituted or may have a substituent. In the skeletal naphthol compound, the positions other than ortho-positions relative to the OH group may be unsubstituted or may have a substituent.

The methylol group-containing compound of item (c) can be prepared by allowing a compound having a hydrogen atom at the ortho- or para-positions (2- or 4-site) to the phenolic OH group as raw material to react with formalin in the presence of a basic catalyst such as sodium hydroxide, potassium hydroxide, ammonia, or a tetraalkylammonium hydroxide.

The alkoxymethyl group-containing compound of item (c) can be prepared by heating a methylol group-containing compound of item (c) in alcohol in the presence of an acid catalyst such as hydrochloric acid, sulfuric acid, nitric acid, or methanesulfonic acid.

The acyloxymethyl group-containing compound of item (c) can be prepared by reacting the methylol group-containing compound of item (c) with an acyl chloride in the presence of a basic catalyst.

Examples of the skeletal compounds for the crosslinking agent (c) include a phenol, naphthol, and hydroxyanthracene compound whose ortho- and para-positions relative to the phenolic OH group are not substituted, and specific examples thereof for use include phenol, respective isomers of cresol, 2,3-xylenol, 2,5-xylenol, 3,4-xylenol, 3,5-xylenol, bisphenols such as bisphenol A, 4,4'-bishydroxybiphenyl, Tris P-PA (manufactured by Honshu Chemical Industry Co., Ltd.), naphthol, dihydroxynaphthalene, and/or 2,7-dihydroxyanthracene.

Specific examples of the crosslinking agent (c) include trimethylol phenol, tri(methoxymethyl)phenol, compounds obtained by methoxymethylating 1 or 2 methylol groups of trimethylol phenol, trimethylol-3-cresol, tri(methoxymethyl)-3-cresol, compounds obtained by methoxymethylating 1 or 2 methylol groups of trimethylol-3-cresol, dimethylol cresol such as 2,6-dimethylol-4-cresol, tetramethylol bisphenol A, tetramethoxymethylbisphenol A, compounds obtained by methoxymethylating 1 to 3 methylol groups of tetramethylol bisphenol A, tetramethylol-4,4'-bishydroxybiphenyl, tetramethoxymethyl-4,4'-bishydroxybiphenyl, Tris P-PA in form of hexamethylol, hexamethoxymethylated Tris P-PA, compounds obtained by methoxymethylating 1 to 5 methylol groups of hexamethylol body of Tris P-PA, and bishydroxymethylnaphthalenediol.

Further examples include hydroxyanthracene compounds such as 1,6-dihydroxymethyl-2,7-dihydroxyanthracene, and acyloxymethyl-containing compounds such as compounds obtained by acyloxymethylating some or all of the methylol groups of the above-mentioned methylol-containing compounds.

Preferable examples of those compounds include trimethylol phenol, bishydroxymethyl-p-cresol, tetramethylol bisphenol A, hexamethylol body of Tris P-PA (manufactured by Honshu Kagaku Kogyo Co., Ltd.), or phenol compounds obtained by substituting methylol groups of these compounds with alkoxymethyl groups or with methylol group(s) and alkoxymethyl group(s).

Only one compound of item (c) may be used, or a plurality of compounds of item (c) may be used in combination.

When the colored curable composition according to the invention contains a crosslinking agent, the total content of the crosslinking agents (a) to (c) in the colored curable composition (the ratio of the mass of the crosslinking agents to the mass of the solids in the composition) may vary according to the raw materials used, but is preferably from 1 to 70 mass %, more preferably from 5 to 50 mass %, and particularly preferably from 7 to 30 mass %. In the invention, the crosslinking agent is not necessarily contained.

Polymerizable Monomers

The colored curable composition of the invention preferably contains at least one polymerizable monomer. The polymerizable monomer is contained primarily in a negative type colored curable composition. The positive type composition containing a naphthoquinonediazido compound mentioned later may contain a polymerizable monomer in combination with a photopolymerization initiator described later. In this case, the degree of cure of the pattern formed can be further heightened.

This polymerizable monomer is useful in that the sensitivity and resolution of the colored curable composition according to the invention can be improved when the polymerizable monomer is used in combination with a photopolymerization initiator described later. The polymerizable monomer will be described hereinafter.

The polymerizable monomer is preferably a compound having at least one addition-polymerizable ethylenical unsaturated double bond and having a boiling point of 100° C. or higher under normal pressure. Examples thereof include: monofunctional acrylates and methacrylates, such as polyethylene glycol mono(meth)acrylate, polypropylene glycol mono(meth)acrylate and phenoxyethyl (meth)acrylate; and polyfunctional acrylates or methacrylates such as polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol (meth)acrylate, trimethylolpropane tri(acryloyloxypropyl)ether, tri(acryloyloxyethyl)isocyanurate, a product obtained by adding ethylene oxide or propylene oxide to a polyfunctional alcohol such as glycerin or trimethylolethane and then subjecting the obtained intermediate to (meth)acrylation, urethane acrylates as described JP-B Nos. 48-41708 and 50-6034, and JP-A No. 51-37193, polyester acrylates described in JP-A No. 48-64183, and JP-B Nos. 49-43191 and 52-30490, epoxy acrylates, which are products of reaction between an epoxy resin and (meth) acrylic acid, and mixtures thereof. Other examples include those described as photocurable monomers and oligomers in Journal of the Adhesion Society of Japan, Vol. 20, No. 7, pp. 300-308.

The total content of the polymerizable monomers in the colored curable composition (the ratio of the mass of the polymerizable monomers relative to the mass of the solids in the composition) is preferably from 0.1 to 90 mass %, more preferably from 1.0 to 80 mass %, particularly preferably from 2.0 to 70 mass % from the viewpoint of obtaining good curability of the coated film.

Radiation-Sensitive Compounds

The colored curable composition of the invention preferably contains at least one radiation-sensitive compound. The radiation-sensitive compound according to the invention is a compound that can cause a chemical reaction generating a radical, acid, and/or base upon irradiation of radiation such as UV, Deep UV, visible light, infrared light, or electron beams. The radiation-sensitive compound is used so as to insolubilize the binder by reaction such as crosslinking, polymerization and decomposition of an acidic group, and so as to insolubilize the coated film against an alkaline developer by causing of polymerization of a polymerizable monomer or oligomer that is also contained in the coated film, crosslinking of a crosslinking agent, or the like.

This radiation-sensitive compound is useful in achieving higher sensitivity and high resolution of the colored curable composition according to the invention.

When the colored curable composition preferably contains a photopolymerization initiator when it is of negative type, and preferably contains a naphthoquinonediazide compound when it is of positive type.

Photopolymerization Initiators, Etc.

First, a photopolymerization initiator that is used when the colored curable composition according to the invention is a negative type composition will be described. The photopolymerization initiator can polymerize the above-described polymerizable monomer (monomer having a polymerizable group), and is preferably selected from the viewpoints of characteristics, initiation efficiency, absorption wavelength, availability, cost, etc. In addition, a photopolymerization initiator may be contained in a positive type composition containing a naphthoquinonediadide compound. In this case, the degree of cure of the pattern formed can be further heightened.

Examples of the photopolymerization initiator include: at least one active halogen compound selected from halomethyloxadiazole compounds and halomethyl-s-triazine compounds; a 3-aryl-substituted coumalin compound or a lophine dimer; a benzophenone compound; an acetophenone compound or a derivative thereof; a cyclopentadiene-benzene-iron complex or a salt thereof; and oxime compounds.

Examples of the halomethyloxadiazole compound include 2-halomethyl-5-vinyl-1,3,4-oxadiazole compounds described in Japanese Patent Publication (JP-B) No. 57-6096, 2-trichloromethyl-5-styryl-1,3,4-oxadiazole, 2-trichloromethyl-5-(p-cyanostyryl)-1,3,4-oxadiazole, and 2-trichloromethyl-5-(p-methoxystyryl)-1,3,4-oxadiazole.

Examples of the halomethyl-s-triazine compound include vinyl-halomethyl-s-triazine compounds described in JP-B No. 59-1281, and 2-(naphtho-1-yl)-4,6-bis-halomethyl-s-triazine compounds and 4-(p-aminophenyl)-2,6-di-halomethyl-s-triazine compounds described in JP-A No. 53-133428.

Other specific examples include
2,4-bis(trichloromethyl)-6-p-methoxystyryl-s-triazine,
2,6-bis(trichloromethyl)-4-(3,4-methylenedioxyphenyl)-1,3,5-triazine,
2,6-bis(trichloromethyl)-4-(4-methoxyphenyl)-1,3,5-triazine,
2,4-bis(trichloromethyl)-6-(1-p-dimethylaminophenyl-1,3-butadienyl)-s-triazine,
2-trichloromethyl-4-amino-6-p-methoxystyryl-s-triazine,
2-(naphtho-1-yl)-4,6-bis-trichloromethyl-s-triazine,
2-(4-methoxy-naphtho-1-yl)-4,6-bis(trichloromethyl-s-triazine),
2-(4-ethoxy-naphtho-1-yl)-4,6-bis-trichloromethyl-s-triazine,
2-(4-butoxy-naphtho-1-yl)-4,6-bis-trichloromethyl-s-triazine,
2-[4-(2-methoxyethyl)-naphtho-1-yl]-4,6-bis-trichloromethyl-s-triazine,
2-[4-(2-ethoxyethyl)-naphtho-1-yl]-4,6-bis-trichloromethyl-s-triazine,
2-[4-(2-butoxyethyl)-naphtho-1-yl]-4,6-bis-trichloromethyl-s-triazine,
2-(2-methoxy-naphtho-1-yl)-4,6-bis-trichloromethyl-s-triazine,
2-(6-methoxy-5-methyl-naphtho-2-yl)-4,6-bis-trichloromethyl-s-triazine,
2-(6-methoxy-naphtho-1-yl)-4,6-bis-trichloromethyl-s-triazine,
2-(5-methoxy-naphtho-1-yl)-4,6-bis-trichloromethyl-s-triazine,
2-(4,7-dimethoxy-naphtho-1-yl)-4,6-bis-trichloromethyl-s-triazine,
2-(6-ethoxy-naphtho-2-yl)-4,6-bis-trichloromethyl-s-triazine,
2-(4,5-dimethoxy-naphtho-1-yl)-4,6-bis-trichloromethyl-s-triazine,
4-[p-N,N-di(ethoxycarbonylmethyl)aminophenyl]-2,6-di(trichloromethyl)-s-triazine,
4-[o-methyl-p-N,N-di(ethoxycarbonylmethyl)aminophenyl]-2,6-di(trichloromethyl)-s-triazine,
4-[p-N,N-di(chloroethyl)aminophenyl]-2,6-di(trichloromethyl)-s-triazine,
4-[o-methyl-p-N,N-di(chloroethyl)aminophenyl]-2,6-di(trichloromethyl)-s-triazine,
4-(p-N-chloroethylaminophenyl)-2,6-di(trichloromethyl)-s-triazine,
4-(p-N-ethoxycarbonylmethylaminophenyl)-2,6-di(trichloromethyl)-s-triazine,
4-[p-N,N-di(phenyl)aminophenyl]-2,6-di(trichloromethyl)-s-triazine,
4-(p-N-chloroethylcarbonylaminophenyl)-2,6-di(trichloromethyl)-s-triazine,
4-[p-N-(p-methoxyphenyl)carbonylaminophenyl]-2,6-di(trichloromethyl)-s-triazine,
4-[m-N,N-di(ethoxycarbonylmethyl)aminophenyl]-2,6-di(trichloromethyl)-s-triazine,
4-[m-bromo-p-N,N-di(ethoxycarbonylmethyl)aminophenyl]-2,6-di(trichloromethyl)-s-triazine,
4-[m-chloro-p-N,N-di(ethoxycarbonylmethyl)aminophenyl]-2,6-di(trichloromethyl)-s-triazine,
4-[m-fluoro-p-N,N-di(ethoxycarbonylmethyl)aminophenyl]-2,6-di(trichloromethyl)-s-triazine,
4-[o-bromo-p-N,N-di(ethoxycarbonylmethyl)aminophenyl]-2,6-di(trichloromethyl)-s-triazine,
4-[o-chloro-p-N,N-di(ethoxycarbonylmethyl)aminophenyl]-2,6-di(trichloromethyl)-s-triazine,
4-[o-fluoro-p-N,N-di(ethoxycarbonylmethyl)aminophenyl]-2,6-di(trichloromethyl)-s-triazine,
4-[o-bromo-p-N,N-di(chloroethyl)aminophenyl]-2,6-di(trichloromethyl)-s-triazine,
4-[o-chloro-p-N,N-di(chloroethyl)aminophenyl]-2,6-di(trichloromethyl)-s-triazine,
4-[o-fluoro-p-N,N-di(chloroethyl)aminophenyl]-2,6-di(trichloromethyl)-s-triazine,
4-[m-bromo-p-N,N-di(chloroethyl)aminophenyl]-2,6-di(trichloromethyl)-s-triazine,
4-[m-chloro-p-N,N-di(chloroethyl)aminophenyl]-2,6-di(trichloromethyl)-s-triazine,
4-[m-fluoro-p-N,N-di(chloroethyl)aminophenyl]-2,6-di(trichloromethyl)-s-triazine,
4-(m-bromo-p-N-ethoxycarbonylmethylaminophenyl)-2,6-di(trichloromethyl)-s-triazine,
4-(m-chloro-p-N-ethoxycarbonylmethylaminophenyl)-2,6-di(trichloromethyl)-s-triazine,
4-(m-fluoro-p-N-ethoxycarbonylmethylaminophenyl)-2,6-di(trichloromethyl)-s-triazine,
4-(o-bromo-p-N-ethoxycarbonylmethylaminophenyl)-2,6-di(trichloromethyl)-s-triazine,
4-(o-chloro-p-N-ethoxycarbonylmethylaminophenyl)-2,6-di(trichloromethyl)-s-triazine,
4-(o-fluoro-p-N-ethoxycarbonylmethylaminophenyl)-2,6-di(trichloromethyl)-s-triazine,
4-(m-bromo-p-N-chloroethylaminophenyl)-2,6-di(trichloromethyl)-s-triazine, 4-(m-chloro-p-N-chloroethylaminophenyl)-2,6-di(trichloromethyl)-s-triazine,
4-(m-fluoro-p-N-chloroethylaminophenyl)-2,6-di(trichloromethyl)-s-triazine,
4-(o-bromo-p-N-chloroethylaminophenyl)-2,6-di(trichloromethyl)-s-triazine,
4-(o-chloro-p-N-chloroethylaminophenyl)-2,6-di(trichloromethyl)-s-triazine, and
4-(o-fluoro-p-N-chloroethylaminophenyl)-2,6-di(trichloromethyl)-s-triazine.

Other examples include TAZ series (e.g., TAZ-107, TAZ-110, TAZ-104, TAZ-109, TAZ-140, TAZ-204, TAZ-113, TAZ-123, and TAZ-104) manufactured by Midori Kagaku Co., Ltd., T series (e.g., T-OMS, T-BMP, T-R, and T-B) manufactured by Panchim Co., IRGACURE series (e.g., IRGACURE 369, IRGACURE 784, IRGACURE 651, IRGACURE 184, IRGACURE 500, IRGACURE 1000, IRGACURE 149, IRGACURE 819, and IRGACURE 261) and DALOCURE series (e.g., DALOCURE 1173) manufactured by Ciba Specialty Chemicals. Ltd.,
4,4'-bis(diethylamino)-benzophenone, 2-(O-benzoyloxime)-1-[4-(phenylthio)phenyl]-1,2-octanedione,
2-benzyl-2-dimethylamino-4-morphorinobutyrophenone,
2,2-dimethoxy-2-phenylacetophenone, 2-(o-chlorophenyl)-4,5-diphenylimidazoyl dimers,
2-(o-fluorophenyl)-4,5-diphenylimidazoyl dimers,
2-(o-methoxyphenyl)-4,5-diphenylimidazoyl dimers,
2-(p-methoxyphenyl)-4,5-diphenylimidazoyl dimers,
2-(p-dimethoxyphenyl)-4,5-diphenylimidazoyl dimers,
2-(2,4-dimethoxyphenyl)-4,5-diphenylimidazoyl dimers,
2-(p-methylmercaptophenyl)-4,5-diphenylimidazoyl dimers, and benzoin propyl ether.

In the colored curable composition according to the invention, the above-described photopolymerization initiator can be used in combination with one or more other known photopolymerization initiators. Specifically, examples thereof include vicinal polyketolaldonyl compounds described in U.S. Pat. No. 2,367,660, α-carbonyl compounds described in U.S. Pat. Nos. 2,367,661 and 2,367,670, acyloin ethers described in U.S. Pat. No. 2,448,828, aromatic acyloin compounds substituted by α-hydrocarbon described in U.S. Pat. No. 2,722,512, polynuclear quinine compounds described in U.S. Pat. Nos. 3,046,127 and 2,951,758, a combination of triallylimidazole dimer and p-aminophenyl ketone described in U.S. Pat. No. 3,549,367, and benzothiazole compounds and trihalomethyl-s-triazine compounds described in JP-B No. 51-48516.

The content of the photopolymerization initiator in the colored curable composition (the ratio of the mass of the photopolymerization initiator to the mass of the solids of the polymerizable monomer) is preferably from 0.01 to 50 mass %, more preferably from 1 to 30 mass %, still more preferably from 1 to 20 mass %. When the content is less than 0.01 mass %, the polymerization may hardly proceed; when the content exceeds 50 mass %, the degree of polymerization is high, but the molecular weight becomes low, sometimes resulting in poor film strength. When the content is in the range of from 0.01 to 50 mass %, the polymerization easily proceeds to improve the film strength.

The photopolymerization initiator can be used in combination with a sensitizing agent and/or a photostabilizer.

Specific examples thereof include benzoin, benzoin methyl ether, benzoin, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, 2-ethoxyxanthone, thioxanthone, 2,4-diethylthioxanthone, acridone, 10-butyl-2-chloroacridone, benzyl, dibenzalacetone, p-(dimethylamino)phenylstyryl ketone, p-(dimethylamino)phenyl-p-methylstyryl ketone, benzophenone, p-(dimethylamino)benzophenone (or Michler's ketone), p-(diethylamino)benzophenone, benzoanthrone, benzothiazol compounds described in JP-B No. 51-48516, TINUVIN 1130, and TINUVIN 400.

The colored curable composition according to the invention preferably contains, in addition to the above, a heat polymerization inhibitor. As the heat polymerization inhibitor, for example, hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and/or 2-mercaptobenzoimidazole, and the like are useful.

Naphthoquinonediazide Compounds

Next, the naphthoquinonediazide compound that can be used when the colored curable composition according to the invention is of positive type will be described. The naphthoquinonediazide compound is a compound that has at least one o-quinonediazido group. Examples thereof include o-naphthoquinonediazide-5-sulfonic ester, o-naphthoquinonediazide-5-sulfonic acid amide, o-naphthoquinonediazide-4-sulfonic ester, o-naphthoquinonediazide-4-sulfonic acid amide. These esters and amide compounds can be manufactured by known methods using, for example, a phenol compound represented by Formula (I) in JP-A Nos. 2-84650 and 3-49437.

When the colored curable composition is of positive type, the amount of each of the binder and the crosslinking agent to be dissolved is usually from about 2 to about 50 mass %, preferably from about 2 to about 30 mass %, based on the total amount of the solids to be added into the organic solvent. Usually, the content of each of the naphthoquinonediazide compound and the colorant is preferably from about 2 to about 30 mass % or about 2 to about 50 mass %, based on the mass of the solution in which the binder and the crosslinking agent are dissolved.

Solvents

When the colored curable composition according to the invention is prepared, a solvent can be used in general. The solvent is selected such that a desired solubility of each of the components of the composition and desired coating properties of the colored curable composition are obtained, and is preferably selected particularly in consideration of the solubility and coating properties of the binder and safety.

Specific examples of preferable solvents include esters, for example, ethyl acetate, n-butyl acetate, isobutyl acetate, amyl formate, isoamyl acetate, isobutyl acetate, butyl propionate, isopropyl butyrate, ethyl butyrate, butyl butyrate, alkyl esters, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate, and ethyl ethoxyacetate;

alkyl 3-oxypropionate esters such as methyl 3-oxypropionate and ethyl 3-oxypropionate, for example, methyl 3-methoxypropionate, ethyl 3-methoxypropionate, methyl 3-ethoxypropionate, and ethyl 3-ethoxypropionate; alkyl 2-oxypropionate esters such as methyl 2-oxypropionate, ethyl 2-oxypropionate and propyl 2-oxypropionate, for example, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, and ethyl 2-ethoxy-2-methylpropionate; methyl pyruvate, ethyl pyruvate, propyl pyruvate, methyl acetoacetate, ethyl acetoacetate, methyl 2-oxobutanoate, ethyl 2-oxobutanoate;

ethers, for example, diethylene glycol dimethyl ether, tetrahydrofuran, ethylene glycol monomethyl ether, ethylene glycol monoethyl ether, methylcellosolve acetate, ethylcellosolve acetate, diethylene glycol monomethyl ether, diethylene glycol monoethyl ether, diethylene glycol monobutyl ether, propylene glycol methyl ether, propylene glycol methyl ether acetate, propylene glycol ethyl ether acetate, and propylene glycol propyl ether acetate; ketones, for example, methyl ethyl ketone, cyclohexanone, 2-heptanone, and 3-heptanone; and aromatic hydrocarbons, for example, toluene and xylene.

Among the above solvents, methyl 3-ethoxypropionate, ethyl 3-ethoxypropionate, ethylcellosolve acetate, ethyl lactate, diethylene glycol dimethyl ether, butyl acetate, methyl 3-methoxypropionate, 2-heptanone, cyclohexanone, ethylcarbitol acetate, butylcarbitol acetate, propylene glycol methyl ether and/or propylene glycol methyl ether acetate, and the like are preferable.

Various Additives

The colored curable composition according to the invention may contain, as required, various additives, for example, a filler, a macromolecular compound other than those described above, a surfactant, an adhesion promoting agent, an antioxidant, an ultraviolet absorbing agent, and/or an aggregation inhibitor.

Specific examples of the above-mentioned various additives include: fillers such as glass and alumina; macromolecular compounds other than binding resins such as polyvinyl alcohol, polyacrylic acid, polyethylene glycol monoalkyl ethers, polyfluoroalkyl acrylates; surfactants such as non-ionic, cationic and anionic surfactants; adhesion promoting agents such as vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane, and 3-mercaptopropyltrimethoxysilane; antioxidants such as 2,2-thiobis(4-methyl-6-t-butylphenol) and 2,6-di-t-butylphenol; ultraviolet absorbing agents such as 2-(3-t-butyl-5-methyl-2-hydroxyphenyl)-5-chlorobenzotriazole and alkoxybenzophenone; and aggregation inhibitors such as sodium polyacrylate.

The composition may contain an organic carboxylic acid, preferably a low molecular weight organic carboxylic acid having a molecular weight of 1000 or less, for further improving the developability of the colored curable composition according to the invention by increasing the alkali solubility of portions to be removed by development (non-image portions) (in the case of a negative type, non-cured portions (portions not exposed to radiation).

Examples of the organic carboxylic acid include aliphatic monocarboxylic acids such as formic acid, acetic acid, propionic acid, butyric acid, valeric acid, pivalic acid, caproic acid, diethylacetic acid, enanthic acid and caprylic acid; aliphatic dicarboxylic acids such as oxalic acid, malonic acid, succinic acid, glutaric acid, adipic acid, pimelic acid, suberic acid, azelaic acid, sebasic acid, brassylic acid, methylmalonic acid, ethylmalonic acid, dimethylmalonic acid, methylsuccinic acid, tetramethylsuccinic acid and citraconic acid; aliphatic tricarboxylic acids such as tricarballylic acid, aconitic acid and camphoronic acid; aromatic monocarboxylic acids such as benzoic acid, toluic acid, cumic acid, hemellitic acid and mesitylenic acid; aromatic polycarboxylic acids such as phthalic acid, isophthalic acid, terephthalic acid, trimellitic acid, trimesic acid, mellophanic acid and pyromellitic acid; and other carboxylic acids such as phenylacetic acid, hydratropic acid, hydrocinnamic acid, mandelic acid, phenylsuccinic acid, atropic acid, cinnamic acid, methyl cinnamate, benzyl cinnamate, cinnamylideneacetic acid, coumaric acid and umbellic acid.

The colored curable composition according to the invention can be suitably used in formation of color pixels of a color filter or the like used in a liquid crystal display (LCD), solid-state image sensing devices (e.g., CCD, CMOS, etc.), etc., or in the preparation of ink for printing, ink for inkjet, paint, etc.

<Color Filter and Manufacturing Method Thereof>

Next, a color filter of the invention and a manufacturing method thereof will be described in detail.

In the method of manufacturing a color filter according to the invention, the colored curable composition according to the invention described above is used. Most preferably, the color filter according to the invention is prepared by applying the colored curable composition according to the invention described above onto a coating method such as rotation coating, cast coating or roll coating to form a radiation-sensitive composition layer, exposing the layer to light through a predetermined mask pattern, and developing the layer with a developer to form a negative type or positive type colored pattern (resist pattern) (an image formation step). In this process, a curing step may be provided as necessary, the curing step including curing the formed colored pattern by heating and/or light exposure. The light or radiation to be used therefor is preferably ultraviolet rays such as the g ray, h ray or i ray. When the colored curable composition is of positive type, a step of post-baking the colored pattern may be provided after the image formation step.

In the preparation of a color filter, a color filter having a desired number of hues can be prepared by repeating the image formation step (and optionally the curing step) in accordance with the desired number of hues in the case of a negative type, or by repeating the image formation step and post-baking step in accordance with the desired number of hues in the case of a positive type.

Examples of the support include soda glass, PYREX® glass and quartz glass used in liquid display devices and the like, and materials produced by adhering a transparent electrically conductive film onto any of the above supports, photoelectric conversion element substrates used in image sensing devices and the like, for example silicone substrates, complementary metal oxide film semiconductors (CMOS), etc. These supports may have black stripes formed thereon that separate each pixel.

On these supports, as necessary, an undercoat layer may be provided so as to improve adhesion between the support and upper layers, so as to prevent diffusion of substances or so as to flatten the support surface.

The developer used in a method of manufacturing a color filter according to the invention may be, for example in the case of where the composition according to the invention is of negative type, any developer as long as the developer has a composition that dissolves non-cured portions of the colored curable composition according to the invention but does not dissolve portions that have been irradiated with radiation (cured portions). Specifically, a combination of various organic solvents, or an aqueous alkaline solution can be used. Examples of the organic solvents include those cited in the above-described organic solvents usable in the preparation of the colored curable composition according to the invention.

A preferable example of the aqueous alkaline solution is an aqueous alkaline solution wherein an alkaline compound is dissolved in water to give a concentration of 0.001 to 10% by mass, preferably 0.01 to 1% by mass. Example of the alkaline compound include sodium hydroxide, potassium hydroxide, sodium carbonate, sodium silicate, sodium metasilicate, ammonia water, ethylamine, diethylamine, dimethylethanolamine, tetramethylammonium hydroxide, tetraethylammonium hydroxide, choline, pyrrole, piperidine, and/or 1,8-diazabicyclo-[5.4.0]-7-undecene. When such an aqueous alkaline solution is used as a developer, it is generally preferable to wash the color filter with water after development.

The color filter according to the invention can be used in solid-state image sensing devices such as liquid crystal display devices and CCD, and is particularly suitable for high resolution CCD devices, high resolution CMOS device, and the like having more than one million pixels. The color filter according to the invention can be used as a color filter, for example, disposed between a light receiving portion of each pixel of CCD and a microlens for collecting light.

The invention will be specifically described by reference to examples hereinafter; however, the invention is by no means limited to the examples below as long as the spirit and scope of the invention is retained. Unless otherwise indicated, "parts" means "mass parts."

Example 1

1) Preparation of a Resist Solution (Negative Type)

| | |
|---|---|
| Propylene glycol monomethyl ether acetate (PGMEA): | 5.20 parts |
| Ethyl lactate (EL): | 52.6 parts |
| Binder [Benzyl methacrylate/methacrylic acid/ methacrylic acid-2-hydroxyethyl copolymer (41% EL solution; coplymerization ratio [molar ratio] = 60/20/20)]: | 30.5 parts |
| Dipentaerythritolhexacrylate: | 10.2 parts |
| Polymerization inhibitor (p-methoxyphenol): | 0.006 parts |
| Fluorine-based surfactant (trade name: F-475, manufactured by Dainippon Ink And Chemicals, Inc.): | 0.80 parts |
| Photopolymerization initiator (trade name: TAZ-107, manufactured by Midori Kagaku Co., Ltd.): | 0.58 parts |

The above-mentioned components are mixed, and the binder is dissolved in the solvent in the composition to form a resist solution.

2) Preparation of a Glass Substrate with an Undercoat Layer

A glass substrate (trade name: CORNING 1737, manufactured by Corning Inc.) was subjected to ultrasonic cleaning with 0.5% aqueous NaOH, water washing, and baking (200° C./20 min) for dehydration. Next, the resist solution obtained in 1) above was applied onto a cleaned glass substrate by a spin coater to give a film thickness of 2 μm. The coated layer obtained was heated at 220° C. for 1 hour and dried, whereby a cured film (undercoat layer) was formed.

3) Preparation of a Dye Resist Solution (Colored Curable Composition [Negative Type])

9.4 g of the resist solution obtained in the step 1) and 0.75 g of Illustrative Compound C-1 described above, which is a first dye according to the invention and represented by formula (C1) above, were mixed, and the dye was dissolved in the solution, whereby a dye resist solution (solution of a colored curable composition [negative type]) was prepared.

4) Light Exposure and Development of a Dye Resist Solution (Image Formation)

The dye resist solution obtained in the step 3) was applied onto the undercoat layer of the glass substrate having the undercoat layer obtained in the step 2) by a spin coater to give a film thickness of 1.0 μm. The coated layer obtained was pre-baked at 100° C. for 120 seconds.

Next, the coated layer was irradiated with light having a wavelength of 365 nm through a mask having a line width of 20 μm in an exposure value of 500 mJ/cm$^2$ by using a light exposing apparatus. After irradiation, the coated film was developed in a developer CD-2000 (manufactured by Fuji Film Arch Corp.) at 25° C. for 40 seconds. Thereafter, the developed coated film was rinsed in running water for 30 seconds, and then was spray dried.

As described above, a cyan pattern that is preferable for cyan pixels of a color filter was obtained.

5) Evaluation

The dye resist solution prepared above was evaluated with respect to storage stability over time and the heat resistance and light resistance of the coated film produced by the application of the dye resist solution on the glass substrate in the following manner. The evaluation results are shown in Table 1.

—Storage Stability Over Time—

After the dye resist solution was stored at room temperature for one month (about 720 hours), the degree of deposition of matter in the solution was visually evaluated in accordance with the following evaluation criteria.

[Evaluation Criteria]

A: Deposition of matter was not observed.

B: Slight deposition of matter was observed.

C: Remarkable deposition of matter was observed.

—Heat Resistance—

The chromaticity of the obtained coated film by the application of the dye resist solution to the glass substrate was determined with a chromoscope MCPD-1000 (manufactured by Otsuka Electronics Co., Ltd.). Next, the glass substrate was placed on a hot plate at 200° C. such that the coated film contacted the hot plate, and was heated for one hour, and then the chromaticity of the coated film was determined with the chromoscope MCPD-1000 (manufactured by Otsuka Electronics Co., Ltd.). The chromaticity difference (ΔEab value) between the chromaticity prior to heating and the chromaticity after heating was calculated, and was used as an indicator for evaluation of heat resistance. The heat resistance of the coated film was evaluated according to the following evaluation criteria. A smaller ΔEab value suggests better heat resistance.

[Evaluation Criteria]

A: ΔEab value<5

B: 5≦ΔEab value≦10

C: ΔEab value>10

—Light Resistance—

The chromaticity of the obtained coated film by the application of the dye resist solution to the glass substrate was determined with the chromoscope MCPD-1000 (manufactured by Otsuka Electronics Co., Ltd.). Next, this glass substrate was irradiated with light at 50,000 lux for 20 hours (corresponding to 1,000,000 lux·h), and then the chromaticity of the coated film was determined with the chromoscope MCPD-1000 (manufactured by Otsuka Electronics Co., Ltd.). The chromaticity difference (ΔEab value) between the chromaticity prior to irradiation and the chromaticity after irradiation was evaluated, and the chromaticity difference was used as an indicator for evaluation of light resistance. The light resistance of the coated film was evaluated in accordance with the following evaluation criteria. A smaller ΔEab value suggests better light resistance.

[Evaluation Criteria]

A: ΔEab value<3

B: 3≦ΔEab value≦10

C: ΔEab value>10

Examples 2 to 10

A cyan pattern was formed and evaluated in the same manner as in Example 1 except that the dye used in "3) Preparation of a Dye Resist Solution" of Example 1 was changed to the equimolar amount of the dye shown in Table 1. The evaluation results are shown in Table 1.

Comparative Examples 1 to 2

A comparative cyan pattern was formed and evaluated in the same manner as in Example 1 except that the dye used in "3) Preparation of a Dye Resist Solution" of Example 1 was changed to the equimolar amount of Comparative Colorant 1 below (Comparative Example 1) or Comparative Colorant 2 below (Comparative Example 2). The evaluation results are shown in Table 1 together with the results of Examples.

Comparative Colorant 1: (Colorant described in JP-A No. 7-286110)

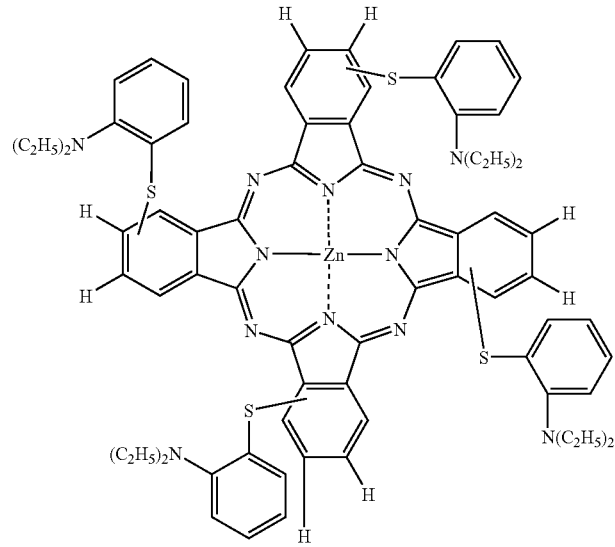

Comparative Colorant 2: (Colorant described in JP-A No. 7-286110)

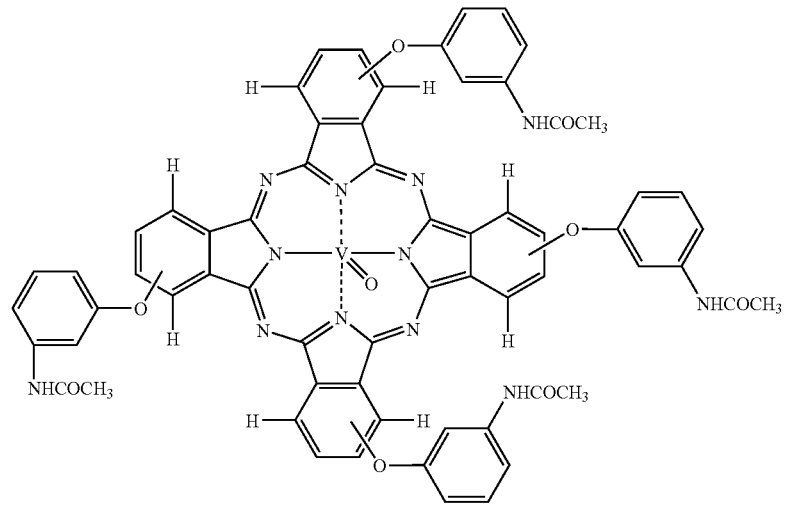

TABLE 1

| | Dye | Stability over time | Heat resistance | Light resistance |
|---|---|---|---|---|
| Example 1 | C-1 | A | A | A |
| Example 2 | C-5 | A | A | A |
| Example 3 | C-8 | A | A | A |
| Example 4 | C-9 | A | A | A |
| Example 5 | C-11 | A | A | A |
| Example 6 | C-15 | A | A | A |
| Example 7 | C-17 | A | A | A |
| Example 8 | C-20 | A | A | A |
| Example 9 | C-29 | A | B | B |
| Example 10 | C-42 | A | A | A |
| Comparative Example 1 | Comparative Colorant 1 | C | C | C |
| Comparative Example 2 | Comparative Colorant 2 | C | C | C |

Note: The symbols in the column for "Dye" in Examples represent above-described illustrative compounds as compounds (dyes) represented by Formula (C1).

As shown in Table 1, in each of the Examples in which the first dye according to the invention is used, the colored curable compositions prepared in the form of a solution is excellent in storage stability over time and also the cyan pattern formed by using the colored curable composition exhibit satisfactory heat resistance and light resistance, as compared with the Comparative Examples using other dyes.

Example 11

1) Preparation of a Colored Curable Composition [Positive Type])

The following components were mixed, and the solid contents in the composition were dissolved in the solvent in the composition to prepare a colored curable composition [positive type] in a solution form.

| | |
|---|---|
| Ethyl lactate (EL): | 30 parts |
| Resin P-1 shown below: | 3.0 parts |
| Naphthoquinonediazide compound N-1 shown below: | 1.8 parts |
| Hexamethoxymethylolated melamine (crosslinking agent): | 0.6 parts |
| TAZ-107 (photoacid generator, manufactured by Midori Kagaku Co., Ltd.): | 1.2 parts |
| F-475 (Fluorine-based surfactant: manufactured by Dainippon Ink And Chemicals, Inc.): | 0.0005 parts |
| Illustrative Compound C-3 as the first dye according to the invention (Compound represented by Formula (C1)): | 1.5 parts |

—Synthesis of Resin P-1—

70.0 g of benzylmethacrylate, 13.0 g of methacrylic acid, 17.0 g of 2-hydroxyethyl methacrylate, and 600 g of 2-methoxypropanol were placed in a three-necked flask, and an agitating device, a reflux cooling tube and a thermometer were attached thereto. A catalytic amount of polymerization initiator V-65 (manufactured by Wako Pure Chemical Industries Ltd.) was added to the contents of the flask under a nitrogen flow at 65° C., and the resultant mixture was agitated for 10 hours. The resultant resin solution was added dropwise to 20 L (liters) of vigorously agitated ion exchanged water, whereby white powder was obtained. This white powder was vacuum dried at 40° C. for 24 hours, whereby 145 g of Resin P-1 was obtained. The molecular weight of the resin was measured with GPC, and was found to be as follows: the weight average molecular weight Mw=28,000, and the number average molecular weight Mn=11,000.

—Synthesis of Naphthoquinonediazide Compound N-1—

42.45 g of Trisp-PA (manufactured by Honshu Chemical Industry Co., Ltd.), 61.80 g of o-naphthoquinonediazide-5-sulfonyl chloride and 300 ml of acetone were placed in a three-necked flask. To the contents of the flask agitated at room temperature, 24.44 g of trimethylamine was dropwise added over one hour. After completion of the dropwise addition, the resultant mixture was agitated for 2 hours, and then this reaction solution was poured into a large amount of agitated water. The deposited naphthoquinonediazide sulfonate ester was collected by suction filtration. This ester was vacuum dried at 40° C. for 24 hours, whereby photosensitive naphthoquinonediazide Compound N-1 was obtained.

2) Light Exposure and Development of a Colored Curable Composition (Image Formation)

A glass substrate with an undercoat layer was prepared in the same manner as in Example 1, and the colored curable composition prepared as described above was applied onto the glass substrate having the undercoat layer in the same manner as in Example 1. The resultant coated film was subjected to pre-baking, irradiation, development, rinsing, and spray drying, whereby a cyan pattern was obtained. Thereafter, this pattern was heated at 180° C. for 5 minutes (post-baking). The formed cyan pattern showed an excellent rect-angular profile.

Subsequently, the storage stability of the dye resist solution prepared as described above and the heat resistance and light resistance of the obtained coated film by application of the dye resist solution onto the glass substrate were evaluated in the same manner as Example 1. The storage stability, and the light resistance and heat resistance were all satisfactory, as in the case of the above-described negative type.

Examples 12 to 21

The same operations as in Examples 1 to 10 was carried out except that the glass substrate in Examples 1 to 10 was substituted with a silicon wafer substrate. As a result, a coated film was formed on the silicon wafer substrate. Then, the coated film was exposed to light in an exposure value of 500 mj/cm$^2$ in a 2 μm×2 μm square pattern by using an i-ray reduction projection light-exposing apparatus, and then was developed at 23° C. for 60 seconds with a developer produced by dilution of CD-2000 (manufactured by Fuji Film Arch Corp.) to 60%. Thereafter, the developed coated film was rinsed with running water for 30 seconds, and then spray dried. As a result, a square pattern having excellent profile with a substantially rectangular cross-section was obtained, the pattern being suitable for a color filter for CCD.

Example 22

A pattern suitable for a color filter was obtained in the same manner as in Example 1, except that 1.50 g of Illustrative Colorant C-1' (phthalocyanine colorant represented by Formula (II)) was used instead of 0.75 g of Illustrative Compound C-1 in the preparation of the dye resist solution, and that 5 mm-square mask (island pattern) was used instead of the mask having a line width of 20 μm in light exposure. In the same manner as in Example 1, the storage stability of the dye resist solution, and the heat resistance and light resistance of the coated film produced by application of the dye resist solution onto the glass substrate were evaluated. Further, the developability of the coated film was evaluated as described below. The results are shown in Table 2.

—Developability—

A sample was prepared by application of the dye resist onto the glass substrate, and the visible absorption spectrum of this sample prior to development was measured. Next, this sample was subjected to light exposure, development processing, washing, and spray drying under the aforementioned conditions, whereby a pattern was formed. Thereafter, the visible absorption spectrum of light exposed portions (image portions) of the pattern and the visible absorption spectrum of light unexposed portions of the pattern were measured. The ratio of the absorbance of the light exposed portions at λmax to the absorbance of the sample prior to development at λmax, and the ratio of the absorbance of the light unexposed portions at λmax to the absorbance of the sample prior to development at λmax (colorant residual ratios) were calculated and evaluated in accordance with the following criteria. In the light exposed portions the colorant residual ratio is preferably nearer to 100%, while in the light unexposed portions the colorant residual ratio is preferably 0%.

[Evaluation Criteria]

—Light Exposed Portions—

A: colorant residual ratio>98%

B: 90%≦colorant residual ratio≦98%

C: colorant residual ratio<90%

—Light Unexposed Portions—

A: colorant residual ratio<1%

B: 1%≦colorant residual ratio≦5%

C: 5%<colorant residual ratio

Examples 23 to 38

A pattern suitable for a color filter was obtained as in Example 22 except that Illustrative Colorant C-1' used in the preparation of the "3) Preparation of a Dye Resist Solution" in Example 22 was replaced by an equimolar amount of a dye shown in Table 2 below. The storage stability of the dye resist solution, and the heat resistance, light resistance and developability of the coated film produced by application of the dye resist solution onto the glass substrate were evaluated. The results are shown in Table 2.

Comparative Examples 3 to 6

A pattern suitable for a color filter was obtained as in Example 22 except that Illustrative Colorant C-1' used in the preparation of the "3) Preparation of a Dye Resist Solution" in Example 22 was replaced by an equimolar amount of one of the comparative dyes A to D shown below. The storage stability of the dye resist solution, and the heat resistance, light resistance and developability of the coated film produced by application of the dye resist solution onto the glass substrate were evaluated. The results are shown in Table 2.

Comparative Colorant A: (Illustrative Colorant 1-41 described in JP-A No. 5-295283)

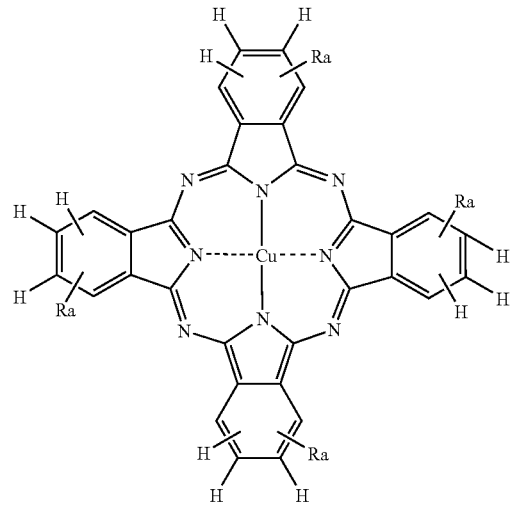

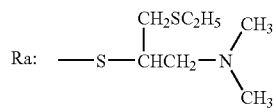

Comparative Colorant B: (Illustrative Colorant 1-57 described in JP-A No. 5-295283)

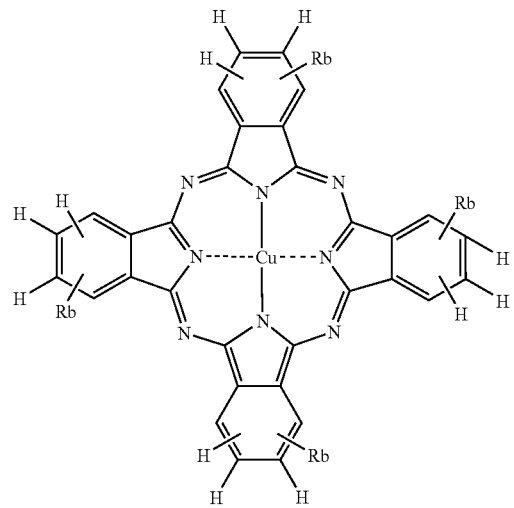

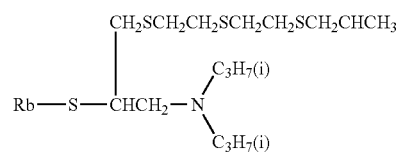

-continued

Comparative Colorant C: (Illustrative Colorant 1-97 described in JP-A No. 5-295283)

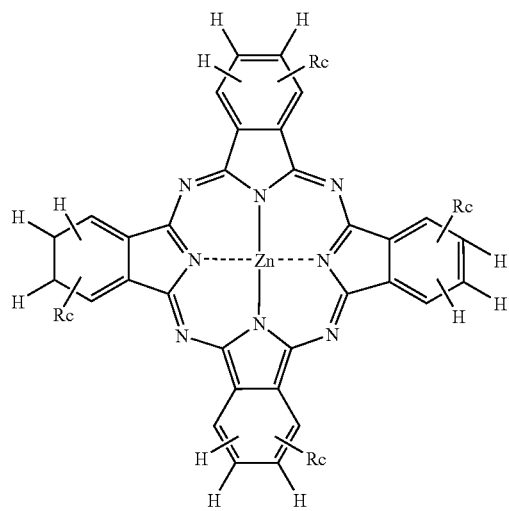

Rc—SCH$_2$CH$_2$SC$_2$H$_5$

-continued

Comparative Colorant D: (Illustrative Colorant 1-110 described in JP-A No. 5-295283)

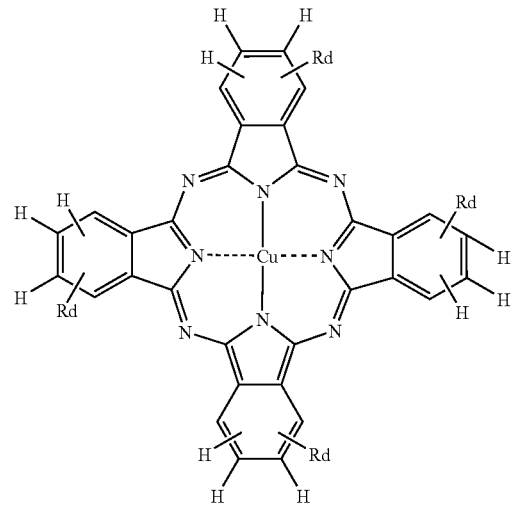

Rd: —SCH$_2$CH$_2$SH

TABLE 2

|  | Colorants | Storage stability | Heat resistance | Light resistance | Developability | |
|---|---|---|---|---|---|---|
|  |  |  |  |  | Light exposed portions | Light unexposed portions |
| Example 22 | Illustrative Colorant C-1' | A | A | A | A | A |
| Example 23 | Illustrative Colorant C-2' | A | A | A | A | A |
| Example 24 | Illustrative Colorant C-3' | A | A | A | A | A |
| Example 25 | Illustrative Colorant C-4' | A | A | A | A | A |
| Example 26 | Illustrative Colorant C-5' | A | A | A | A | A |
| Example 27 | Illustrative Colorant C-7' | A | A | A | A | A |
| Example 28 | Illustrative Colorant C-8' | A | A | A | A | A |
| Example 29 | Illustrative Colorant C-10' | A | A | A | A | A |
| Example 30 | Illustrative Colorant C-11' | A | A | A | A | A |
| Example 31 | Illustrative Colorant C-14' | A | A | A | A | A |
| Example 32 | Illustrative Colorant C-20' | A | A | B | A | A |
| Example 33 | Illustrative Colorant C-21' | A | A | B | A | A |
| Example 34 | Illustrative Coloranr C-28' | A | A | A | A | A |
| Example 35 | Illustrative Colorant C-30' | A | A | A | A | A |
| Example 36 | Illustrative Colorant C-32' | B | B | B | A | A |
| Example 37 | Illustrative Colorant C-47' | A | B | B | A | A |
| Example 38 | Illustrative Colorant C-48' | B | B | B | A | A |
| Comparative Example 3 | Comparative Colorant A | C | A | A | A | C |

TABLE 2-continued

| | Colorants | Storage stability | Heat resistance | Light resistance | Developability | |
|---|---|---|---|---|---|---|
| | | | | | Light exposed portions | Light unexposed portions |
| Comparative Example 4 | Comparative Colorant B | A | A | A | A | C |
| Comparative Example 5 | Comparative Colorant C | B | B | C | A | C |
| Comparative Example 6 | Comparative Colorant D | C | B | A | A | C |

The results of Table 2 show that the colored curable compositions of the Examples using dyes according to the invention are excellent in storage stability in a solution form, as compared with the Comparative Examples using other dyes. Furthermore, it was found that the image patterns formed by using the colored curable compositions exhibited excellent discrimination between a light exposed portion and a light unexposed portion and excellent developability. It was further found that the heat resistance and light resistance were not inferior to Comparative Examples.

Example 39

A positive type colored curable composition was obtained in the same manner as in Example 11 except that 1.5 parts of Illustrative Colorant C-2' was used instead of 1.5 parts of Illustrative Compound C-3.

2) Light Exposure and Development of a Colored Curable Composition (Image Formation)

In the same manner as in Example 22, the positive type colored curable composition prepared as described above was applied onto the glass substrate having the undercoat layer, and the resultant coated film was subjected to pre-baking, irradiation, development, rinsing, and drying, whereby an image pattern was formed. Thereafter, this pattern image was heated at 180° C. for 5 minutes (post baking). A magenta pattern image formed showed a satisfactory rectangular profile.

The storage stability of the colored curable composition using the dye according to the invention, and the heat resistance and light resistance of the coated film produced by application of the dye resist solution onto the glass substrate were evaluated by the same method as in Example 22. As a result, it was found that the storage stability, the heat resistance and the light resistance were excellent in this Example.

Examples 40 to 56

The same operations as in Examples 22 to 38 were carried out except that the glass substrate used in Examples 22 to 38 was changed to a silicon wafer substrate, whereby a coated silicon wafer substrate having an undercoat layer was obtained.

Then, the coated film was exposed to light in an exposure value of 500 mJ/cm$^2$ in a 2 μm-square pattern by using an i-ray reduction projection light-exposing apparatus, and then was developed with a developer (trade name: CD-2000, 60%, manufactured by Fuji Film Arch Corp.) at 23° C. for 60 seconds. Thereafter, the developed coated film was rinsed with running water for 30 seconds, and spray dried. A square pattern having a rectangular cross-section that is suitable for a color filter for CCD was obtained.

The invention claimed is:

1. A colored curable composition comprising at least one compound selected from the group consisting of compounds represented by the following Formula (C3) and Formula (III):

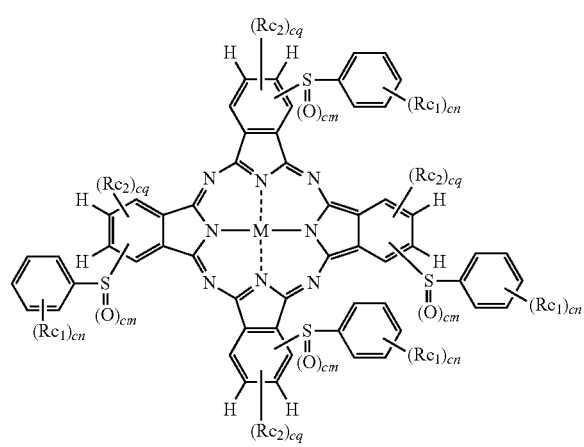

Formula (C3)

wherein, in formula (C3), $Rc_1$ represents an aryl group, a heterocyclic group, a cyano group, a carboxyl group, a carbamoyl group, an aliphatic oxycarbonyl group, an aryloxycarbonyl group, an acyl group, a hydroxyl group, an aliphatic oxy group, an aryloxy group, an acyloxy group, a carbamoyloxy group, a heterocyclic oxy group, an aliphatic oxycarbonyloxy group, an N-alkylacylamino group, a carbomoylamino group, a sulfamoylamino group, an aliphatic oxycarbonylamino group, an aryloxycarbonylamino group, an aliphatic sulfonylamino group, an arylsulfonylamino group, an aliphatic thio group, an arylthio group, an aliphatic sulfonyl group, an arylsulfonyl group, a sulfamoyl group, a sulfo group, an imide group, or a heterocyclic thio group; $Rc_2$ represents a substituent; M represents two hydrogen atoms, a divalent metal atom, a divalent metal oxide, a divalent metal hydroxide, or a divalent metal chloride; cm denotes 0, 1, or 2; cn denotes 0 or an integer from 1 to 5; four cns may be the same or different; at least one of the cns denotes an integer from 1 to 5; a plurality of $Rc_1$s in the molecule may be the same or different; and cq denotes 0 or 1, Formula (III)

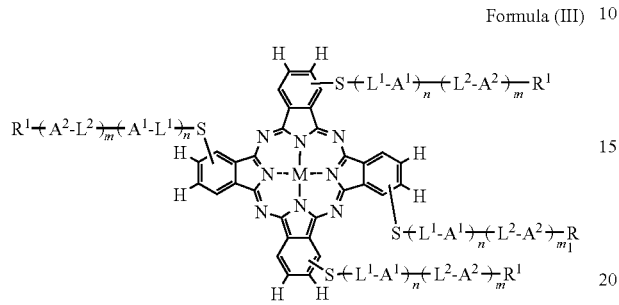

wherein, in formula (III), $L^1$ represents an alkylene group; $A^1$ and $A^2$ each independently represent —O—, —C(=O)—, —OC(=O)—, —C(=O)O—, —N(R$_2$)C(=O)—, —C(=O)N(R$^2$)—, —N(R$^2$)C(=O)—, —OC(=O)N(R$^2$)—, N(R$^2$)C(=O)N(R$^3$)—, —N(R$^2$)SO$_2$—, —SO$_2$N(R$^2$)—, or —SO$_2$—; $L^2$ represents an alkylene group, an aralkylene group, or an arylene group; n denotes an integer from 1 to 3; m denotes an integer from 0 to 3; when n is 2 or greater, $L^1$s may be the same or different and $A^1$s may be the same or different; when m is 2 or greater, $L^2$s may be the same or different and $A^2$s may be the same or different; $R^1$ represents a hydrogen atom, an alkyl group, an aryl group or a heterocyclic group; and M represents a metal-containing substance.

2. A method of manufacturing a color filter comprising applying the colored curable composition of claim 1 onto a support, exposing the obtained coated film to light through a mask, and forming a pattern image by development.

3. A color filter formed using the colored curable composition of claim 1.

4. A color filter containing at least one compound represented by the following Formula (C3):

Formula (C3)

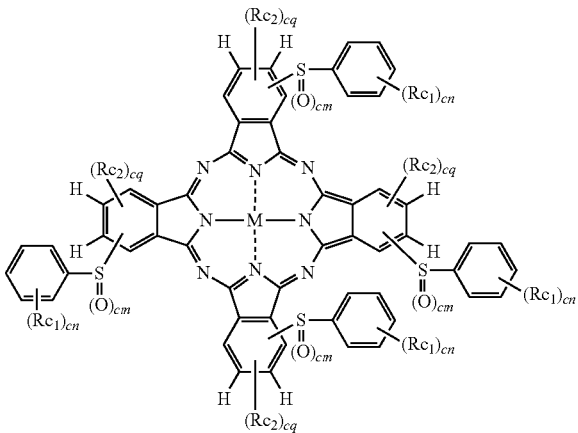

wherein, in formula (C3), $Rc_1$ represents an aryl group, a heterocyclic group, a cyano group, a carboxyl group, a carbamoyl group, an aliphatic oxycarbonyl group, an aryloxycarbonyl group, an acyl group, a hydroxyl group, an aliphatic oxy group, an aryloxy group, an acyloxy group, a carbamoyloxy group, a heterocyclic oxy group, an aliphatic oxycarbonyloxy group, an N-alkylacylamino group, a carbomoylamino group, a sulfamoylamino group, an aliphatic oxycarbonylamino group, an aryloxycarbonylamino group, an aliphatic sulfonylamino group, an arylsulfonylamino group, an aliphatic thio group, an arylthio group, an aliphatic sulfonyl group, an arylsulfonyl group, a sulfamoyl group, a sulfo group, an imide group, or a heterocyclic thio group; $Rc_2$ represents a substituent; M represents two hydrogen atoms, a divalent metal atom, a divalent metal oxide, a divalent metal hydroxide, or a divalent metal chloride; cm denotes 0, 1, or 2; cn denotes 0 or an integer from 1 to 5; four cns may be the same or different; at least one of the cns denotes an integer from 1 to 5; a plurality of $Rc_1$s in the molecule may be the same or different; and cq denotes 0 or 1.

5. A colored curable composition comprising at least one compound represented by the following Formula (C3):

Formula (C3)

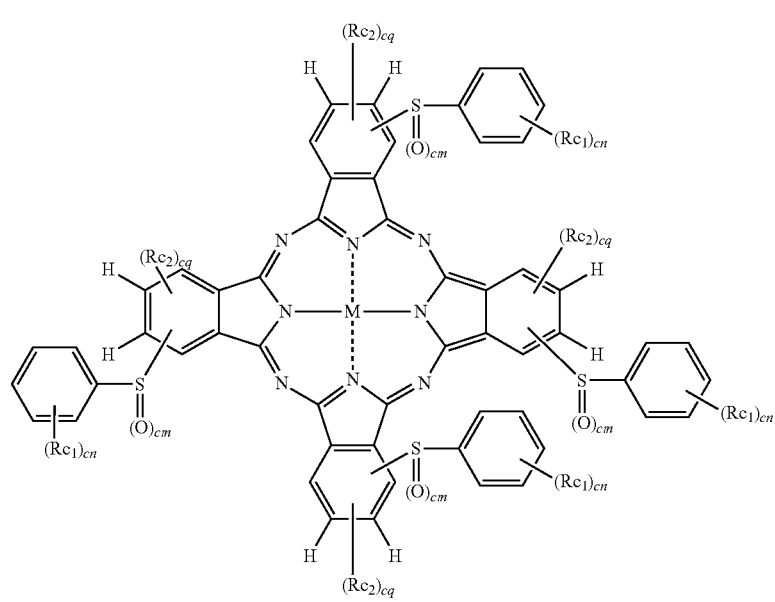

wherein, in formula (C3), $Rc_1$ represents an aryl group, a heterocyclic group, a cyano group, a carboxyl group, a carbamoyl group, an aliphatic oxycarbonyl group, an aryloxycarbonyl group, an acyl group, a hydroxyl group, an aliphatic oxy group, an aryloxy group, an acyloxy group, a carbamoyloxy group, a heterocyclic oxy group, an aliphatic oxycarbonyloxy group, an N-alkylacylamino group, a carbomoylamino group, a sulfamoylamino group, an aliphatic oxycarbonylamino group, an aryloxycarbonylamino group, an aliphatic sulfonylamino group, an arylsulfonylamino group, an aliphatic thio group, an arylthio group, an aliphatic sulfonyl group, an arylsulfonyl group, a sulfamoyl group, a sulfo group, an imide group, or a heterocyclic thio group; $Rc_2$ represents a substituent; M represents two hydrogen atoms, a divalent metal atom, a divalent metal oxide, a divalent metal hydroxide, or a divalent metal chloride; cm denotes 0, 1, or 2; cn denotes 0 or an integer from 1 to 5; four cns may be the same or different; at least one of the cns denotes an integer from 1 to 5; a plurality of $Rc_1$s in the molecule may be the same or different; and cq denotes 0 or 1.

6. A method of manufacturing a color filter comprising applying the colored curable composition of claim 5 onto a support, exposing the obtained coated film to light through a mask, and forming a pattern image by development.

7. A colored curable composition comprising at least one compound represented by the following Formula (III):

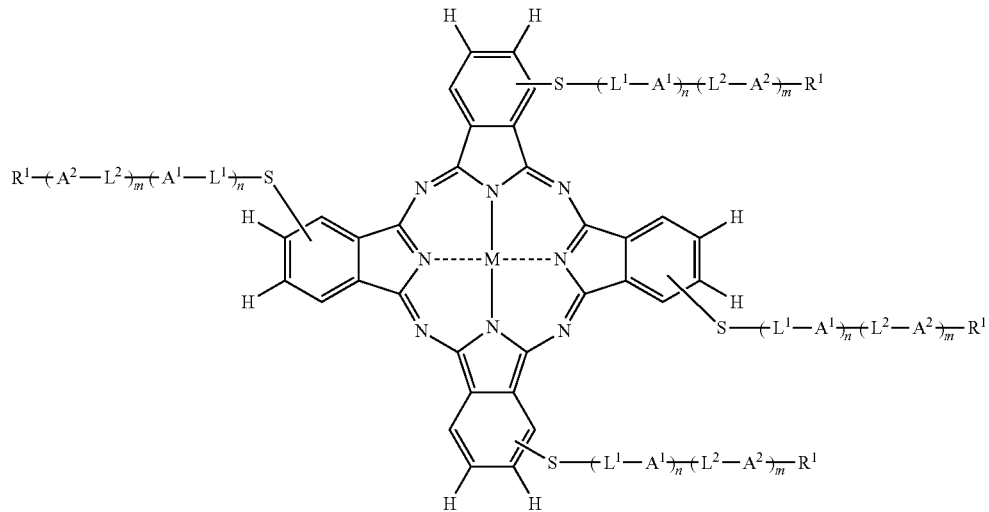

Formula (III)

wherein, in formula (III), $L^1$ represents an alkylene group; $A^1$ and $A^2$ each independently represent —O—, —C(=O)—, —OC(=O)—, —C(=O)O—, —N($R_2$)C(=O)—, —C(=O)N($R^2$)—, —N($R^2$)C(=O)—, —OC(=O)N($R^2$)—, N($R^2$)C(=O)N($R^3$)—, —N($R^2$)$SO_2$—, —$SO_2$N($R^2$)—, or —$SO_2$—; $L^2$ represents an alkylene group, an aralkylene group, or an arylene group; n denotes an integer from 1 to 3; m denotes an integer from 0 to 3; when n is 2 or greater, $L^1$s may be the same or different and $A^1$s may be the same or different; when m is 2 or greater, $L^2$s may be the same or different and $A^2$s may be the same or different; $R^1$ represents a hydrogen atom, an alkyl group, an aryl group or a heterocyclic group; and M represents a metal-containing substance.

8. A color filter formed using the colored curable composition of claim 7.

9. A method of manufacturing a color filter comprising applying the colored curable composition of claim 7 onto a support, exposing the obtained coated film to light through a mask, and forming a pattern image by development.

* * * * *

UNITED STATES PATENT AND TRADEMARK OFFICE
CERTIFICATE OF CORRECTION

PATENT NO. : 7,842,440 B2
APPLICATION NO. : 11/659284
DATED : November 30, 2010
INVENTOR(S) : Nobuo Seto, Yuki Mizukawa and Toru Fujimori It is certified that error appears in the above-identified patent and that said Letters Patent is hereby corrected as shown below:

Claim 1 should read:

1. A colored curable composition comprising at least one compound selected from the group consisting of compounds represented by the following Formula (C3) and Formula (III):

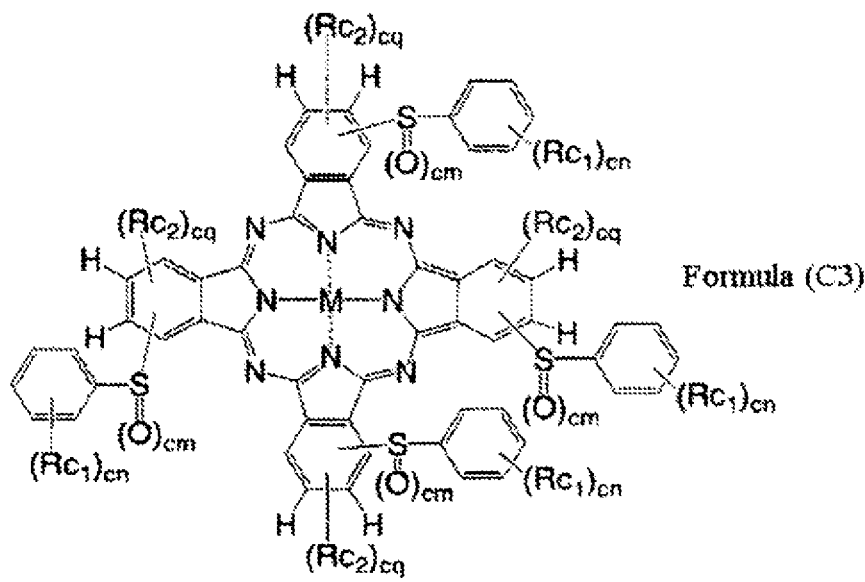

Formula (C3)

wherein, in formula (C3), $Rc_1$ represents an aryl group, a heterocyclic group, a cyano group, a carboxyl group, a carbamoyl group, an aliphatic oxycarbonyl group, an aryloxycarbonyl group, an acyl group, a hydroxyl group, an aliphatic oxy group, an aryloxy group, an acyloxy group, a carbamoyloxy group, a heterocyclic oxy group, an aliphatic oxycarbonyloxy group, an N-alkylacylamino group, a carbomoylamino group, a sulfamoylamino group, an aliphatic oxycarbonylamino group, an aryloxycarbonylamino group, an aliphatic sulfonylamino group, an arylsulfonylamino group, an aliphatic thio group, an arylthio group, an aliphatic sulfonyl group, an arylsulfonyl group, a sulfamoyl group, a sulfo group, an imide group, or a heterocyclic thio Signed and Sealed this
Twenty-fifth Day of September, 2012

David J. Kappos
*Director of the United States Patent and Trademark Office* group; $Rc_2$ represents a substituent; M represents two hydrogen atoms, a divalent metal atom, a divalent metal oxide, a divalent metal hydroxide, or a divalent metal chloride; cm denotes 0, 1, or 2; cn denotes 0 or an integer from 1 to 5; four cns may be the same or different; at least one of the cns denotes an integer from 1 to 5; a plurality of $Rc_1$s in the molecule may be the same or different; and cq denotes 0 or 1,

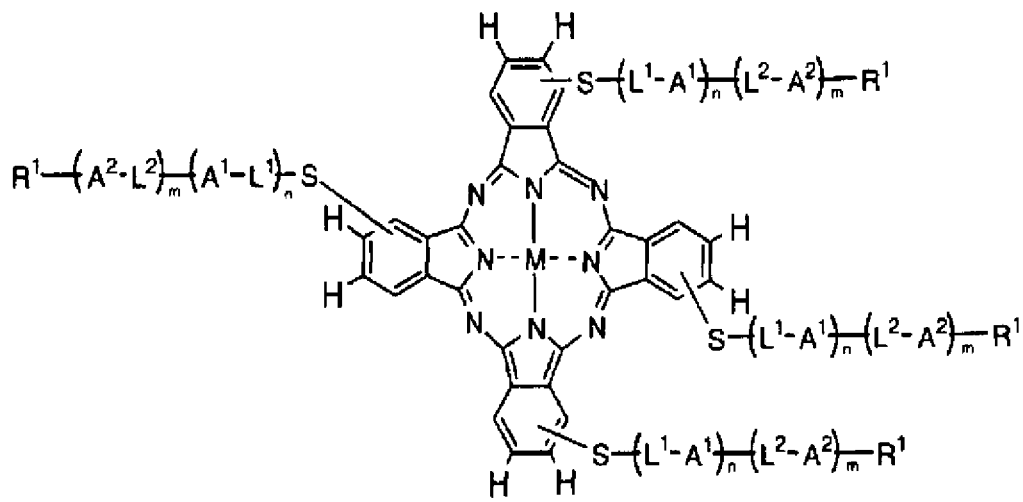

Formula (III)

wherein, in formula (III), $L^1$ represents an alkylene group; $A^1$ and $A^2$ each independently represent -O-, -C(=O)-, -OC(=O)-, -C(=O)O-, ~~-N(R₂)C(=O)-,~~ -C(=O)N($R^2$)-, -N($R^2$)C(=O)-, -OC(=O)N($R^2$)-, N($R^2$)C(=O)N($R^3$)-, -N($R^2$)SO₂-, -SO₂N($R^2$)-, or -SO₂-, wherein $R^2$ and $R^3$ each independently represent a hydrogen atom, an alky group, an aryl group, or a heterocyclic group; $L^2$ represents an alkylene group, an aralkylene group, or an arylene group; n denotes an integer from 1 to 3; m denotes an integer from 0 to 3; when n is 2 or greater, $L^1$s may be the same or different and $A^1$s may be the same or different; when m is 2 or greater, $L^2$s may be the same or different and $A^2$s may be the same or different; $R^1$ represents a hydrogen atom, an alkyl group, an aryl group or a heterocyclic group; and M represents a metal-containing substance.

Claim 7 should read:

7. A colored curable composition comprising at least one compound represented by the following Formula (III):

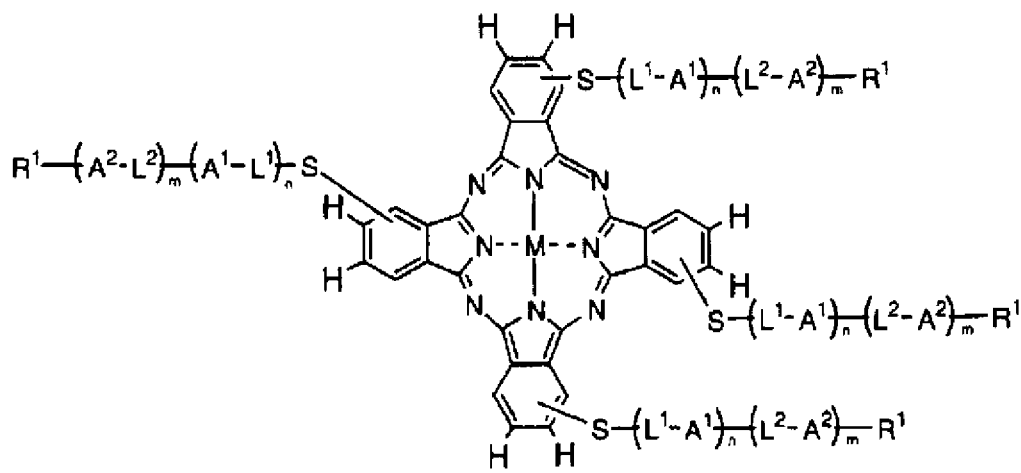

Formula (III)

wherein, in formula (III), $L^1$ represents an alkylene group; $A^1$ and $A^2$ each independently represent -O-, -C(=O)-, -OC(=O)-, -C(=O)O-, ~~-N(R$_2$)C(=O)-,~~ -C(=O)N($R^2$)-, -N($R^2$)C(=O)-, -OC(=O)N($R^2$)-, N($R^2$)C(=O)N($R^3$)-, -N($R^2$)SO$_2$-, -SO$_2$N($R^2$)-, or -SO$_2$-<u>, wherein $R^2$ and $R^3$ each independently represent a hydrogen atom, an alkyl group, an aryl group, or a heterocyclic group</u>; $L^2$ represents an alkylene group, an aralkylene group, or an arylene group; n denotes an integer from 1 to 3; m denotes an integer from 0 to 3; when n is 2 or greater, $L^1$s may be the same or different and $A^1$s may be the same or different; when m is 2 or greater, $L^2$s may be the same or different and $A^2$s may be the same or different; $R^1$ represents a hydrogen atom, an alkyl group, an aryl group or a heterocyclic group; and M represents a metal-containing substance.